US006972990B2

(12) United States Patent
Kumura et al.

(10) Patent No.: US 6,972,990 B2
(45) Date of Patent: Dec. 6, 2005

(54) FERRO-ELECTRIC MEMORY DEVICE AND METHOD OF MANUFACTURING THE SAME

(75) Inventors: Yoshinori Kumura, Yokohama (JP); Tohru Ozaki, Tokyo (JP); Hiroyuki Kanaya, Yokohama (JP); Iwao Kunishima, Yokohama (JP); Yoshiro Shimojo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/858,441

(22) Filed: Jun. 2, 2004

(65) Prior Publication Data

US 2005/0207202 A1 Sep. 22, 2005

(30) Foreign Application Priority Data

Mar. 18, 2004 (JP) ............................. 2004-077713

(51) Int. Cl.[7] ............................................... G11C 11/14
(52) U.S. Cl. ...................... 365/171; 365/145; 365/149; 257/295
(58) Field of Search ................................ 365/171, 145, 365/149; 257/295

(56) References Cited

U.S. PATENT DOCUMENTS 6,373,743 B1 * 4/2002 Chen et al. ................. 365/145

FOREIGN PATENT DOCUMENTS

| | | |
|---|---|---|
| JP | 2001-237393 | 8/2001 |
| JP | 2002-151657 | 5/2002 |
| JP | 2003-86771 | 3/2003 |
| JP | 2003-179212 | 6/2003 |

* cited by examiner

*Primary Examiner*—Richard Elms
*Assistant Examiner*—Pho M. Luu
(74) *Attorney, Agent, or Firm*—Oblon, Spivak, McClelland, Maier & Neustadt, P.C.

(57) ABSTRACT

A ferro-electric memory device includes a gate electrode which is formed on a semiconductor substrate, first and second diffusion layers which are formed in the semiconductor substrate, a first contact which is electrically connected to the first diffusion layer, a first oxygen barrier film having insulating properties, which is formed on the first contact, a second contact which is electrically connected to the first contact, a second oxygen barrier film having insulating properties, which is formed on the second contact, a ferro-electric capacitor which has a lower electrode, a ferro-electric film, and an upper electrode, a third contact which is electrically connected to the upper electrode, a first interconnection which is electrically connected to the second and third contacts, and a third oxygen barrier film having insulating properties, which is arranged between the ferro-electric capacitor and the second contact and brought into contact with the first oxygen barrier film.

10 Claims, 80 Drawing Sheets

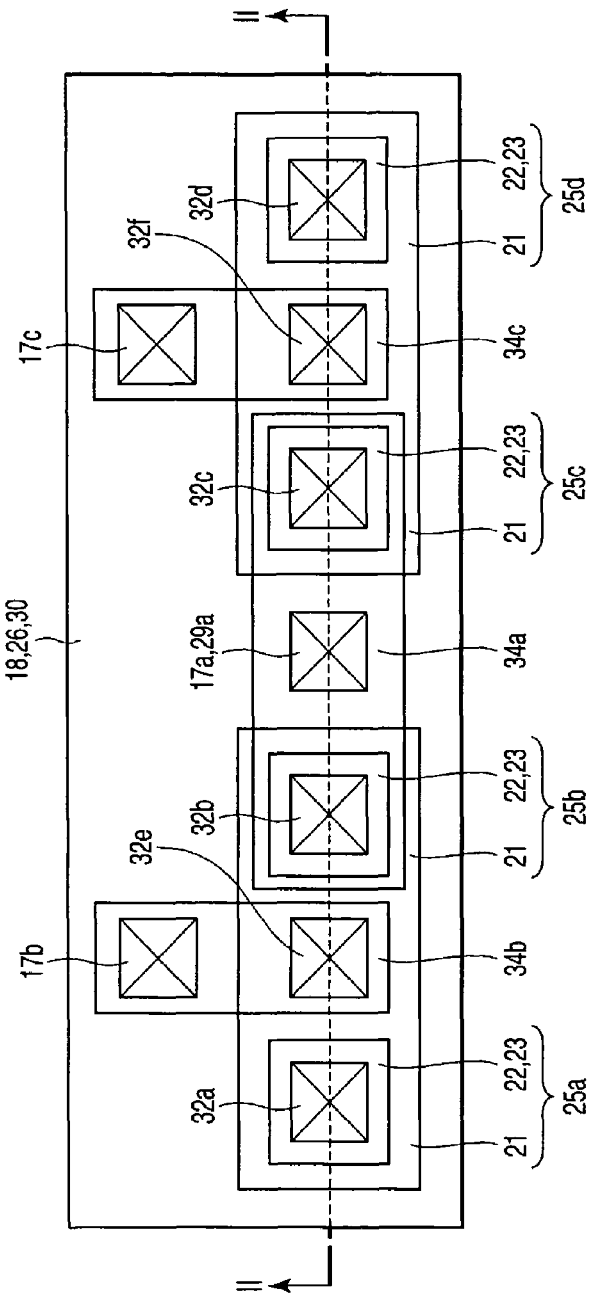
F I G. 1
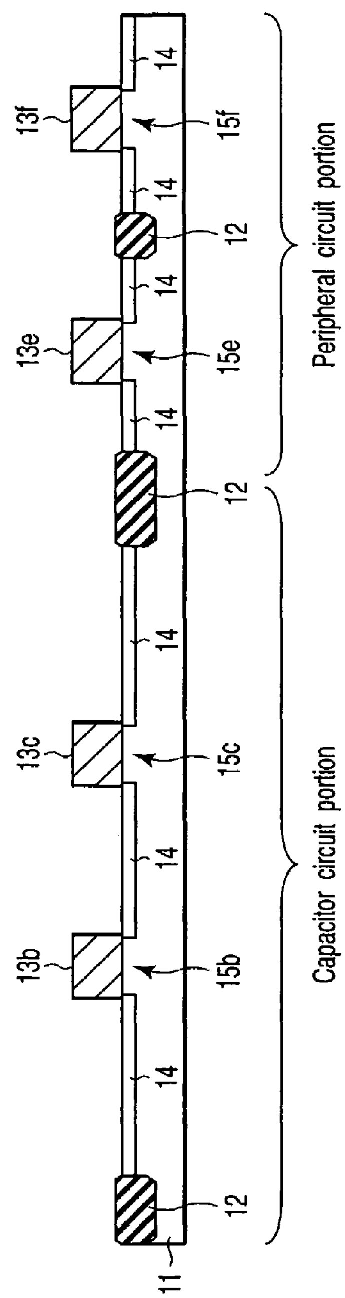
F I G. 3

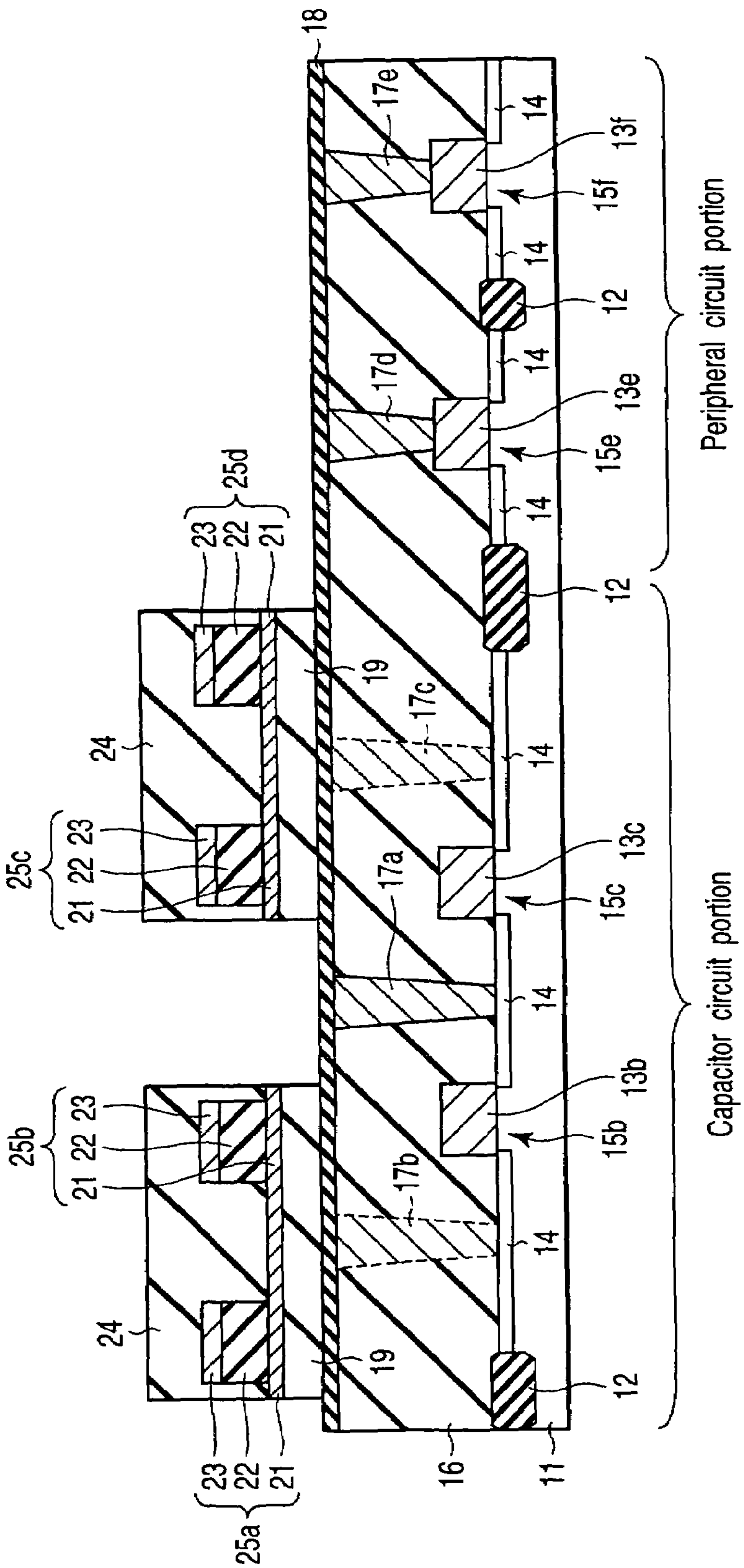
F I G. 1 0

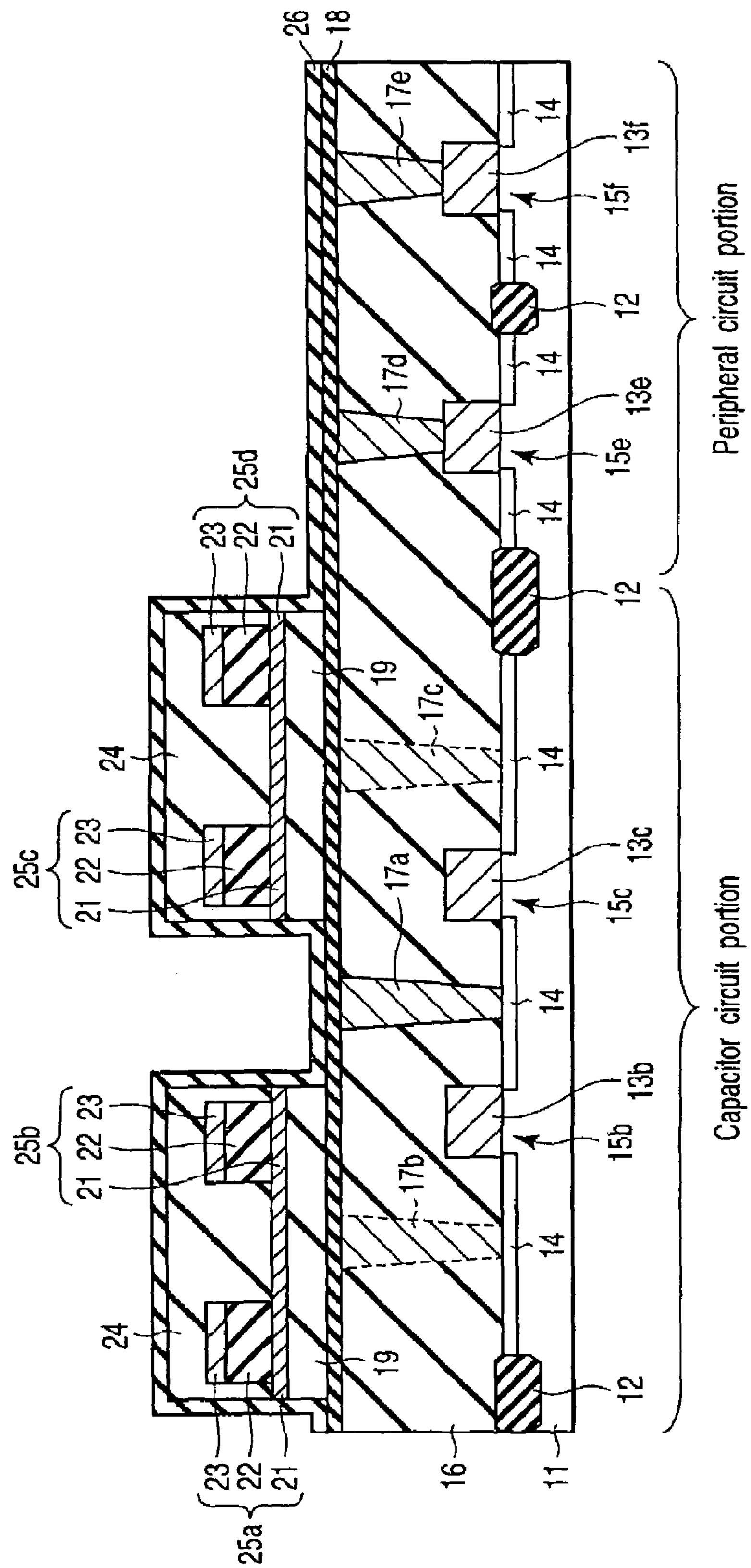
F I G. 1 1

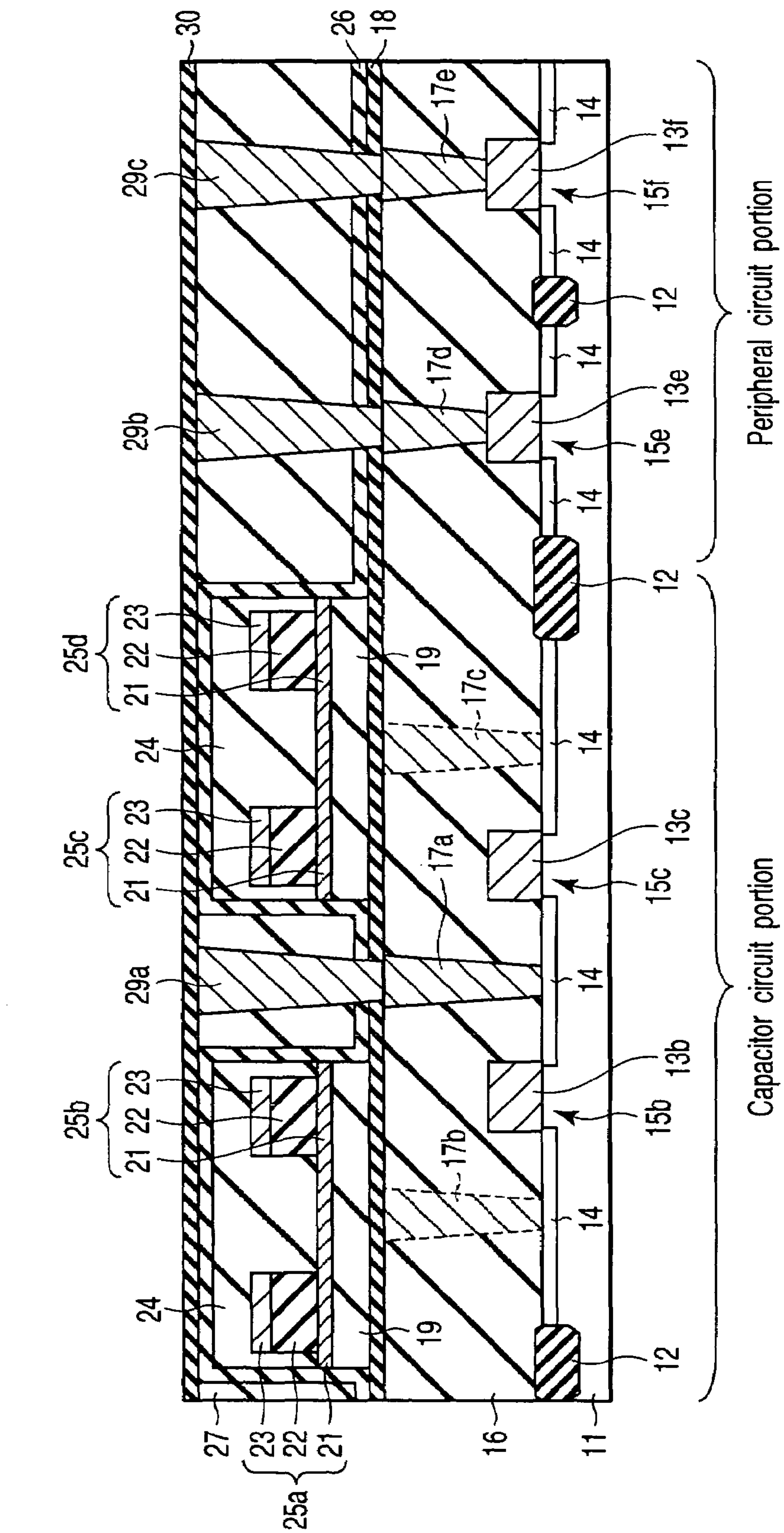
F I G. 1 5

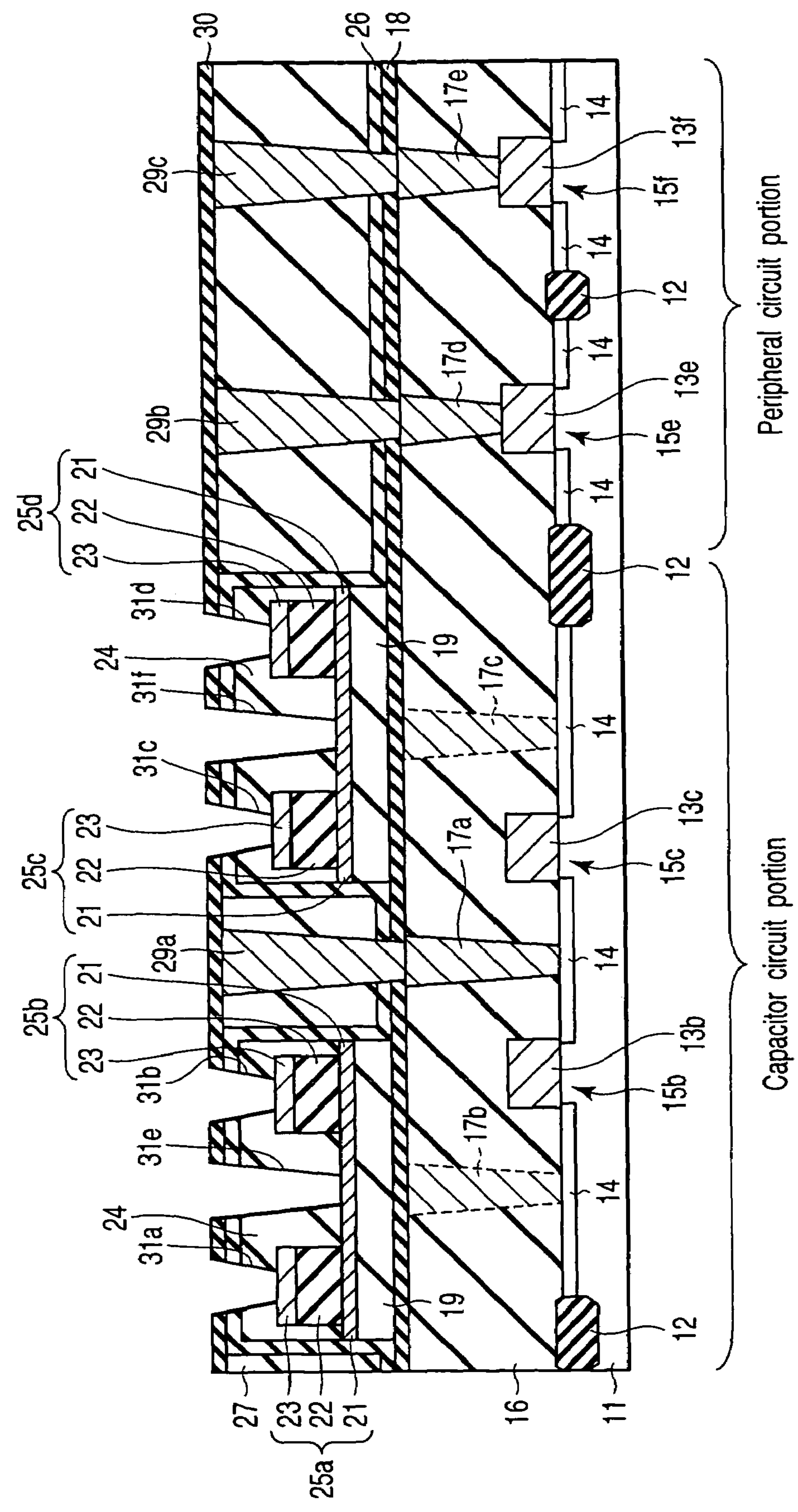
F I G. 1 6

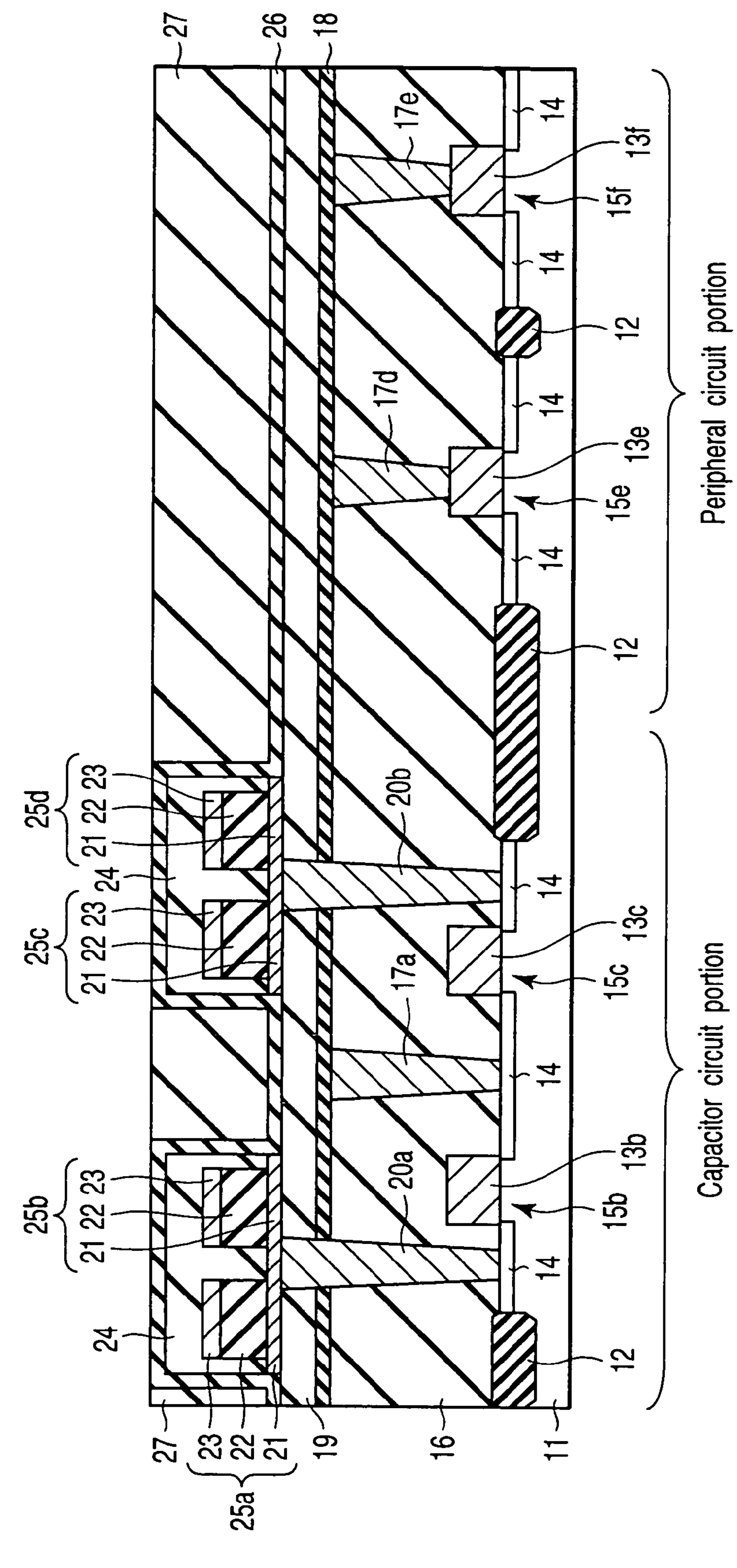
F I G. 4 0

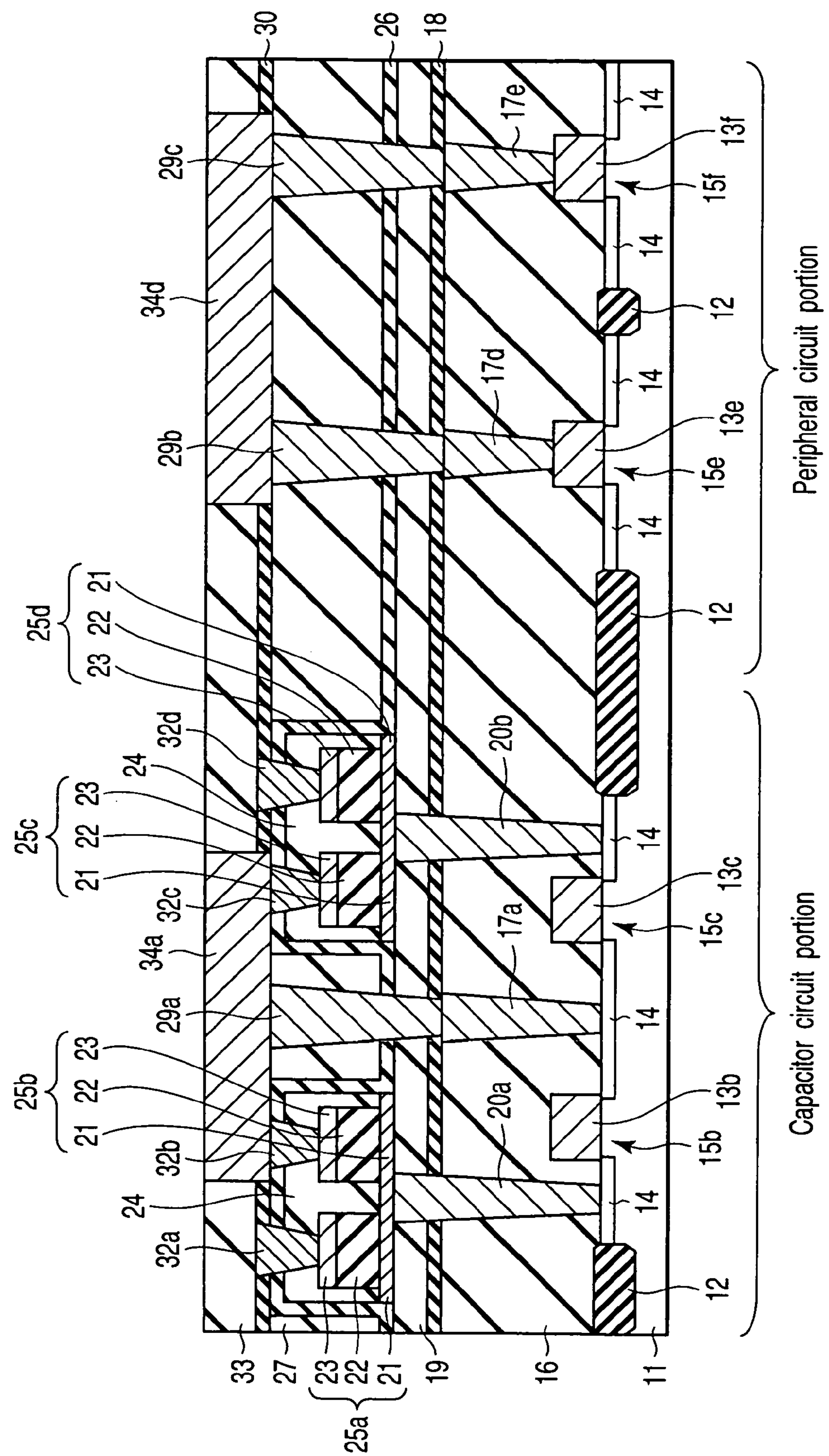
F I G. 4 7

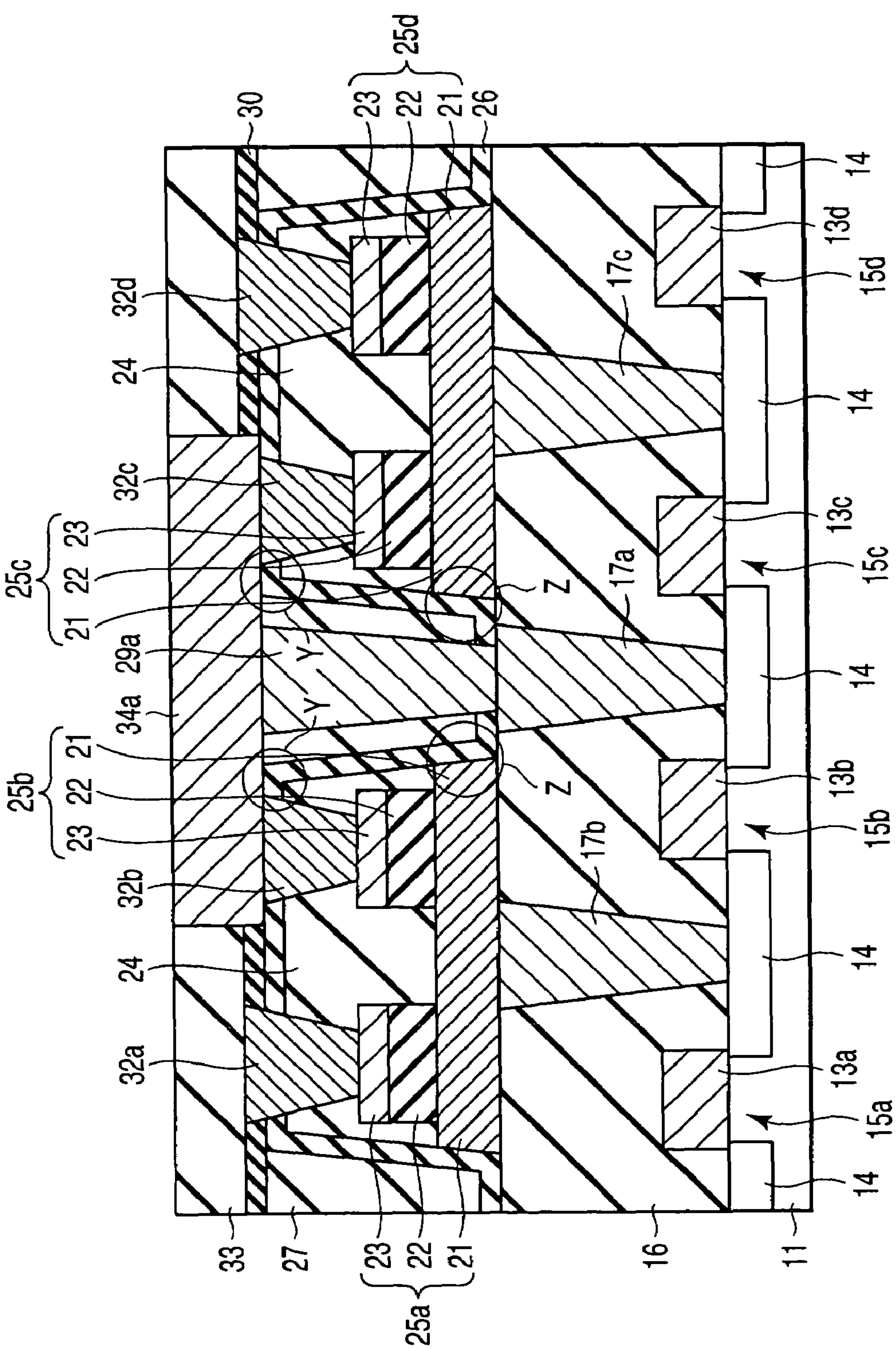
F I G. 5 0

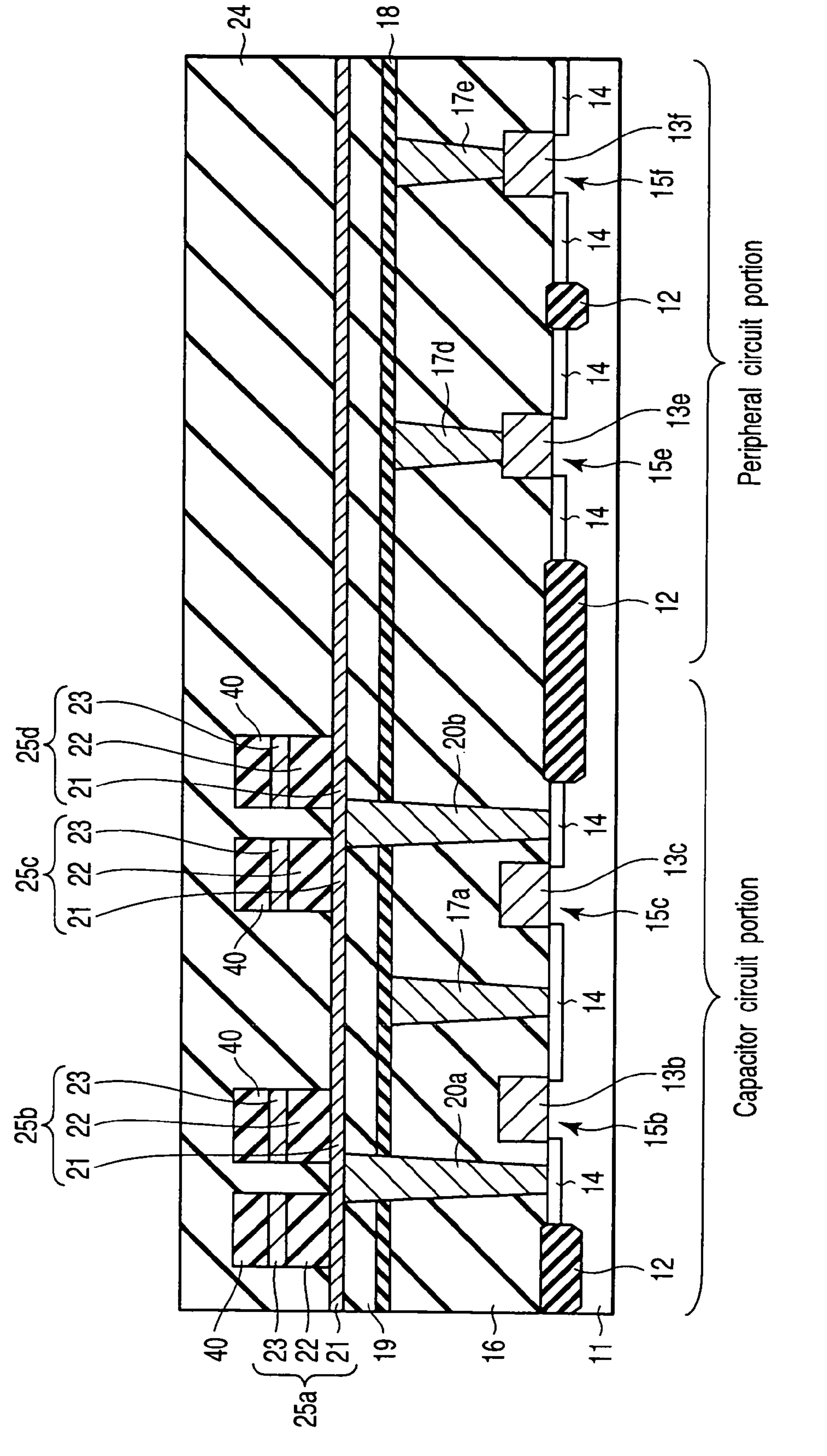
F I G. 6 2

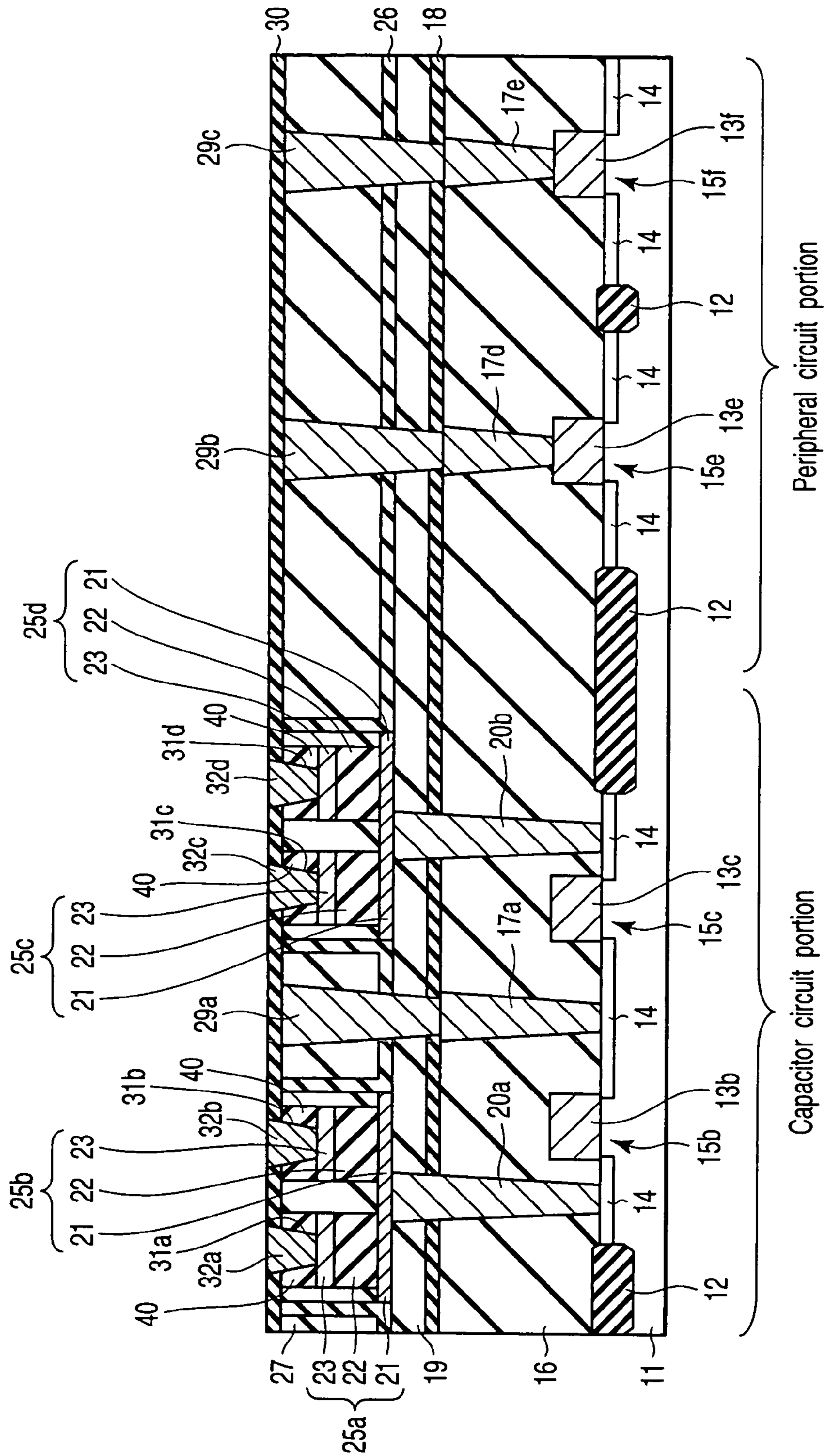
F I G. 7 0

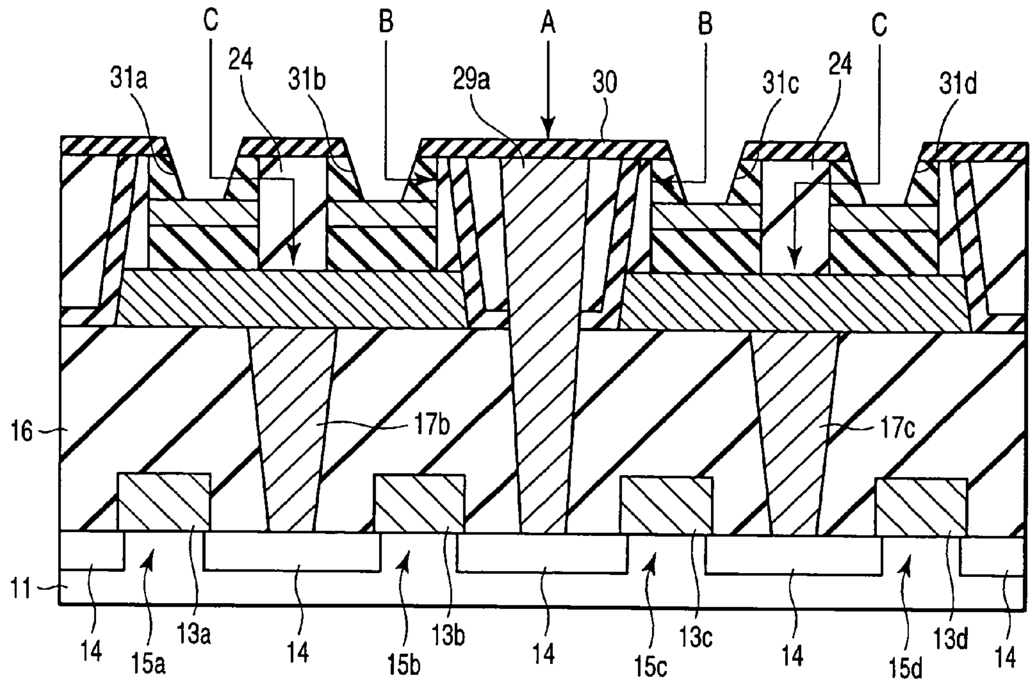
F I G. 7 8
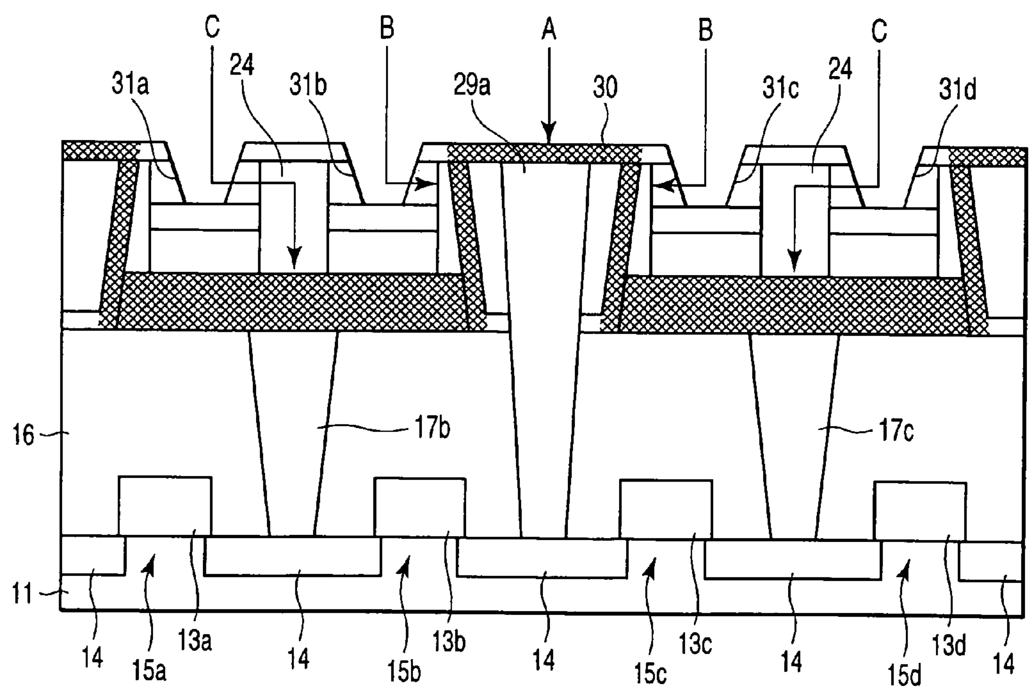
F I G. 7 9

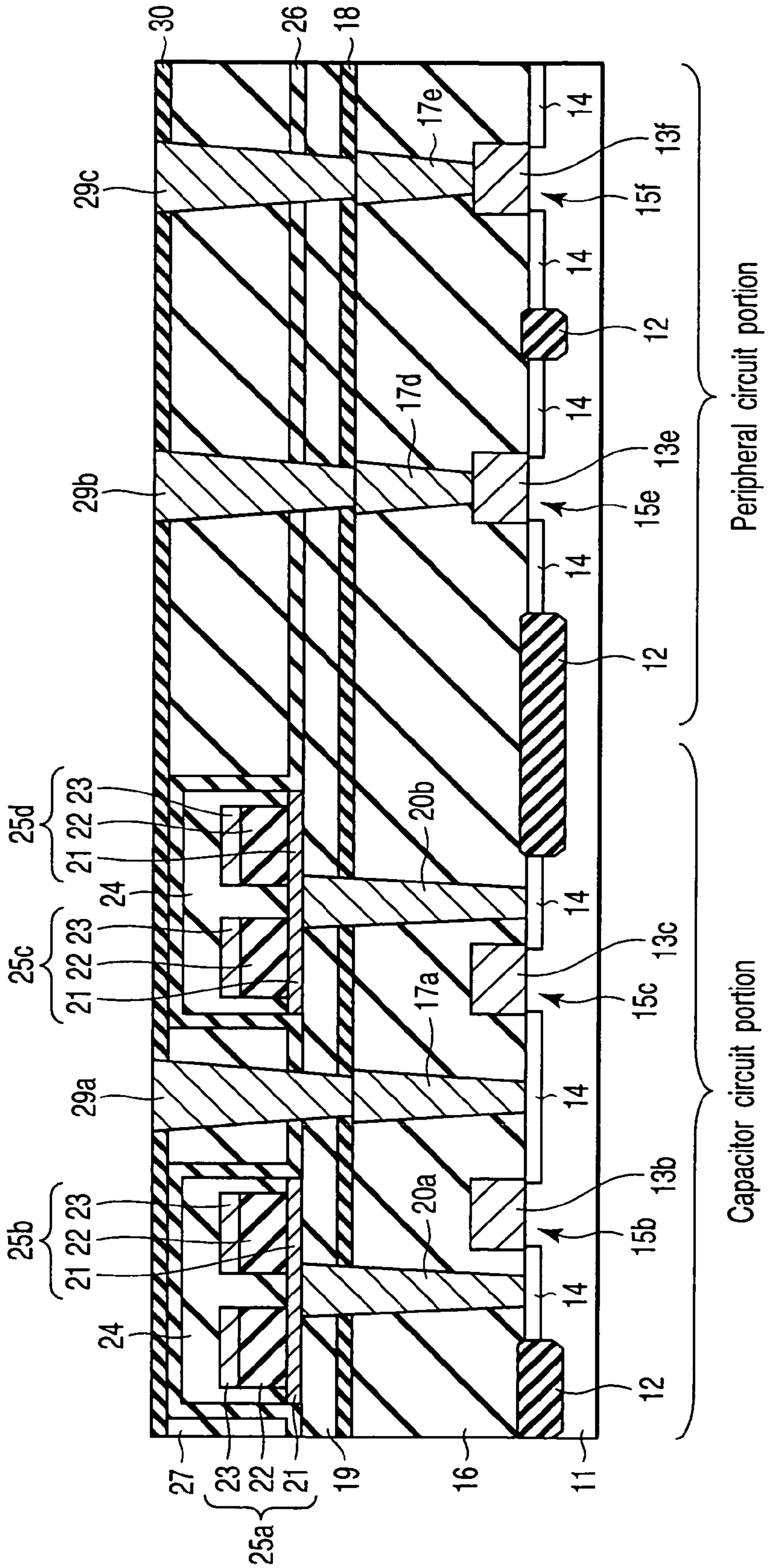
F I G. 8 2

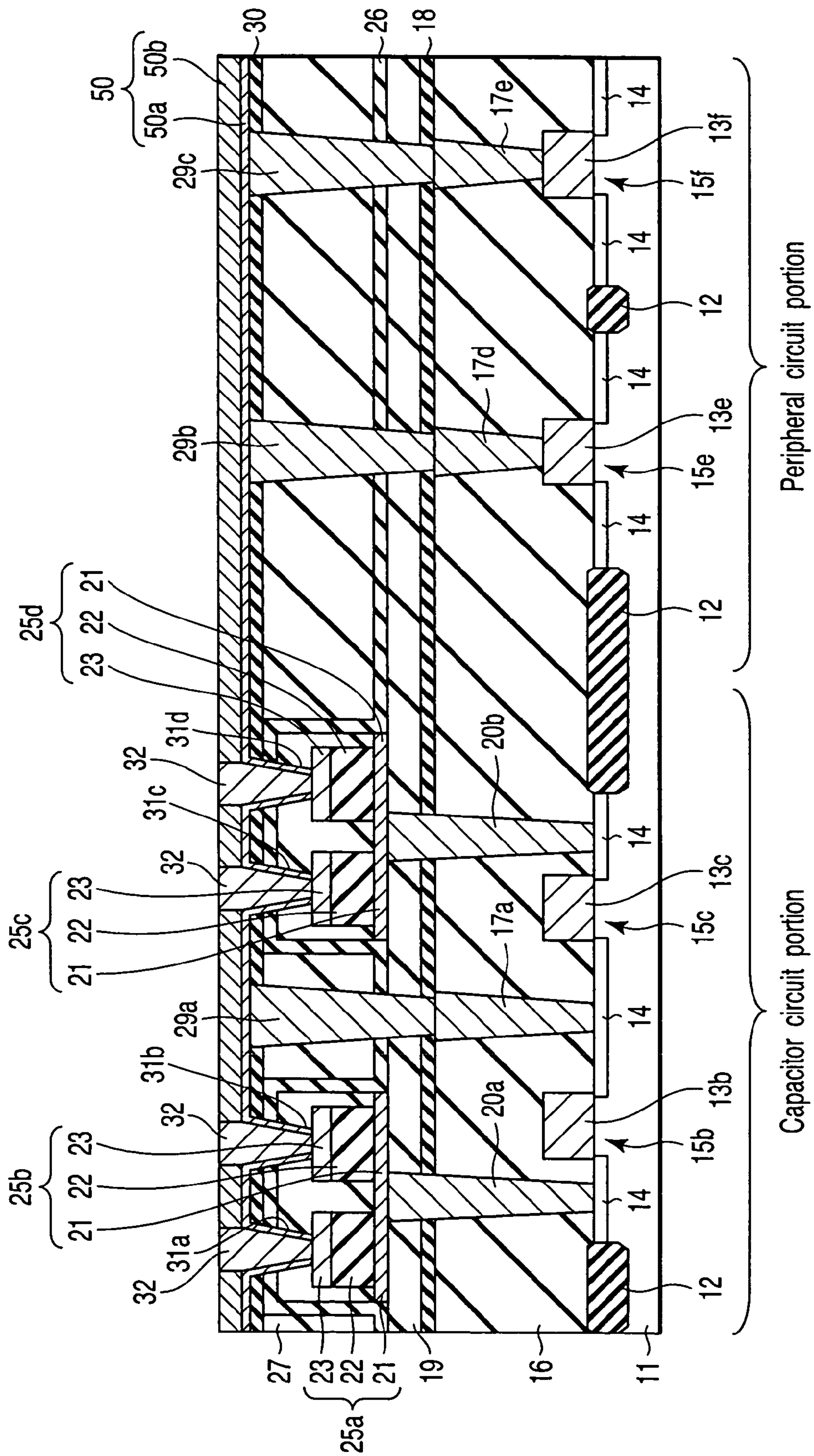
F I G. 86

FERRO-ELECTRIC MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-077713, filed Mar. 18, 2004, the entire contents of which are incorporated herein by reference.

BACKGROUND OF THE INVENTION

1. Field of the Invention

The present invention relates to a ferro-electric memory device having a ferro-electric memory and a method of manufacturing the same.

2. Description of the Related Art

In recent years, ferro-electric memory devices (FeRAMs: Ferro-electric Random Access Memories) using a ferro-electric capacitor have received a great deal of attention as a type of nonvolatile semiconductor memory.

However, a conventional FeRAM has the following problem. The aspect ratio of a contact that connects the ferro-electric capacitor to a transistor increases as the degree of integration of devices increases. For this reason, neither sufficient contact filling characteristic nor electrical reliability can be ensured by the conventional process (i.e., metallization using a sputter film and dry etching). It is believed from this viewpoint that a contact is most preferably made of TiN, W, or the like by using plasma CVD (Chemical Vapor Deposition). However, when a contact of TiN, W, or the like is formed by using plasma CVD, a large quantity of hydrogen generated during the process fatally damages the ferro-electric capacitor, as is known. To recover the damage of the ferro-electric capacitor, high-temperature oxygen annealing is necessary. In a conventional FeRAM, however, when high-temperature oxygen annealing is performed, the contact of TiN, W, or the like is oxidized.

BRIEF SUMMARY OF THE INVENTION

A ferro-electric memory device according to a first aspect of the present invention comprises a semiconductor substrate, a gate electrode which is formed on the semiconductor substrate, a first diffusion layer and a second diffusion layer, which are formed in the semiconductor substrate on both sides of the gate electrode, a first insulating film which is formed on the semiconductor substrate and the gate electrode, a first contact which extends through the first insulating film and is electrically connected to the first diffusion layer, a first oxygen barrier film having insulating properties, which is formed on the first contact and the first insulating film, a second insulating film which is formed on the first oxygen barrier film, a second contact which extends through the second insulating film and the first oxygen barrier film and is electrically connected to the first contact, a second oxygen barrier film having insulating properties, which is formed on the second contact and the second insulating film, a ferro-electric capacitor which is formed in the second insulating film and has a lower electrode, a ferro-electric film, and an upper electrode, a third contact which is electrically connected to the upper electrode, a first interconnection which is electrically connected to the second contact and the third contact, and a third oxygen barrier film having insulating properties, which is arranged between the ferro-electric capacitor and the second contact and brought into contact with the first oxygen barrier film.

A ferro-electric memory device according to a second aspect of the present invention comprises a semiconductor substrate; a gate electrode which is formed on the semiconductor substrate; a first diffusion layer and a second diffusion layer, which are formed in the semiconductor substrate on both sides of the gate electrode; a first insulating film which is formed on the semiconductor substrate and the gate electrode; a first contact which extends through the first insulating film and is electrically connected to the first diffusion layer; a second contact which extends through the first insulating film and is electrically connected to the second diffusion layer; a second insulating film which is formed on the first insulating film, the first contact, and the second contact; a third contact which extends through the second insulating film and is electrically connected to the first contact; a first oxygen barrier film having insulating properties, which is formed on the third contact and the second insulating film; a ferro-electric capacitor which is formed on the second contact and has a lower electrode containing an oxygen barrier material, a ferro-electric film, and an upper electrode; a fourth contact which is electrically connected to the upper electrode; a first interconnection which is electrically connected to the third contact and the fourth contact; and a second oxygen barrier film having insulating properties, which is arranged between the ferro-electric capacitor and the third contact and brought into contact with the lower electrode.

A method of manufacturing a ferro-electric memory device according to a third aspect of the present invention comprises forming, on a semiconductor substrate, a transistor having a gate electrode, a first diffusion layer, and a second diffusion layer, forming a first oxygen barrier film above the transistor, forming, above the first oxygen barrier film, a ferro-electric capacitor having a lower electrode, a dielectric film, and an upper electrode, forming a second oxygen barrier film which covers the ferro-electric capacitor to bring the second oxygen barrier film into contact with the first oxygen barrier film, forming a first contact which is electrically connected to the first diffusion layer, forming a third oxygen barrier film on the first contact to bring the third oxygen barrier film into contact with the second oxygen barrier film, selectively removing the second oxygen barrier film and the third oxygen barrier film to form a contact hole to which an upper surface of the upper electrode is exposed, executing oxygen annealing in a state in which the second oxygen barrier film is in contact with the first oxygen barrier film and the third oxygen barrier film, forming a second contact in the contact hole, and forming an interconnection which electrically connects the first contact to the second contact.

A method of manufacturing a ferro-electric memory device according to a fourth aspect of the present invention comprises forming, on a semiconductor substrate, a transistor having a gate electrode, a first diffusion layer, and a second diffusion layer; forming, above the transistor, a ferro-electric capacitor having a lower electrode containing an oxygen barrier material, a dielectric film, and an upper electrode; forming a first oxygen barrier film which covers the ferro-electric capacitor to bring the first oxygen barrier film into contact with the lower electrode; forming a first contact which is electrically connected to the first diffusion layer; forming a second oxygen barrier film on the first contact to bring the second oxygen barrier film into contact with the first oxygen barrier film; selectively removing the first oxygen barrier film and the second oxygen barrier film to form a contact hole to which an upper surface of the upper electrode is exposed; executing oxygen annealing in a state in which the first oxygen barrier film is in contact with the lower electrode and the second oxygen barrier film; forming a second contact in the contact hole; and forming an interconnection which electrically connects the first contact to the second contact.

BRIEF DESCRIPTION OF THE SEVERAL VIEWS OF THE DRAWING

FIG. 1 is a plan view showing a ferro-electric memory device according to the first embodiment of the present invention;

FIGS. 3 to 19 are sectional views showing steps in manufacturing the ferro-electric memory device according to the first embodiment of the present invention;

FIGS. 33 to 47 are sectional views showing steps in manufacturing the ferro-electric memory device according to the fourth embodiment of the present invention;

FIG. 50 is a sectional view showing a ferro-electric memory device according to the fifth embodiment of the present invention;

FIGS. 60 to 71 are sectional views showing steps in manufacturing the ferro-electric memory device according to the seventh embodiment of the present invention;

FIG. 78 is a sectional view showing the oxygen annealing step for the ferro-electric memory device according to the ninth embodiment of the present invention;

FIG. 79 is a sectional view showing preventing contacts from being oxidized in the oxygen annealing step for the ferro-electric memory device according to the ninth embodiment of the present invention;

FIGS. 80 to 88 are sectional views showing steps in manufacturing a ferro-electric memory device according to the 10th embodiment of the present invention.

DETAILED DESCRIPTION OF THE INVENTION

Figure 2:
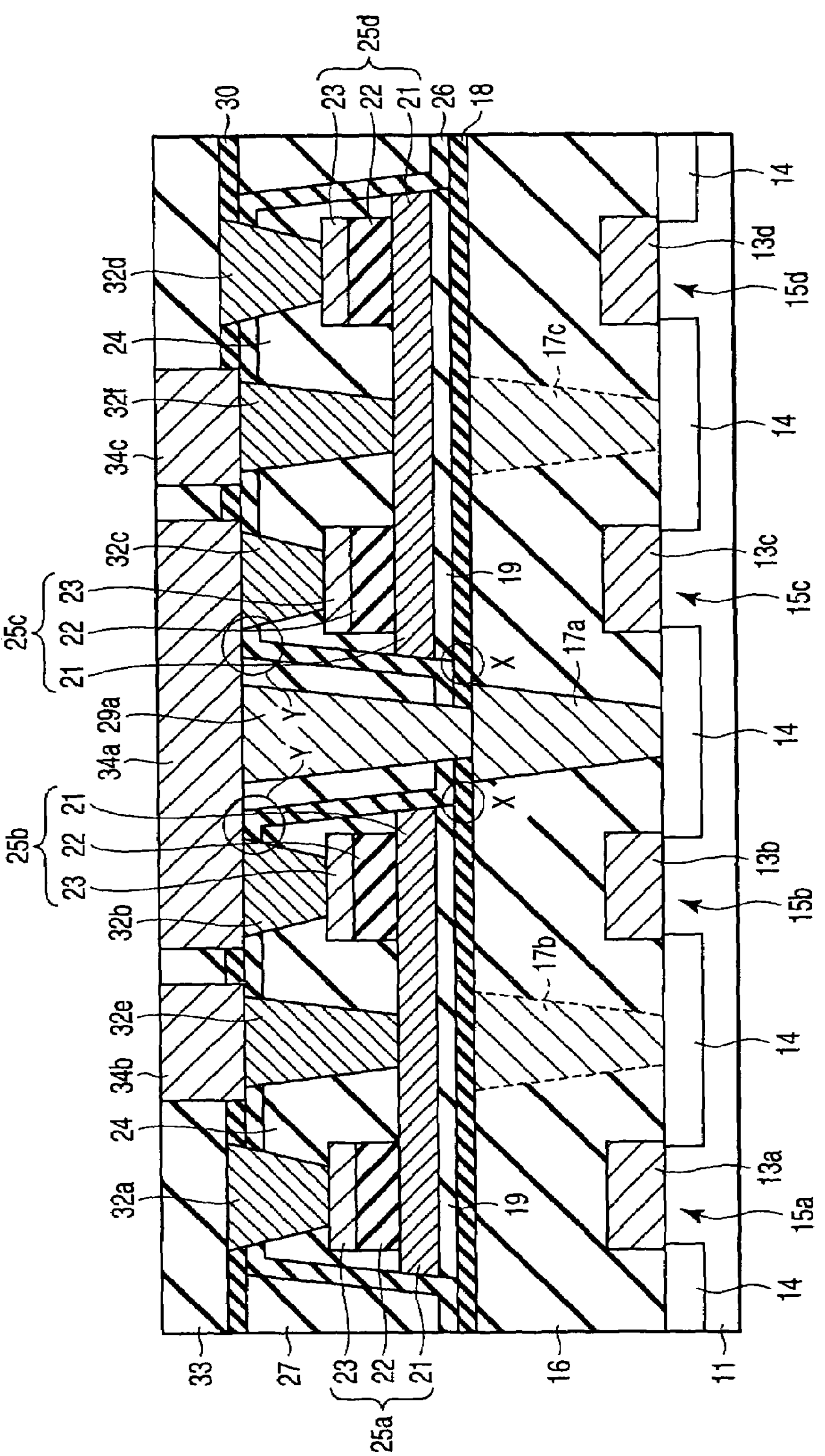
FIG. 2 is a sectional view of the ferro-electric memory device taken along a line II—II in FIG. 1.

The embodiments of the present invention will be described below with reference to the accompanying drawing. In the description, the same reference numerals denote the same parts throughout the drawing.

In each embodiment, a ferro-electric memory (FeRAM: Ferro-electric Random Access Memory) having a TC parallel unit series-connected structure will be described as an example. However, the present invention is not limited to this structure and can be applied to various structures. Memory which consists of series connected memory cells each having a transistor having a source terminal and a drain terminal and a ferro-electric capacitor inbetween said two terminals, hereafter named "Series connected TC unit type ferro-electric RAM".

First Embodiment

In the first embodiment, an FeRAM having an offset structure will be described as an example.

FIGS. 1 and 2 show a ferro-electric memory device according to the first embodiment of the present invention. The structure of the ferro-electric memory device according to the first embodiment will be described below.

As shown in FIGS. 1 and 2, gate electrodes 13*a*, 13*b*, 13*c*, and 13*d* are formed on a silicon substrate 11. Source/drain diffusion layers 14 are formed in the silicon substrate 11. Transistors 15*a*, 15*b*, 15*c*, and 15*d* are thus formed. A contact 17*a* is connected to the source/drain diffusion layer 14 between the transistors 15*b* and 15*c*. A contact 17*b* is connected to the source/drain diffusion layer 14 between the transistors 15*a* and 15*b*. A contact 17*c* is connected to the source/drain diffusion layer 14 between the transistors 15*c* and 15*d*. The contacts 17*b* and 17*c* are arranged in a line different from that of the contact 17*a*.

Ferro-electric capacitors 25*a*, 25*b*, 25*c*, and 25*d* are formed on an interlayer dielectric film 19. Each of the ferro-electric capacitors 25*a*, 25*b*, 25*c*, and 25*d* includes a lower electrode 21, an upper electrode 23, and a ferro-electric film 22 formed between the lower electrode 21 and the upper electrode 23. The two ferro-electric capacitors 25*a* and 25*b* share the lower electrode 21 without separating it. Similarly, the two ferro-electric capacitors 25*c* and 25*d* share the lower electrode 21 without separating it.

Contacts 32*a*, 32*b*, 32*c*, and 32*d* are formed on the upper electrodes 23 of the ferro-electric capacitors 25*a*, 25*b*, 25*c*, and 25*d*, respectively. Contacts 32*e* and 32*f* are formed on the lower electrodes 21 of the ferro-electric capacitors 25*a*, 25*b*, 25*c*, and 25*d*, respectively. A contact 29*a* is formed on the contact 17*a*. An interconnection 34*a* is formed on the contacts 29*a*, 32*b*, and 32*c*. An interconnection 34*b* is formed on the contact 32*e*. An interconnection 34*c* is formed on the contact 32*f*. Interconnections may be formed on the contacts 32*a* and 32*d*.

FIGS. 1 and 2 show four cells. The TC parallel unit series-connected structure will be described by using the second and third cells. In the ferro-electric capacitor 25*b* of the second cell, the upper electrode 23 is connected to one of the source/drain diffusion layers 14 of the transistor 15*b* through the contact 32*b*, interconnection 34*a*, contact 29*a*, and contact 17*a*. The lower electrode 21 is connected to the other of the source/drain diffusion layers 14 of the transistor 15*b* through the contact 32*e*, interconnection 34*b*, contact (not shown), and contact 17*b*. Accordingly, the upper electrode 23 and lower electrode 21 of the ferro-electric capacitor 25*b* are electrically connected in parallel with the source/drain diffusion layers 14 of the transistor 15*b*. Similarly, in the ferro-electric capacitor 25*c* of the third cell, the upper electrode 23 is connected to one of the source/drain diffusion layers 14 of the transistor 15*c* through the contact 32*c*, interconnection 34*a*, contact 29*a*, and contact 17*a*. The lower electrode 21 is connected to the other of the source/drain diffusion layers 14 of the transistor 15*c* through the contact 32*f*, interconnection 34*c*, contact (not shown), and contact 17*c*. Accordingly, the upper electrode 23 and lower electrode 21 of the ferro-electric capacitor 25*c* are electrically connected in parallel with the source/drain diffusion layers 14 of the transistor 15*c*. The second and third cells share the connection portion between the transistors 15*b* and 15*c* and the upper electrodes 23. Hence, the second and third cells are connected in series. Accordingly, an FeRAM having a TC parallel unit series-connected structure is formed.

In the structure according to the first embodiment, an insulating oxygen barrier film 18, insulating hydrogen and oxygen barrier film 26, and insulating oxygen barrier film 30 are formed as films that prevent diffusion of oxygen. The oxygen barrier film 18 is formed on the contacts 17*a*, 17*b*, and 17*c* and an interlayer dielectric film 16. The hydrogen and oxygen barrier film 26 is formed on the upper and side surfaces of an interlayer dielectric film 24, the side surfaces of the lower electrodes 21, the side surfaces of the interlayer dielectric film 19, and the upper surface of the oxygen barrier film 18. The oxygen barrier film 30 is formed on the hydrogen and oxygen barrier film 26 and an interlayer dielectric film 27.

As described above, the oxygen barrier film 18 is formed on the contacts 17*a*, 17*b*, and 17*c*. The oxygen barrier film 30 is formed on the contact 29*a*. The hydrogen and oxygen barrier film 26 is formed between the capacitor 25*b* and the contact 29*a* and between the capacitor 25*c* and the contact 29*a*. The hydrogen and oxygen barrier film 26 comes into contact with the oxygen barrier film 18 at portions X (near the upper surface of the contact 17*a*), the contacts 32*b* and 32*c* and interconnection 34*a* at portions Y (near the upper portion between the contacts 29*a* and 32*b* and near the upper portion between the contacts 29*a* and 32*c*), and the oxygen barrier film 30 on the interlayer dielectric film 24.

Referring to FIG. 2, the edge portions of each lower electrode 21 project from the side surfaces of the upper electrodes 23 and ferro-electric films 22 and come into contact with the hydrogen and oxygen barrier film 26. However, the edge portions of each lower electrode 21 need not always be in contact with the hydrogen and oxygen barrier film 26.

FIGS. 3 to 19 are sectional views showing steps in manufacturing the ferro-electric memory device according to the first embodiment of the present invention. A method of manufacturing the ferro-electric memory device according to the first embodiment will be described below. In this example, a capacitor circuit portion in which ferro-electric capacitors are present and a peripheral circuit portion which controls the capacitor circuit portion are simultaneously formed. The transistors 15*a* and 15*d* shown in FIGS. 1 and 2 are not illustrated in the capacitor circuit portion.

First, as shown in FIG. 3, an STI (Shallow Trench Isolation) region 12 for element isolation is formed in the silicon substrate 11. The gate electrodes 13*b*, 13*c*, 13*e*, and 13*f* are formed on the silicon substrate 11. The source/drain diffusion layers 14 are formed on both sides of each of the gate electrodes 13*b*, 13*c*, 13*e*, and 13*f*. In this way, the transistors 15*b* and 15*c* in the capacitor circuit portion and transistors 15*e* and 15*f* in the peripheral circuit portion are formed.

Figure 4:
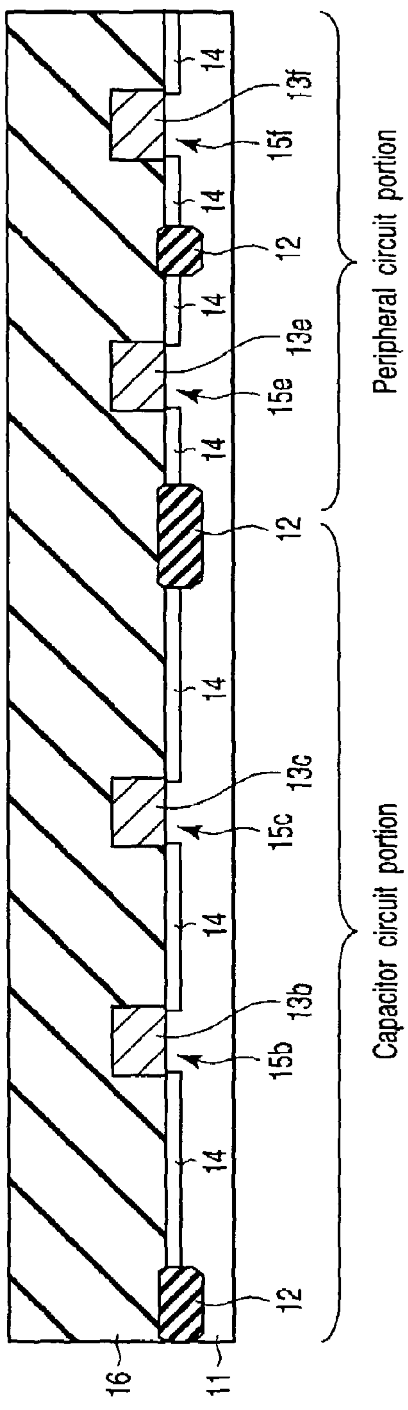

As shown in FIG. 4, the interlayer dielectric film 16 is deposited on the silicon substrate 11 and transistors 15*b*, 15*c*, 15*e*, and 15*f*. The upper surface of the interlayer dielectric film 16 is planarized by, e.g., CMP (Chemical Mechanical Polishing). Examples of the material of the interlayer dielectric film 16 are BPSG (Boron Phosphorous Silicate Glass) and P-TEOS (Plasma-Tetra Ethoxy Silane).

Figure 5:
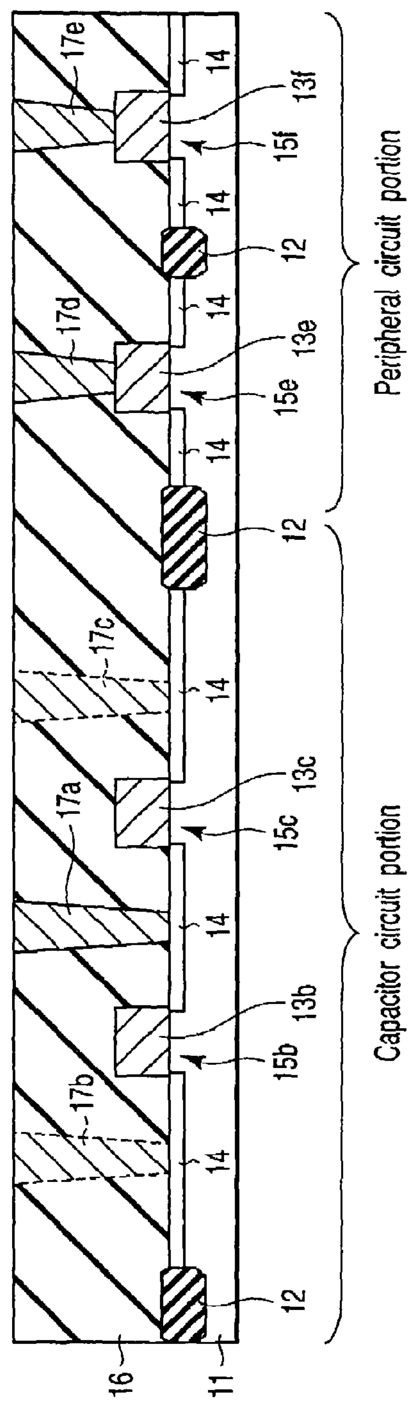

As shown in FIG. 5, the contacts 17*a*, 17*b*, and 17*c* connected to the source/drain diffusion layers 14 and contacts 17*d* and 17*e* connected to the gate electrodes 13*e* and 13*f* are formed in the interlayer dielectric film 16. For example, W or doped polysilicon is used as the material of the contacts 17*a*, 17*b*, 17*c*, 17*d*, and 17*e*.

Figure 6:
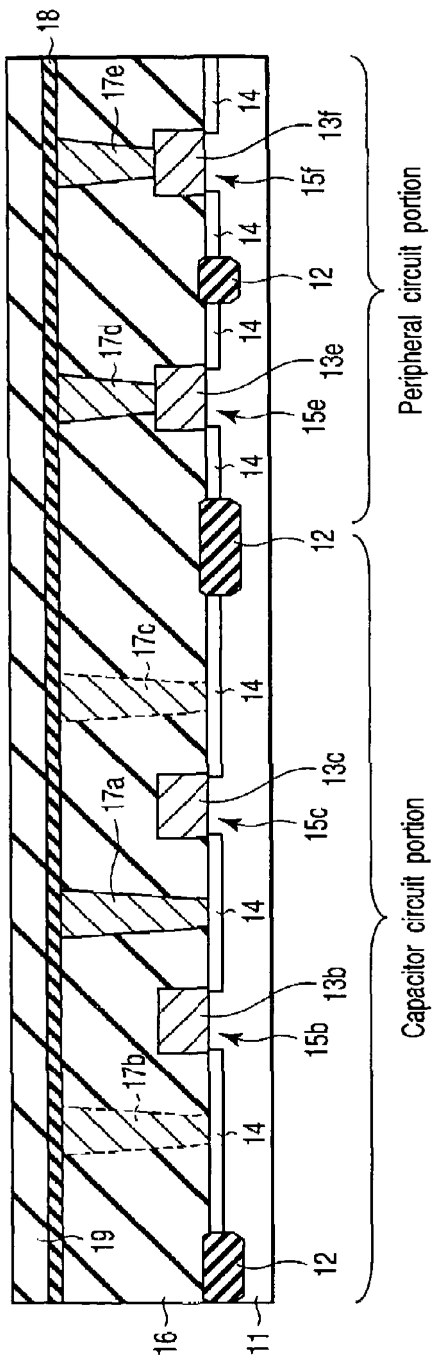

As shown in FIG. 6, the insulating oxygen barrier film 18 is formed on the contacts 17*a*, 17*b*, 17*c*, 17*d*, and 17*e* and interlayer dielectric film 16. The interlayer dielectric film 19 is deposited on the oxygen barrier film 18. For example, $Al_2O_3$, SiN, SiON, PZT, or $TiO_2$ is used as the material of the insulating oxygen barrier film 18. For example, BPSG or P-TEOS is used as the material of the interlayer dielectric film 19.

Figure 7:
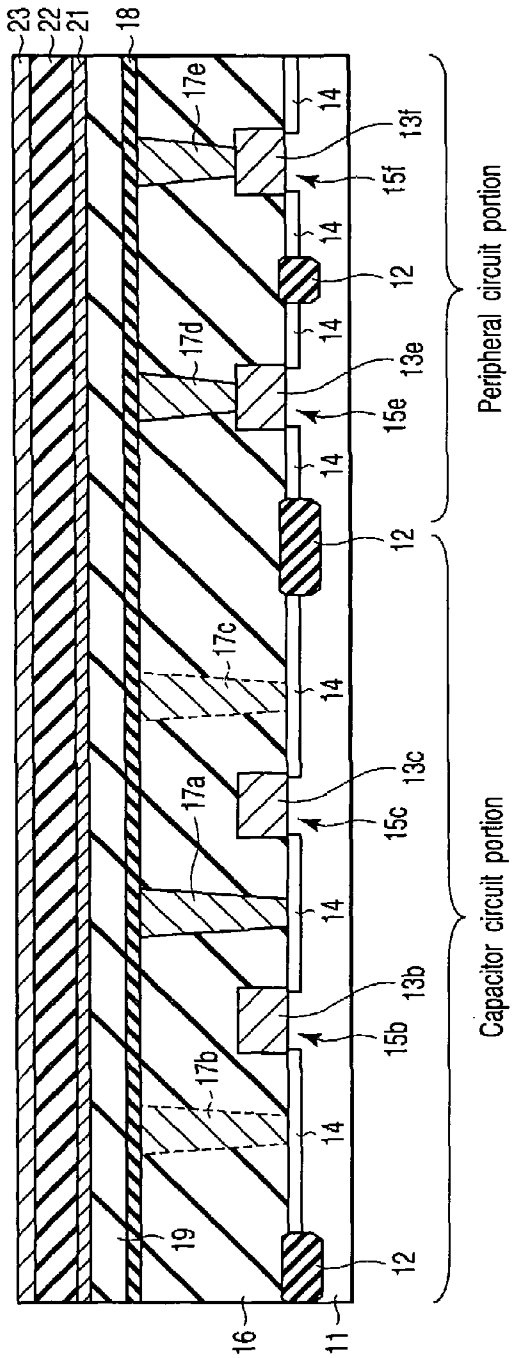

As shown in FIG. 7, the lower electrode 21, ferro-electric film 22, and upper electrode 23 are sequentially deposited on the interlayer dielectric film 19. The lower electrode 21 is made of a material containing, e.g., Ir, $IrO_2$, Ru, $RuO_2$, or Pt. Examples of the material of the ferro-electric film 22 are PZT and SBT. Examples of the material of the upper electrode 23 are Pt, Ir, $IrO_2$, SRO, Ru, and $RuO_2$.

Figure 8:
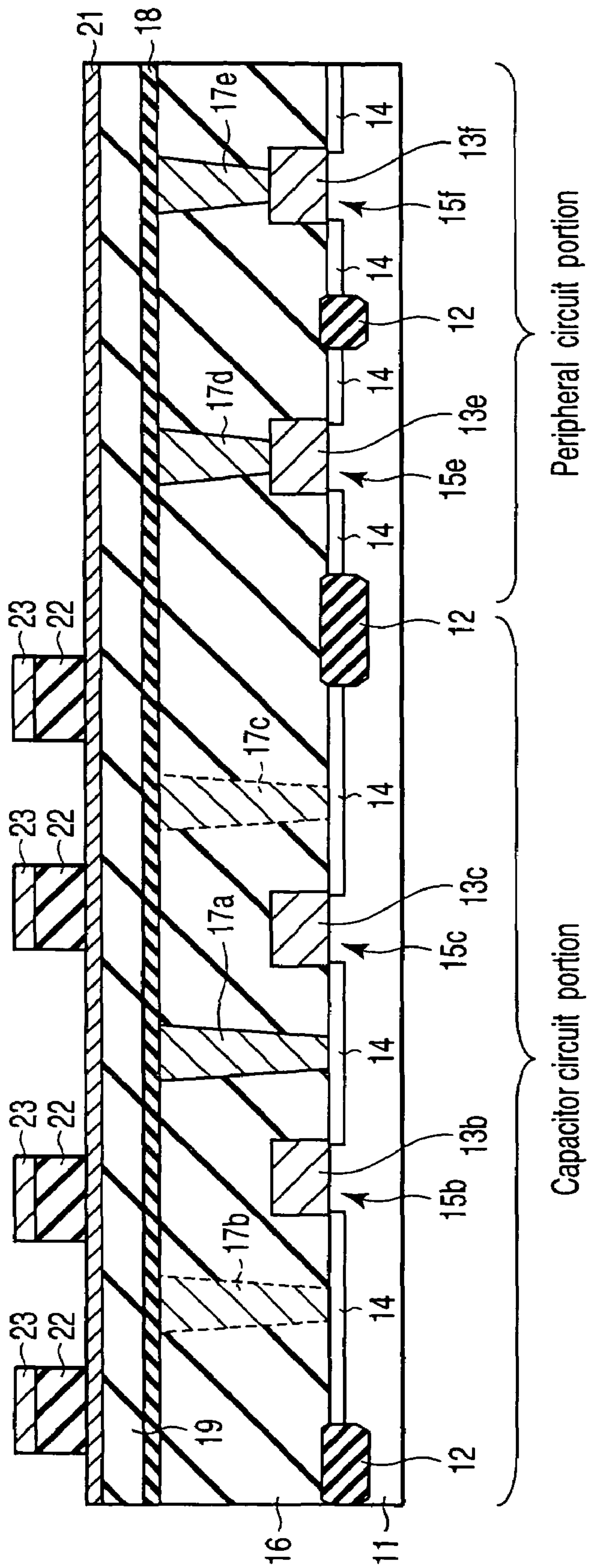

As shown in FIG. 8, a mask (not shown) is formed on the upper electrode 23 and patterned. Then, the upper electrode 23 and ferro-electric film 22 are patterned by using the patterned mask.

Figure 9:
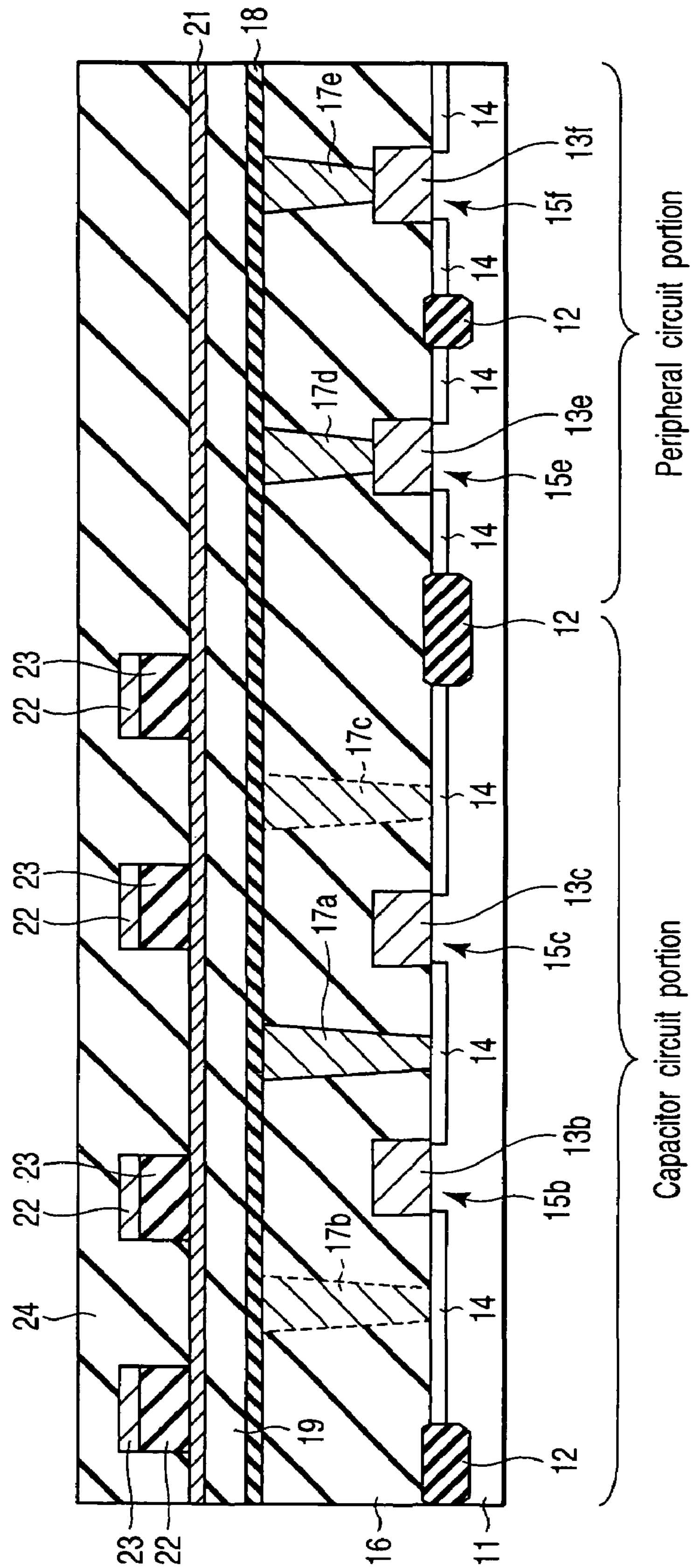

As shown in FIG. 9, the interlayer dielectric film 24 is formed on the upper electrodes 23 and lower electrode 21. For example, BPSG or P-TEOS is used as the material of the interlayer dielectric film 24.

As shown in FIG. 10, a mask (not shown) is formed on the interlayer dielectric film 24 and patterned. Then, the interlayer dielectric film 24 is patterned by using the patterned mask. In addition, the lower electrode 21 and interlayer dielectric film 19 are processed by using the patterned interlayer dielectric film 24 as a mask. With this process, the ferro-electric capacitors 25*a*, 25*b*, 25*c*, and 25*d* are formed.

As shown in FIG. 11, the insulating hydrogen and oxygen barrier film 26 is formed on the upper and side surfaces of the interlayer dielectric films 24, the side surfaces of the lower electrodes 21, the side surfaces of the interlayer dielectric films 19, and the upper surface of the oxygen barrier film 18 by sputtering or CVD (Chemical Vapor Deposition). Accordingly, the ferro-electric capacitors 25*a*, 25*b*, 25*c*, and 25*d* are covered with the hydrogen and oxygen barrier film 26. Examples of the material of the insulating hydrogen and oxygen barrier film 26 are $Al_2O_3$, SiN, SiON, $TiO_2$, and PZT.

Figure 12:
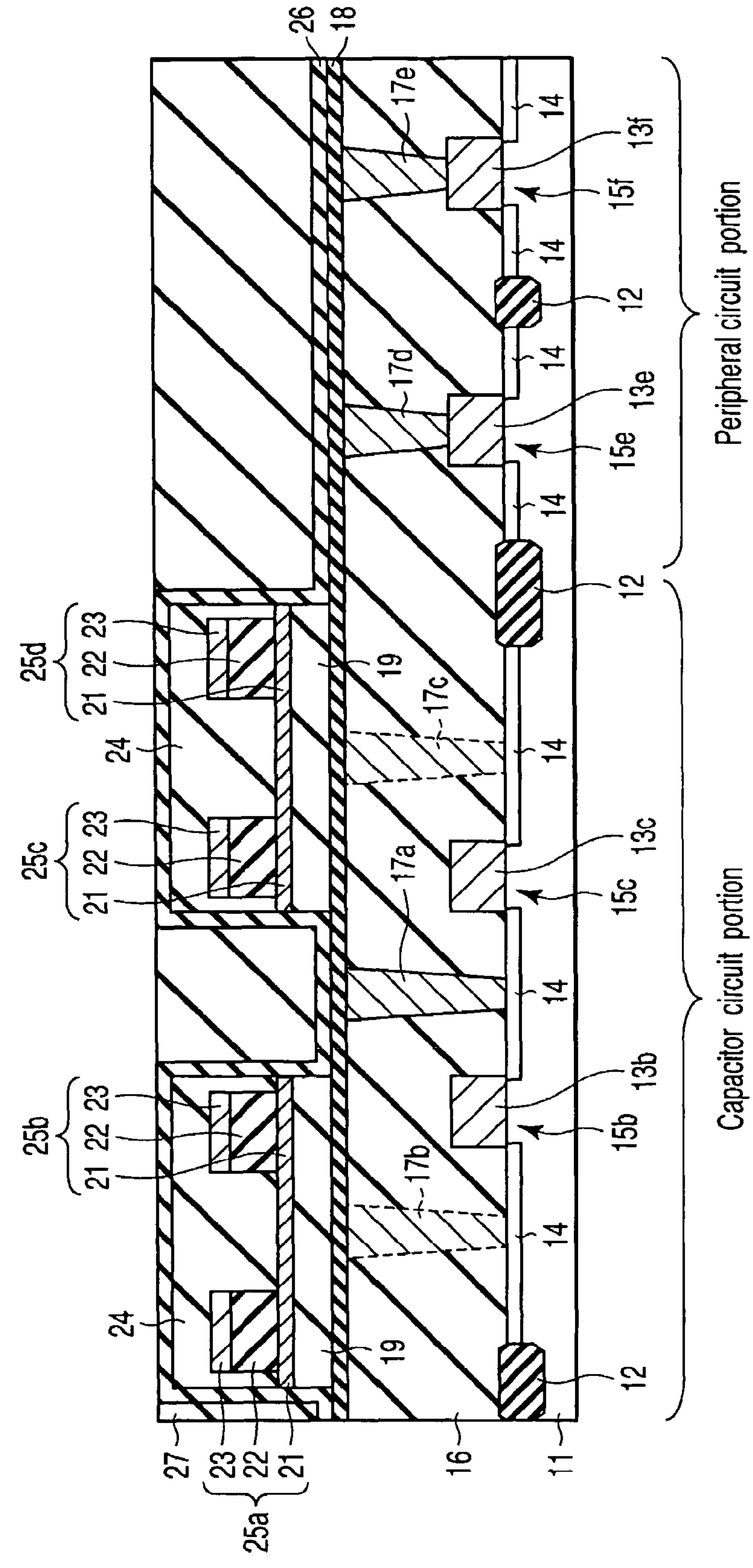

As shown in FIG. 12, the interlayer dielectric film 27 is deposited on the hydrogen and oxygen barrier film 26. The upper surface of the interlayer dielectric film 27 is planarized until the hydrogen and oxygen barrier film 26 is exposed. Examples of the material of the interlayer dielectric film 27 are P-TEOS, $O_3$-TEOS, SOG, $Al_2O_3$, SiN, and SiON.

Figure 13:
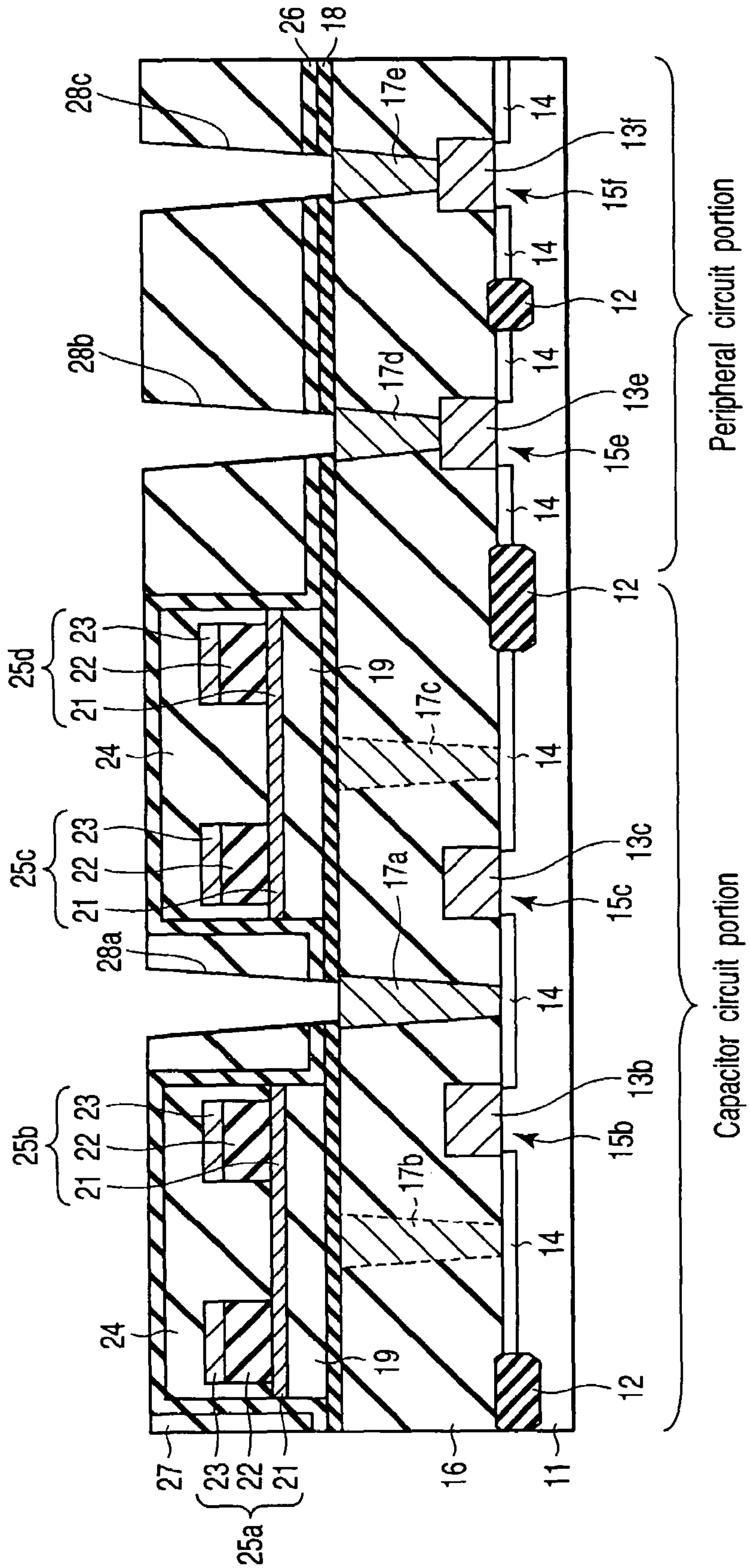

As shown in FIG. 13, contact holes 28*a*, 28*b*, and 28*c* extending through the interlayer dielectric film 27, hydrogen and oxygen barrier film 26, and oxygen barrier film 18 are formed.

Figure 14:
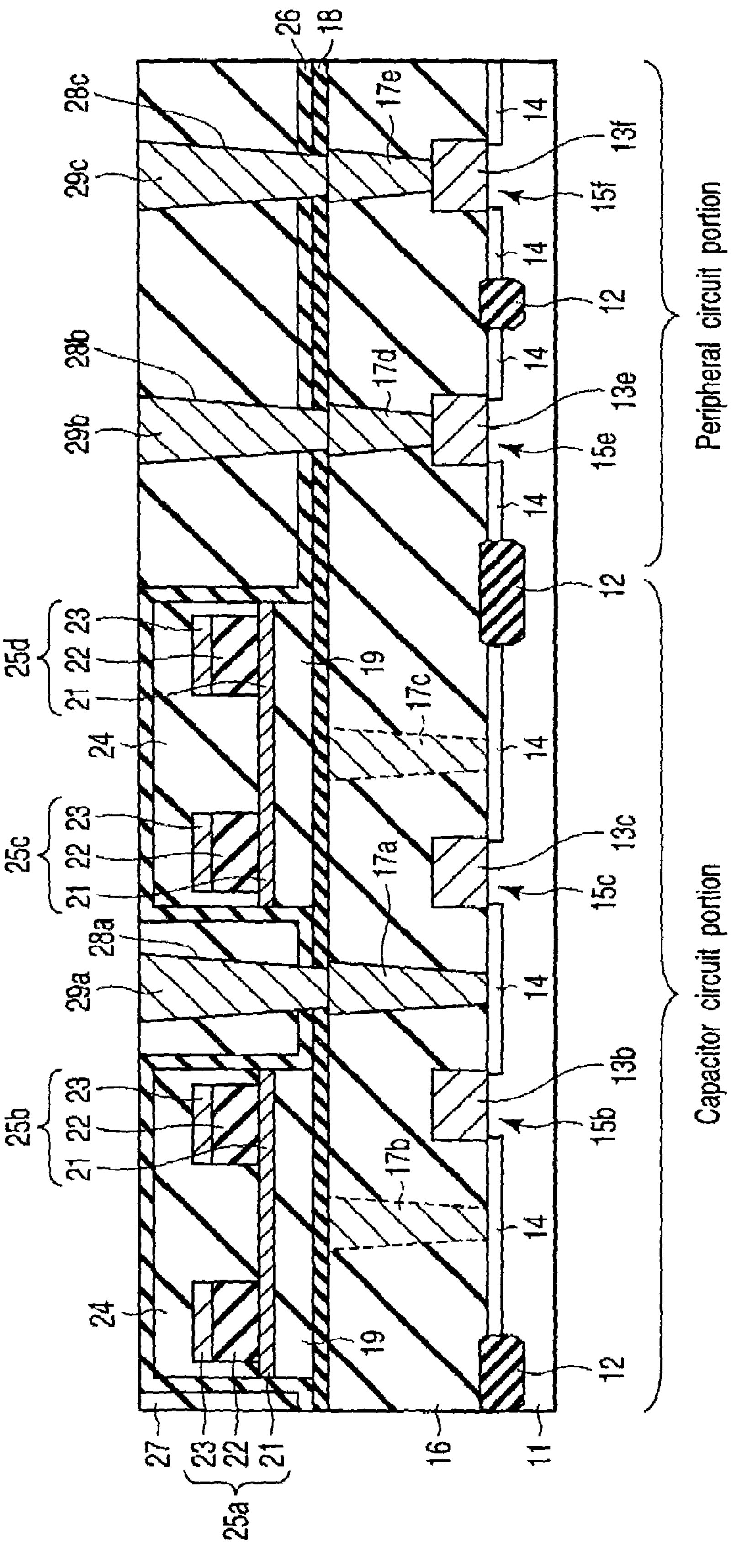

As shown in FIG. 14, the contact holes 28*a*, 28*b*, and 28*c* are filled with a metal material containing, e.g., Ti, TiN, or W. The upper surface of the metal material is planarized. With this process, the contacts 29*a*, 29*b*, and 29*c* connected to the contacts 17*a*, 17*d*, and 17*e* are formed. To fill the contact holes 28*a*, 28*b*, and 28*c* having a high aspect ratio, they are filled with the metal material of the contacts 29*a*, 29*b*, and 29*c* by using plasma CVD.

As shown in FIG. 15, the insulating oxygen barrier film 30 is formed on the contacts 29*a*, 29*b*, and 29*c*, hydrogen and oxygen barrier film 26, and interlayer dielectric film 27. For example, $Al_2O_3$, SiN, SiON, PZT, or $TiO_2$ is used as the material of the insulating oxygen barrier film 30.

As shown in FIG. 16, contact holes 31*a*, 31*b*, 31*c*, 31*d*, 31*e*, and 31*f* extending through the oxygen barrier film 30, hydrogen and oxygen barrier film 26, and interlayer dielectric film 24 are formed. Next, high-temperature oxygen annealing is executed, e.g., at 650° C. in an oxygen atmosphere for 1 hr.

Figure 17:
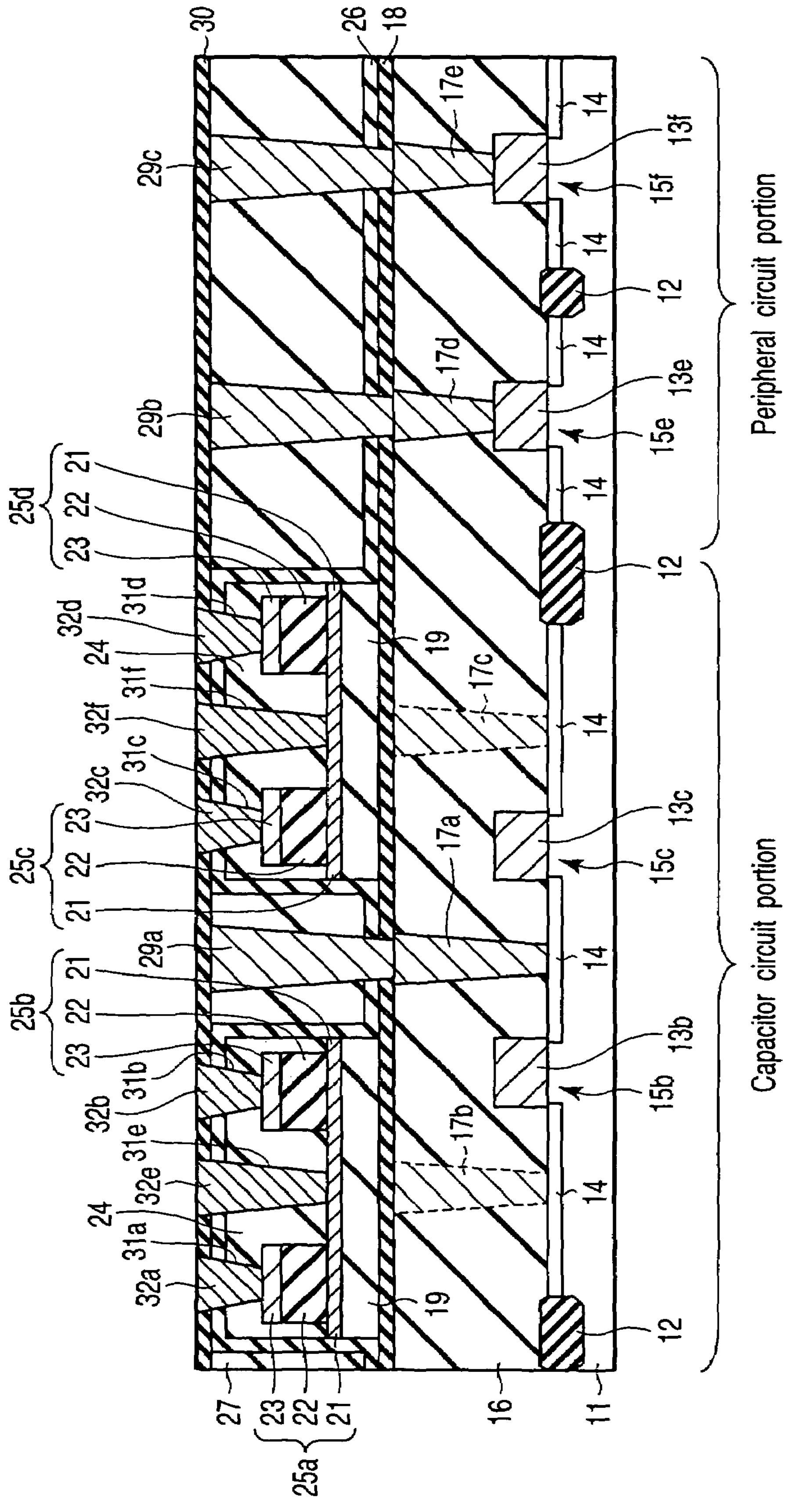

As shown in FIG. 17, the contact holes 31*a*, 31*b*, 31*c*, 31*d*, 31*e*, and 31*f* are filled with a metal material such as W, Cu, Al, or TiN. The upper surface of the metal material is planarized. Accordingly, the contacts 32*a*, 32*b*, 32*c*, and 32*d* connected to the upper electrodes 23 and the contacts 32*e* and 32*f* connected to the lower electrodes 21 are formed.

Figure 18:
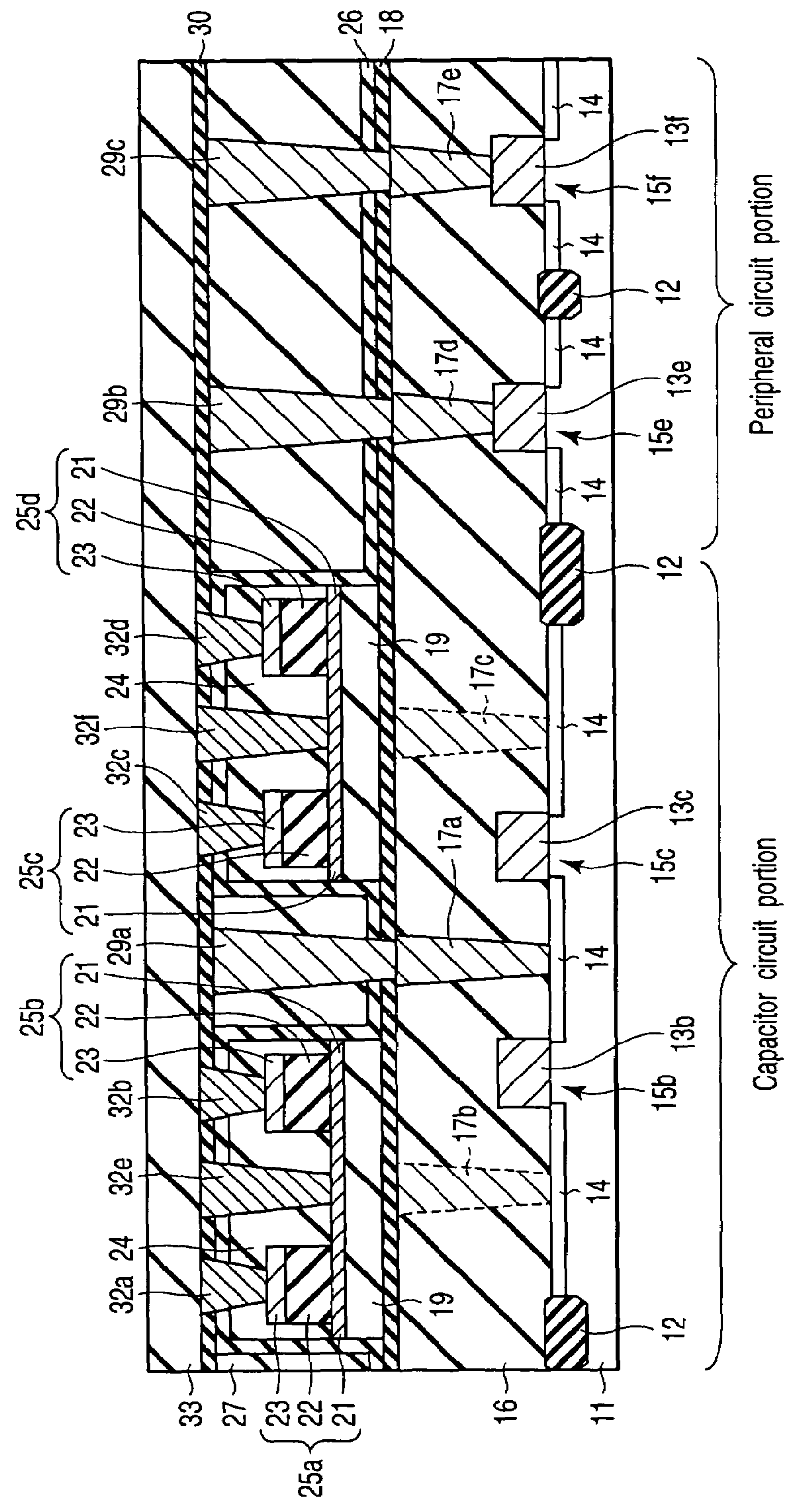

As shown in FIG. 18, an interlayer dielectric film 33 is formed on the contacts 32*a*, 32*b*, 32*c*, 32*d*, 32*e*, and 32*f* and oxygen barrier film 30.

Figure 19:
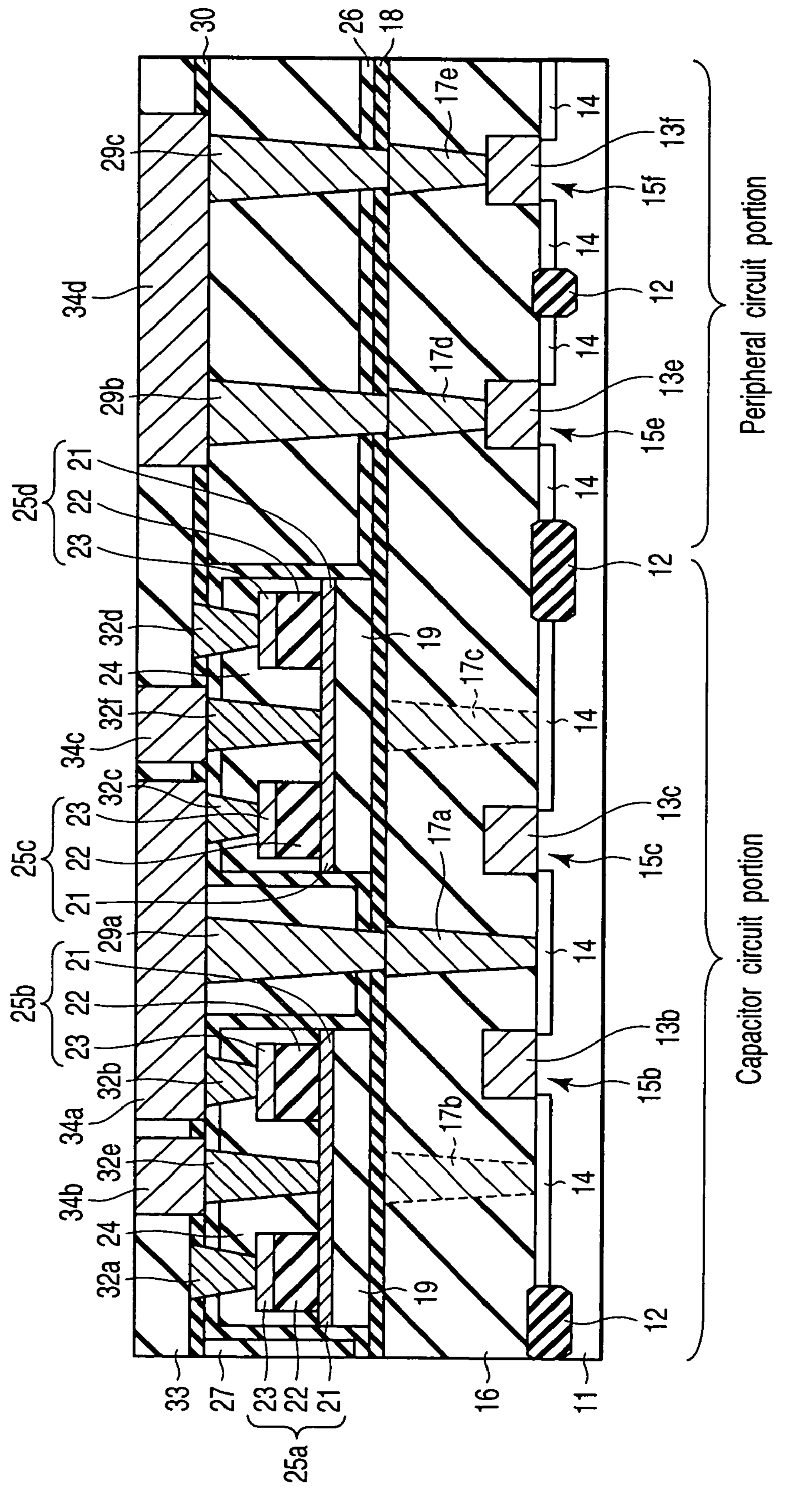

As shown in FIG. 19, the interconnections 34*a*, 34*b*, 34*c*, and 34*d* made of, e.g., W, Cu, Al, or TiN are formed. As a result, the upper electrodes 23 of the capacitors 25*b* and 25*c* and the source/drain diffusion layer 14 of the transistors 15*b* and 15*c* are electrically connected by using the interconnection 34*a*. The lower electrode 21 of the capacitor 25*b* and the source/drain diffusion layer 14 of the transistor 15*b* are electrically connected by using the interconnection 34*b*. The lower electrode 21 of the capacitor 25*c* and the source/drain diffusion layer 14 of the transistor 15*c* are electrically connected by using the interconnection 34*c*.

Figure 20:
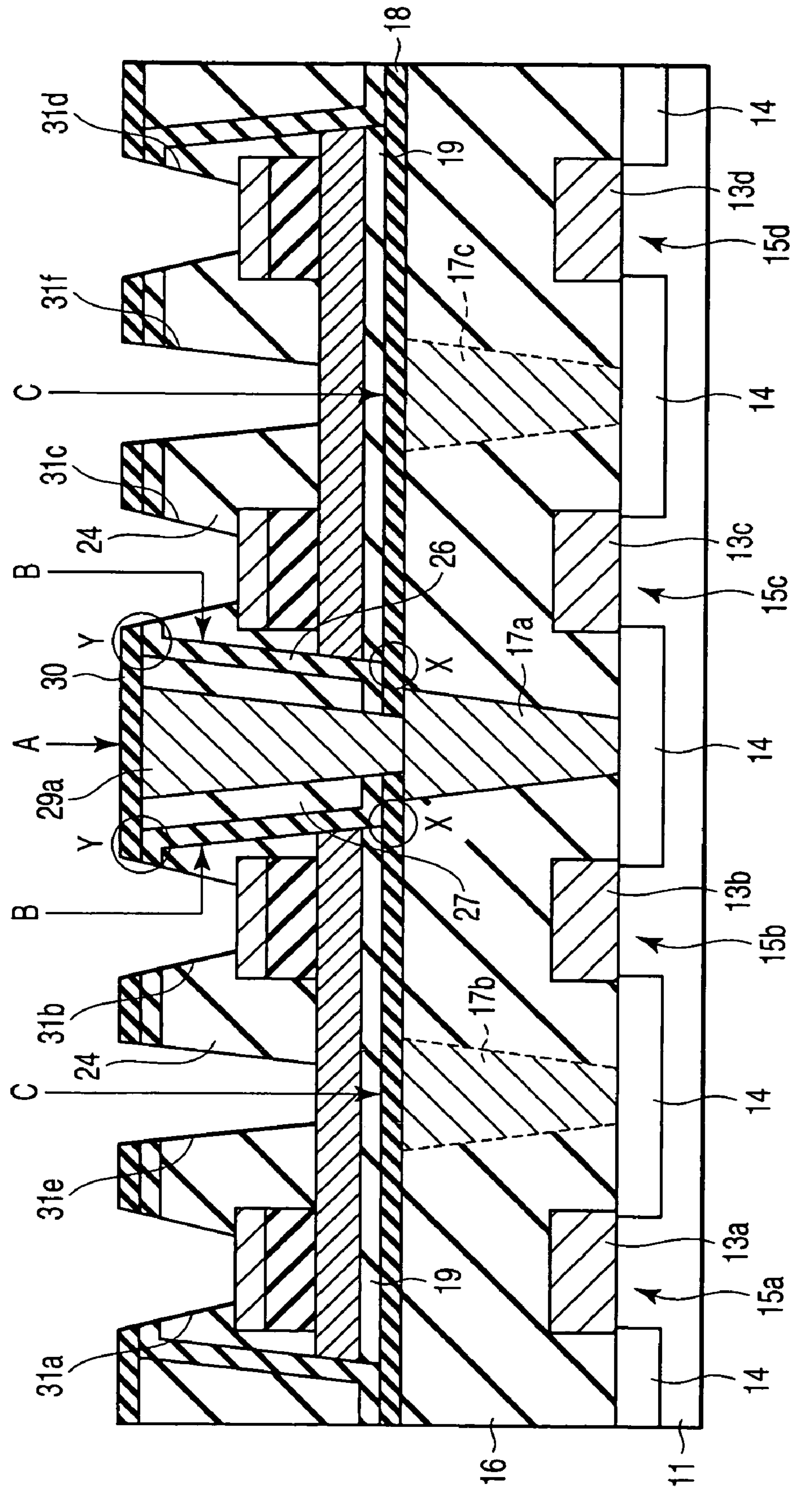
FIG. 20 is a sectional view showing the oxygen annealing step for the ferro-electric memory device according to the first embodiment of the present invention.

In the manufacturing method according to the first embodiment, after the contact holes 31*a*, 31*b*, 31*c*, 31*d*, 31*e*, and 31*f* are formed in the step shown in FIG. 16, high-temperature oxygen annealing is executed to recover the damage of the capacitors 25*a*, 25*b*, 25*c*, and 25*d*. At this time, as shown in FIG. 20, oxygen by annealing diffuses near the contact 29*a* through routes A, B, and C.

In the first embodiment, oxygen diffusion through the route A is prevented by the oxygen barrier film 30. Oxygen diffusion through the routes B is prevented by the hydrogen and oxygen barrier film 26. Oxygen diffusion through the routes C is prevented by the oxygen barrier film 18.

If a gap is present, at the portion X, between the hydrogen and oxygen barrier film 26 and the oxygen barrier film 18, oxygen diffuses from the gap to the contact 29*a* and oxidizes it. In addition, if a gap is present, at the portion Y, between the hydrogen and oxygen barrier film 26 and the oxygen barrier film 30, oxygen diffuses from the gap to the contact 29*a* and oxidizes it. To prevent the contact 29*a* from being oxidized by oxygen annealing, it is important that, in oxygen annealing, (a) the hydrogen and oxygen barrier film 26 is in contact with the oxygen barrier film 18 at the portion X, and (b) the hydrogen and oxygen barrier film 26 is in contact with the oxygen barrier film 30 at the portion Y.

Figure 21:
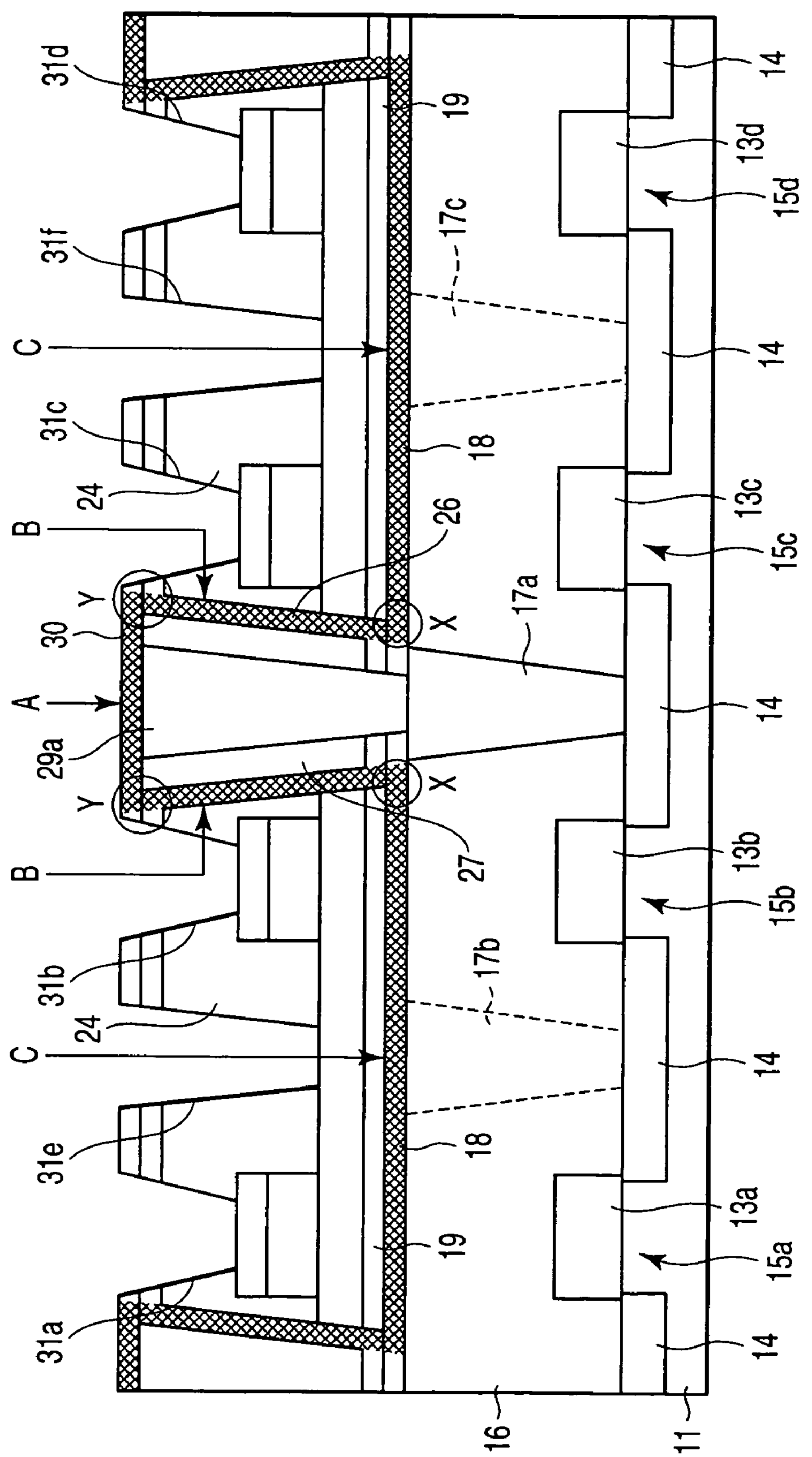
FIG. 21 is a sectional view showing preventing contacts from being oxidized in the oxygen annealing step for the ferro-electric memory device according to the first embodiment of the present invention.

According to the first embodiment, after the contact holes 31*a*, 31*b*, 31*c*, 31*d*, 31*e*, and 31*f* are formed, high-temperature oxygen annealing is executed to recover the damage of the capacitors 25*a*, 25*b*, 25*c*, and 25*d*. At this time, the contact 29*a* made of, e.g., W can be prevented from being oxidized by high-temperature oxygen annealing because the contact 29*a* is surrounded by the oxygen barrier films 18 and 30 and hydrogen and oxygen barrier film 26 (crosshatched portion in FIG. 21). Even when the contact 29*a* made of, e.g., W is formed, high-temperature oxygen annealing can be executed. Hence, the damage of the capacitors 25*a*, 25*b*, 25*c*, and 25*d* can be recovered. Furthermore, since the contact 29*a* can be made of W or TiN by using plasma CVD, the filling characteristic of the contact 29*a* having a high aspect ratio can be increased.

Figure 22:
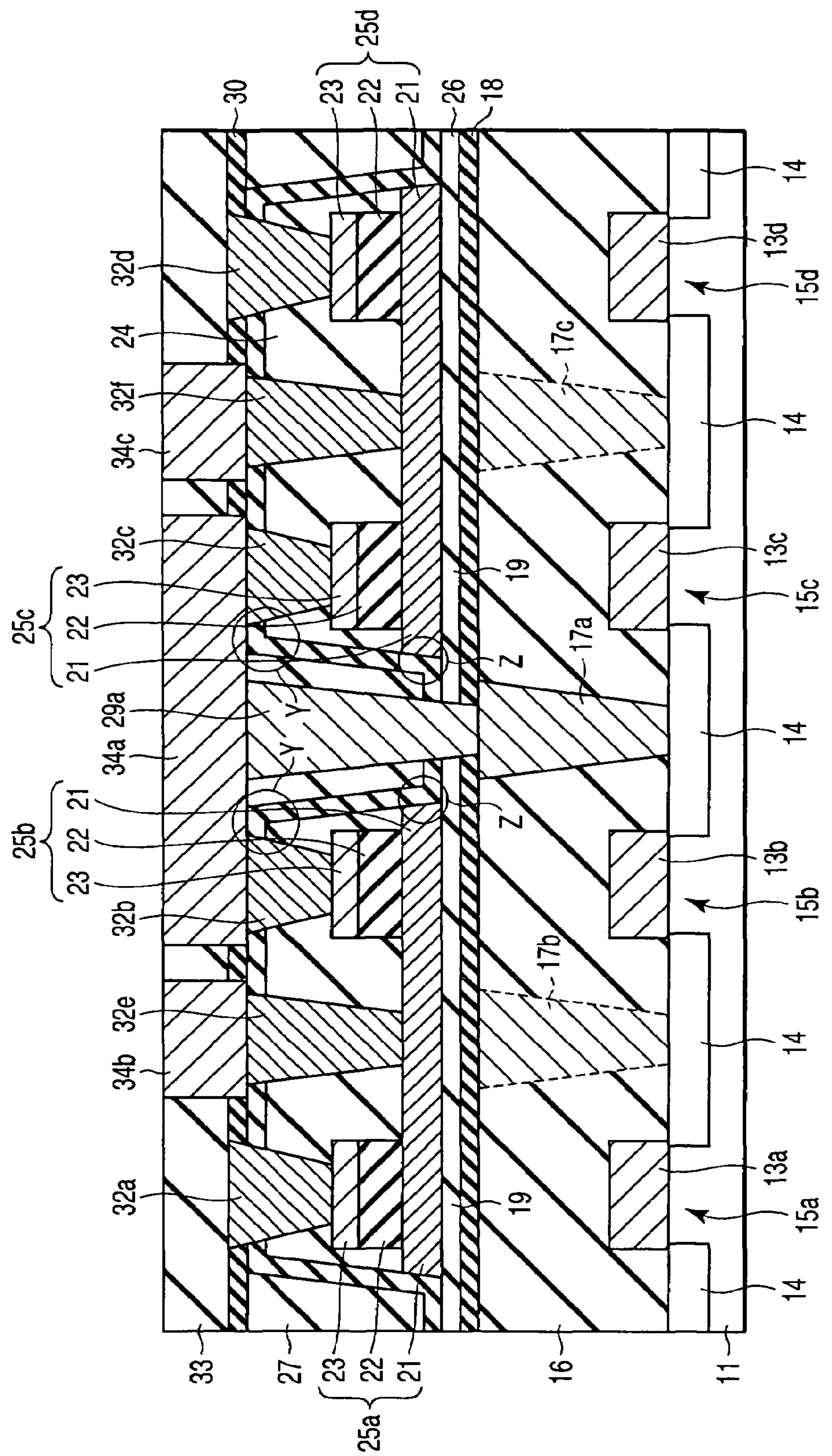
FIG. 22 is a sectional view showing another ferro-electric memory device according to the first embodiment of the present invention.

In the FeRAM having the offset structure, no contact made of, e.g., W is present immediately under the lower electrode 21. For this reason, the lower electrode 21 is often made of a material having no oxygen diffusion preventing effect. However, the lower electrode 21 may be made of a material having an oxygen diffusion preventing effect. In this case, even when a gap is formed, at the portion X, between the hydrogen and oxygen barrier film 26 and the oxygen barrier film 18, oxygen diffusion can be prevented as far as the edge portion of the lower electrode 21 comes into contact with the hydrogen and oxygen barrier film 26 at a portion Z (FIG. 22).

Second Embodiment

The second embodiment is a modification to the first embodiment. A hydrogen and oxygen barrier film 26 comes into direct contact with a contact 17*a*.

Figure 23:
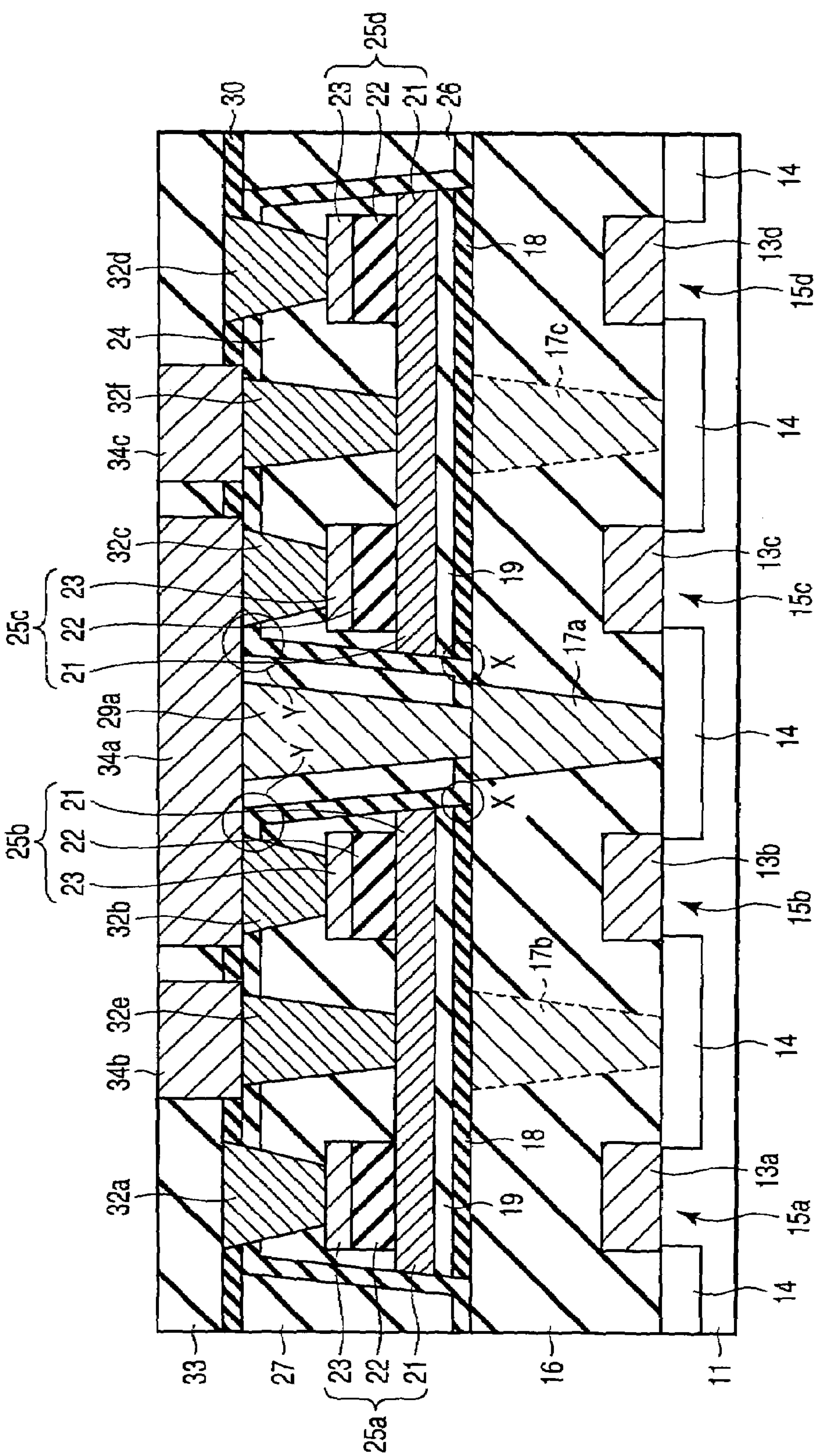
FIG. 23 is a sectional view showing a ferro-electric memory device according to the second embodiment of the present invention.

FIG. 23 shows a ferro-electric memory device according to the second embodiment of the present invention. As shown in FIG. 23, the second embodiment is different from the first embodiment in that an oxygen barrier film 18 is separated, like lower electrodes 21, and the hydrogen and oxygen barrier film 26 comes into direct contact with the contact 17*a*.

In the second embodiment, the oxygen barrier film 18 is formed on contacts 17*b* and 17*c*. An oxygen barrier film 30 is formed on a contact 29*a*. The hydrogen and oxygen barrier film 26 is formed between a capacitor 25*b* and the contact 29*a* and between a capacitor 25*c* and the contact 29*a*. The hydrogen and oxygen barrier film 26 comes into contact with the oxygen barrier film 18 at portions X, contacts 32*b* and 32*c* and an interconnection 34*a* at portions Y, and the oxygen barrier film 30 on an interlayer dielectric film 24.

Figure 24:
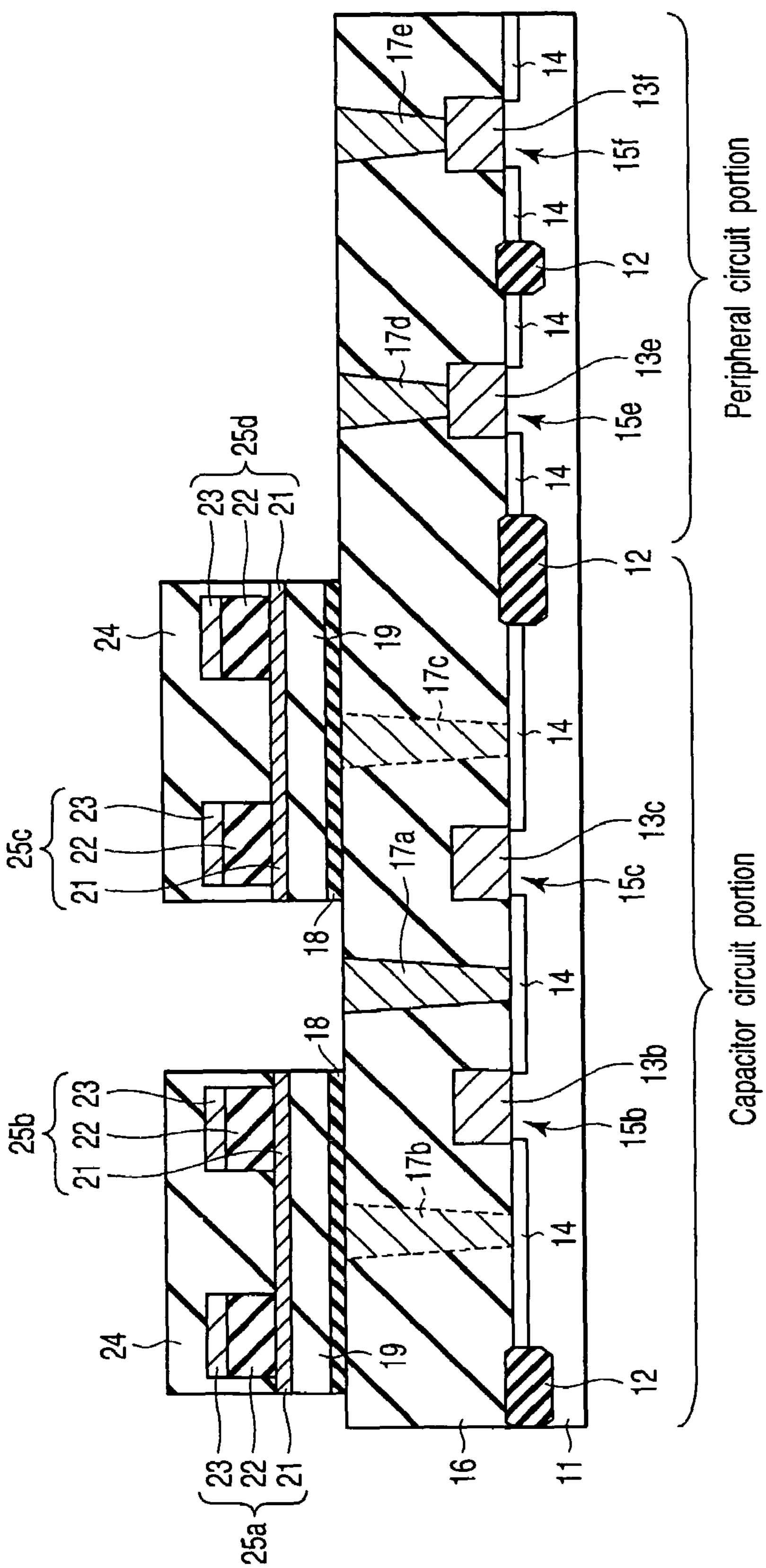
FIGS. 24 and 25 are sectional views showing steps in manufacturing the ferro-electric memory device according to the second embodiment of the present invention.
Figure 25:
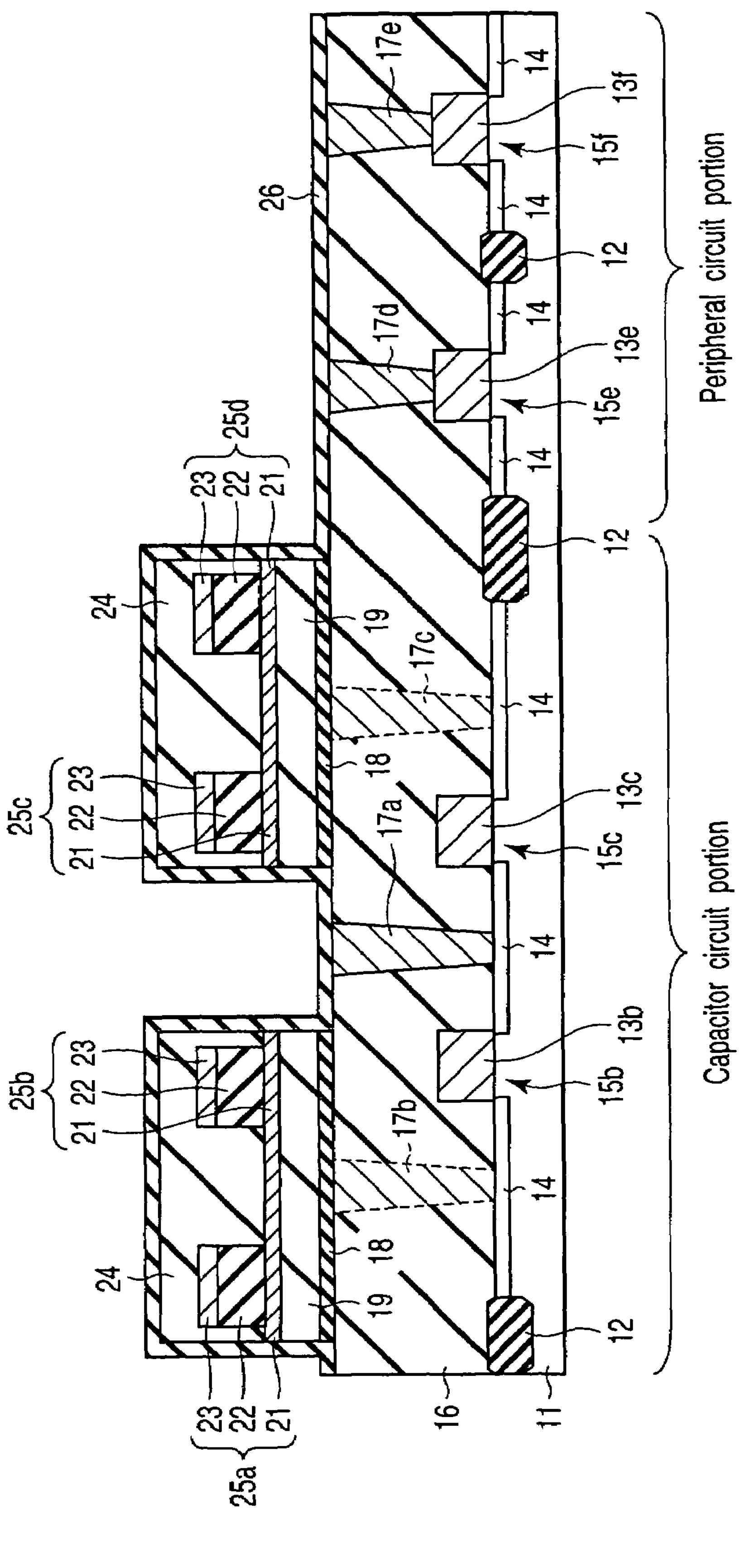

FIGS. 24 and 25 are sectional views showing steps in manufacturing the ferro-electric memory device according to the second embodiment of the present invention. A method of manufacturing the ferro-electric memory device according to the second embodiment will be described below.

First, the steps shown in FIGS. 3 to 9 in the first embodiment are executed to form the interlayer dielectric film 24 on upper electrodes 23 and the lower electrode 21.

As shown in FIG. 24, a mask (not shown) is formed on the interlayer dielectric film 24 and patterned. Then, the interlayer dielectric film 24 is patterned by using the patterned mask. In addition, the lower electrode 21, an interlayer dielectric film 19, and the oxygen barrier film 18 are processed by using the patterned interlayer dielectric film 24 as a mask. With this process, the ferro-electric capacitors 25*a*, 25*b*, 25*c*, and 25*d* are formed. Furthermore, since the oxygen barrier film 18 is separated, the upper surfaces of the contacts 17*a*, 17*d*, and 17*e* are exposed.

As shown in FIG. 25, the hydrogen and oxygen barrier film 26 is formed on the upper and side surfaces of the interlayer dielectric films 24, the side surfaces of the lower electrodes 21, interlayer dielectric films 19, and oxygen barrier films 18, and the upper surfaces of the interlayer dielectric film 16 and contacts 17*a*, 17*d*, and 17*e* by sputtering or CVD. Accordingly, the hydrogen and oxygen barrier film 26 covers the ferro-electric capacitors 25*a*, 25*b*, 25*c*, and 25*d* and comes into direct contact with the contacts 17*a*, 17*d*, and 17*e*. Examples of the material of the hydrogen and oxygen barrier film 26 are $Al_2O_3$, SiN, SiON, $TiO_2$, and PZT.

After that, the steps shown in FIGS. 12 to 19 in the first embodiment are executed to form a ferro-electric memory device.

Figure 26:
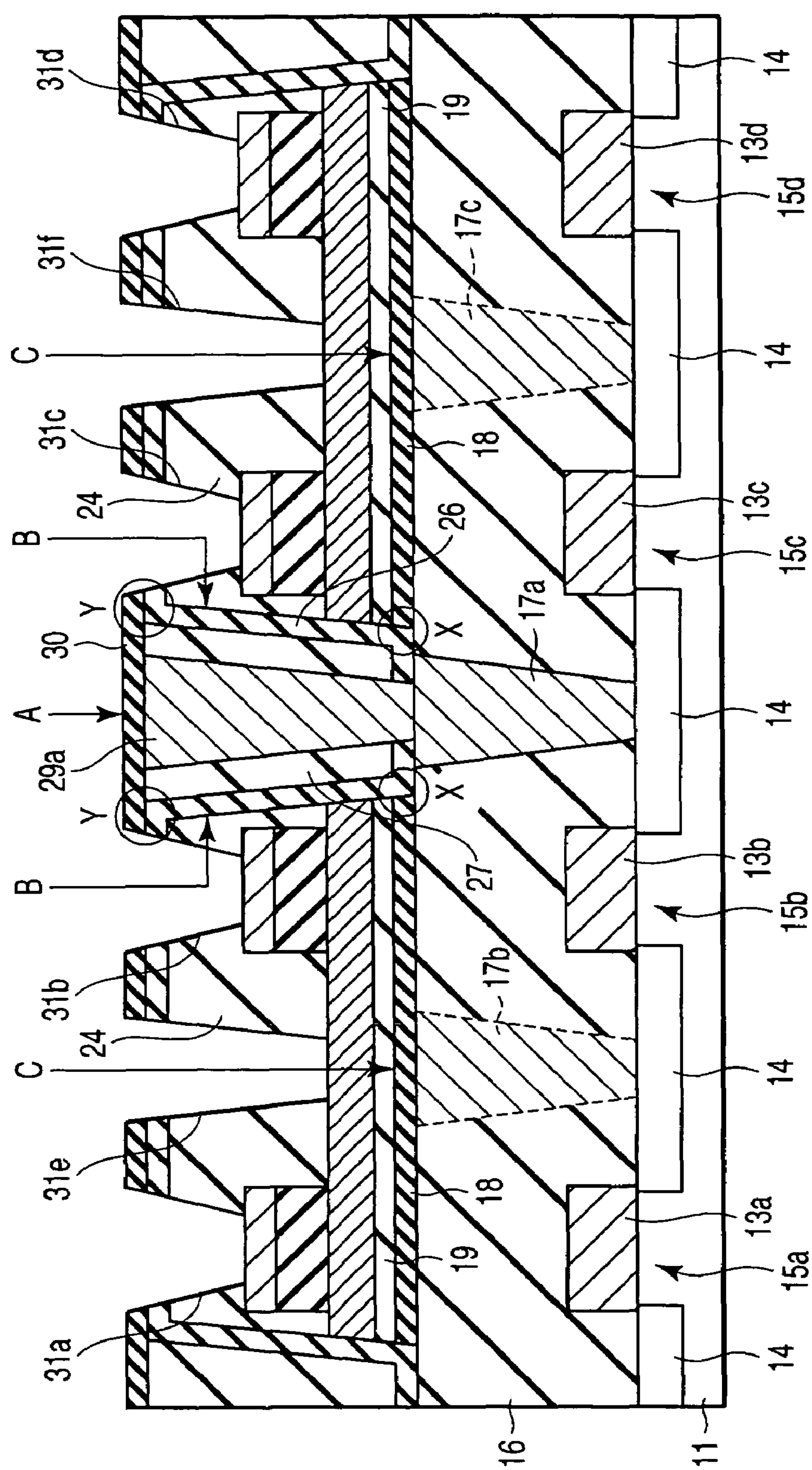
FIG. 26 is a sectional view showing the oxygen annealing step for the ferro-electric memory device according to the second embodiment of the present invention.

In the manufacturing method according to the second embodiment, as shown in FIG. 26, to prevent oxygen from diffusing through routes A, B, and C to oxidize the contact 29*a*, it is important that, in oxygen annealing, (a) the hydrogen and oxygen barrier film 26 is in contact with the oxygen barrier film 18 at the portion X, and (b) the hydrogen and oxygen barrier film 26 is in contact with the oxygen barrier film 30 at the portion Y, as in the first embodiment.

Figure 27:
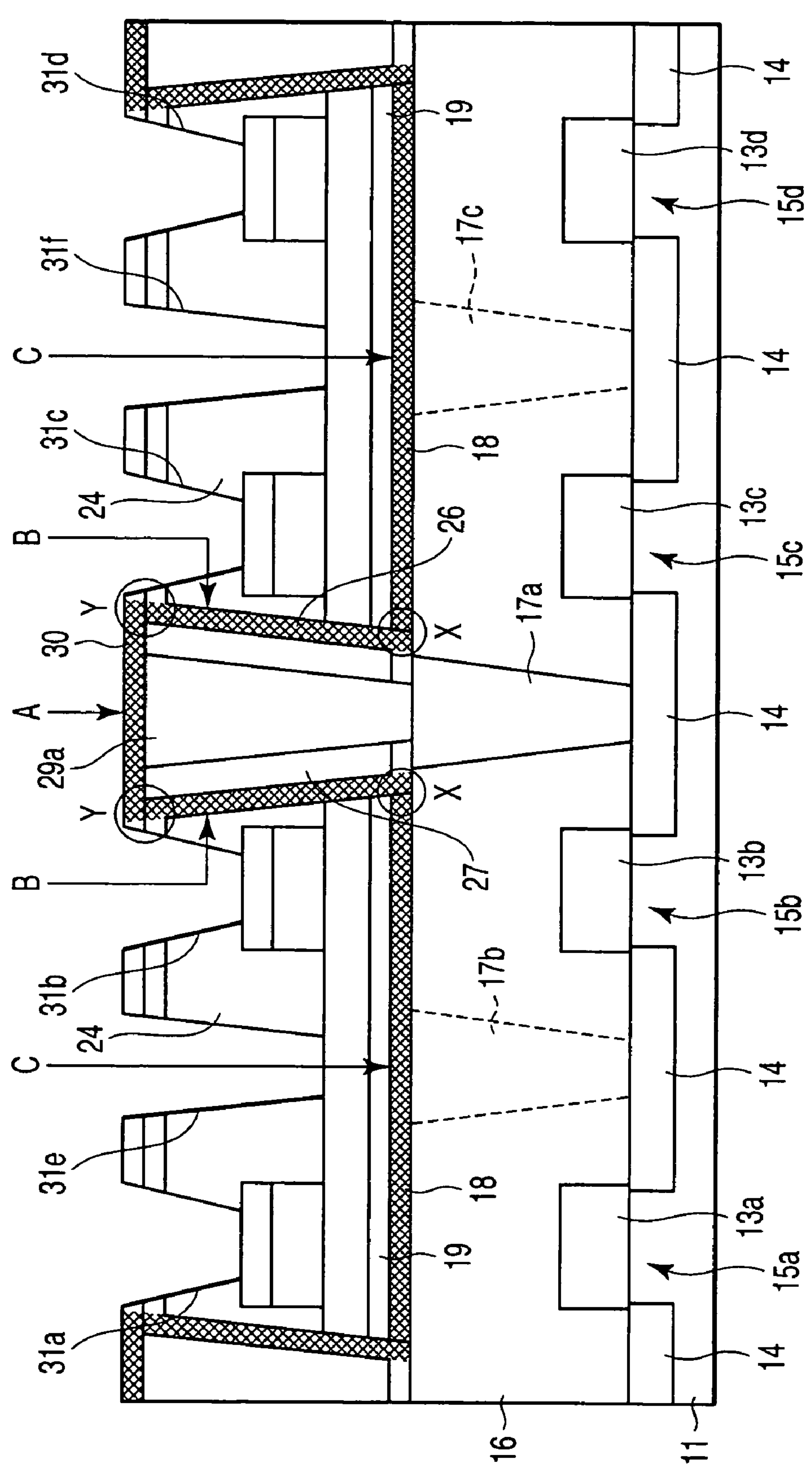
FIG. 27 is a sectional view showing preventing contacts from being oxidized in the oxygen annealing step for the ferro-electric memory device according to the second embodiment of the present invention.

According to the second embodiment, in high-temperature oxygen annealing, the contact 29*a* made of, e.g., W can be prevented from being oxidized by oxygen annealing because the contact 29*a* is surrounded by the oxygen barrier films 18 and 30 and hydrogen and oxygen barrier film 26 (crosshatched portion in FIG. 27), as in the first embodiment.

Furthermore, the hydrogen and oxygen barrier film 26 is in direct contact with the contact 17*a*. For this reason, the aspect ratio of the contact 29*a* can be decreased by an amount corresponding to the thickness of the oxygen barrier film 18.

Third Embodiment

The third embodiment is a modification to the second embodiment. Contacts that connect the upper electrodes of capacitors to the sources/drains of transistors are formed at once.

Figure 28:
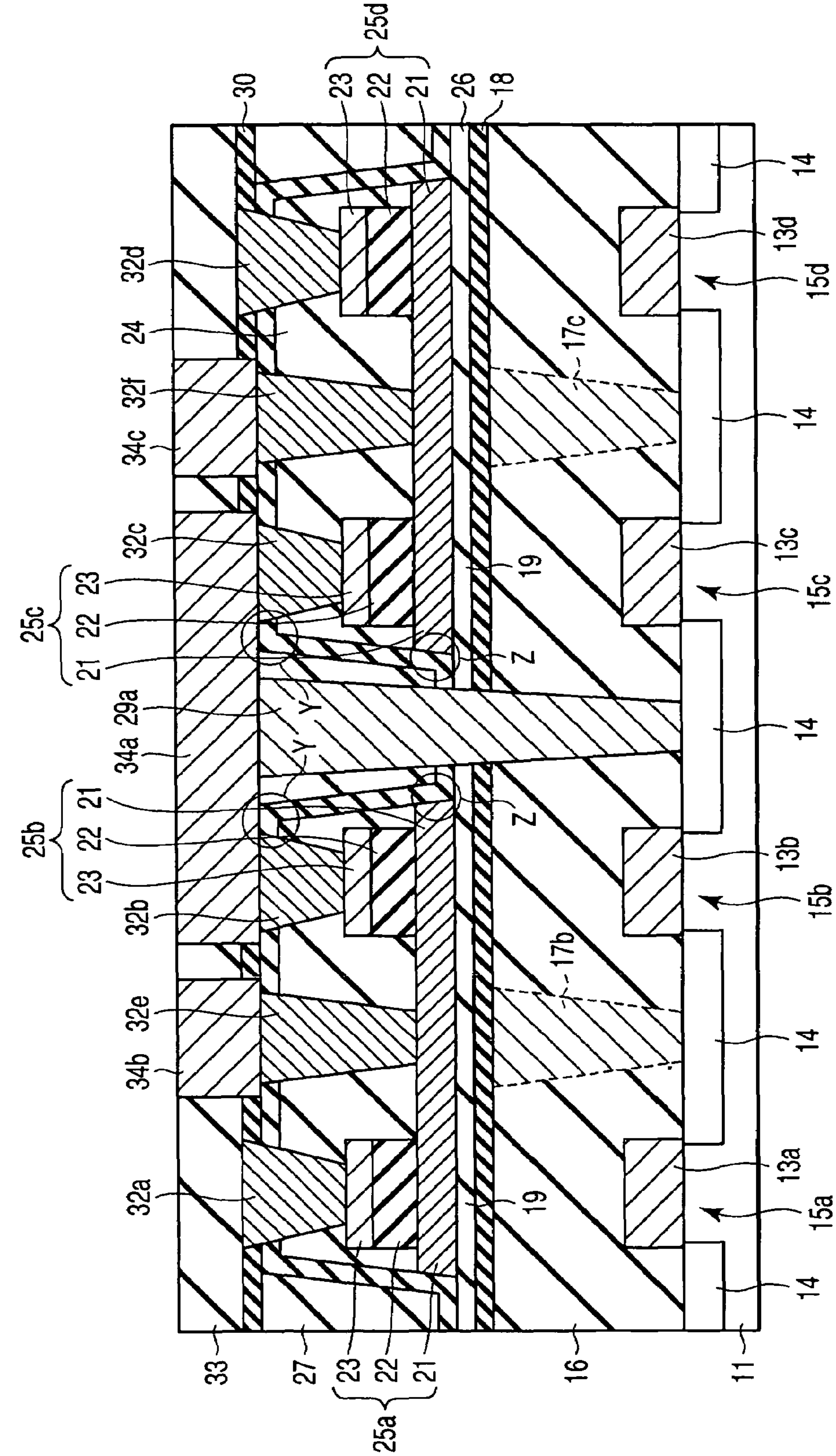
FIG. 28 is a sectional view showing a ferro-electric memory device according to the third embodiment of the present invention.

FIG. 28 shows a ferro-electric memory device according to the third embodiment of the present invention. As shown in FIG. 28, in the third embodiment, the contacts 29*a* and 17*a* of the second embodiment are formed at once as one contact 29*a*. The contact 29*a* is directly connected to a source/drain diffusion layer 14.

In the third embodiment, an oxygen barrier film 18 is formed on contacts 17*b* and 17*c*. An oxygen barrier film 30 is formed on the contact 29*a*. A hydrogen and oxygen barrier film 26 is formed between a capacitor 25*b* and the contact 29*a* and between a capacitor 25*c* and the contact 29*a*. The hydrogen and oxygen barrier film 26 comes into contact with the oxygen barrier film 18 at portions X, contacts 32*b* and 32*c* and an interconnection 34*a* at portions Y, and the oxygen barrier film 30 on an interlayer dielectric film 24.

Figure 29:
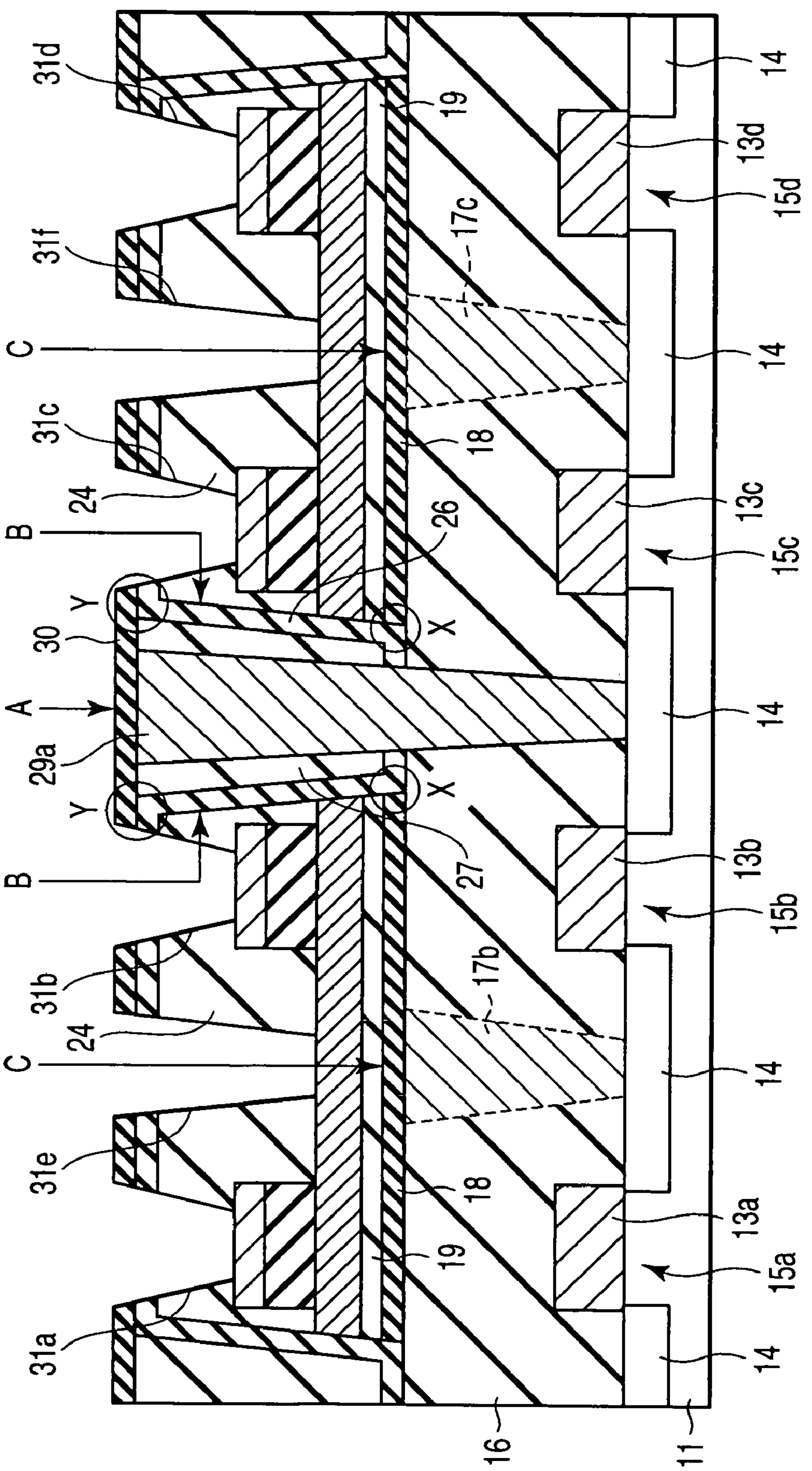
FIG. 29 is a sectional view showing the oxygen annealing step for the ferro-electric memory device according to the third embodiment of the present invention.

In the third embodiment, as shown in FIG. 29, to prevent oxygen from diffusing through routes A, B, and C to oxidize the contact 29*a*, it is important that, in oxygen annealing, (a) the hydrogen and oxygen barrier film 26 is in contact with the oxygen barrier film 18 at the portion X, and (b) the hydrogen and oxygen barrier film 26 is in contact with the oxygen barrier film 30 at the portion Y, as in the first embodiment.

Figure 30:
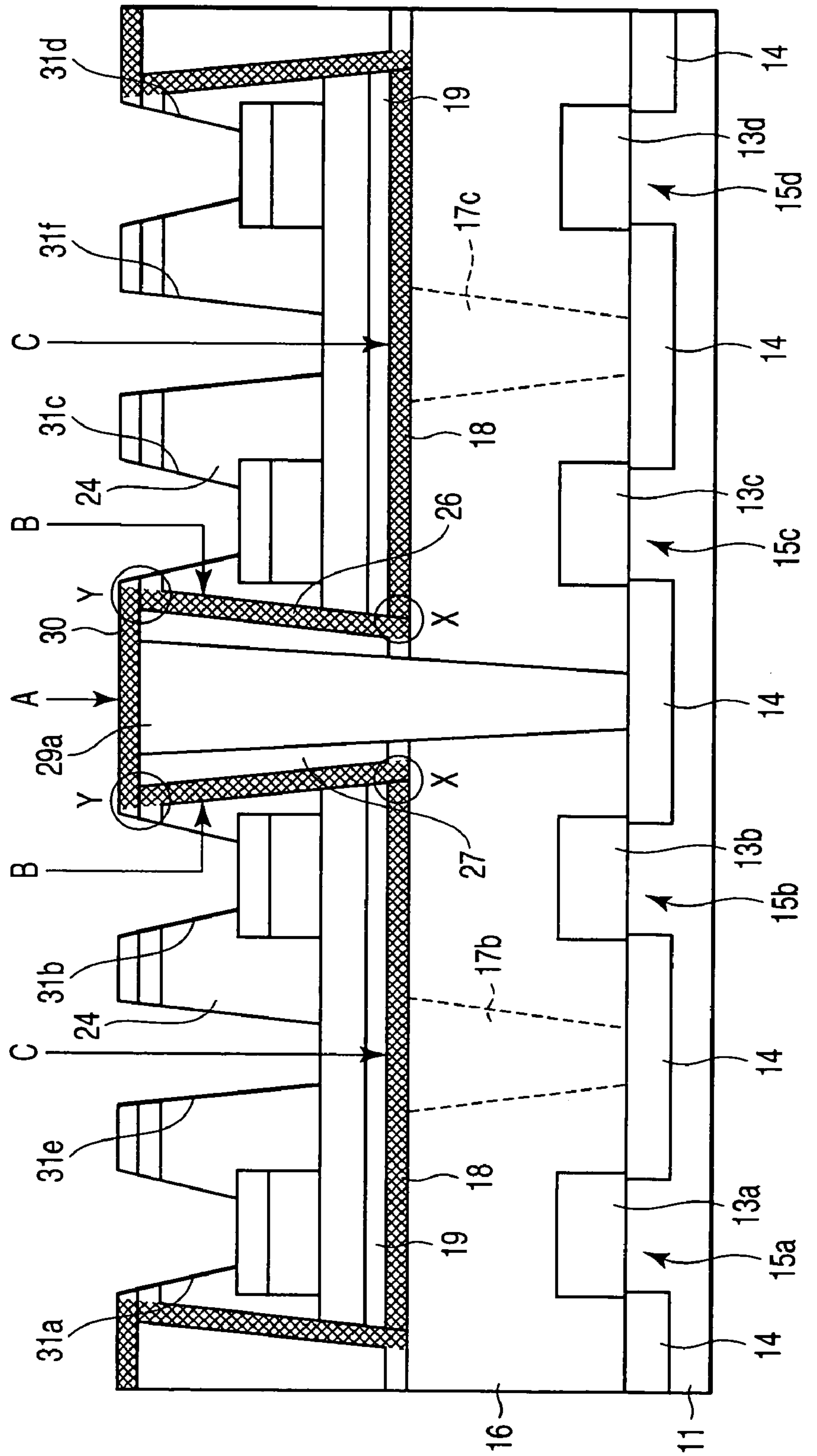
FIG. 30 is a sectional view showing preventing contacts from being oxidized in the oxygen annealing step for the ferro-electric memory device according to the third embodiment of the present invention.

According to the third embodiment, in high-temperature oxygen annealing, the contact 29*a* made of, e.g., W can be prevented from being oxidized by oxygen annealing because the contact 29*a* is surrounded by the oxygen barrier films 18 and 30 and hydrogen and oxygen barrier film 26 (cross-hatched portion in FIG. 30), as in the second embodiment.

Furthermore, as in the second embodiment, the hydrogen and oxygen barrier film 26 is in direct contact with the contact 17*a*. For this reason, the aspect ratio of the contact 29*a* can be decreased by an amount corresponding to the thickness of the oxygen barrier film 18.

The contact 29*a* which connects the interconnection 34*a* to the source/drain diffusion layer 14 is formed at once as one structure. As compared to the case wherein the contact at this portion is not formed at once as one structure, any decrease in yield due to misalignment can be suppressed. Hence, the cost can be reduced.

In the third embodiment, the structure of the first embodiment may be deformed such that the contacts that connect the upper electrodes of capacitors to the sources/drains of transistors are formed at once.

Fourth Embodiment

In the first embodiment, an offset structure has been described as an example. In the fourth embodiment, a COP (Capacitor On Plug) structure will be described as an example.

Figure 31:
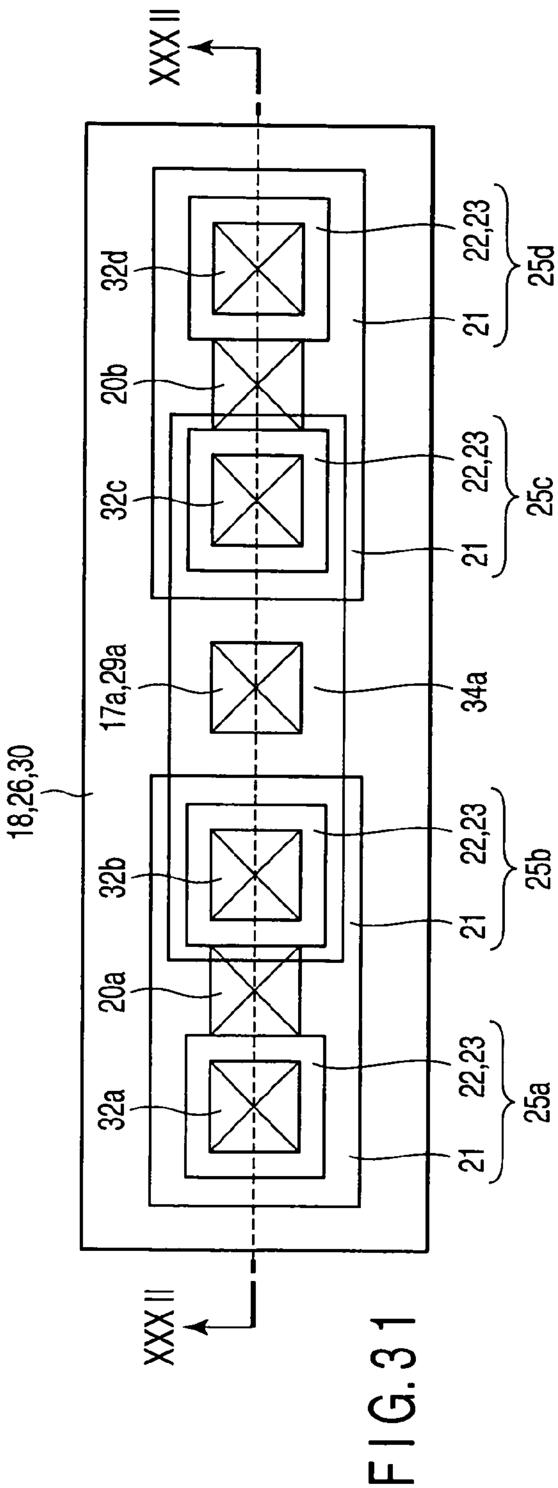
FIG. 31 is a plan view showing a ferro-electric memory device according to the fourth embodiment of the present invention.
Figure 32:
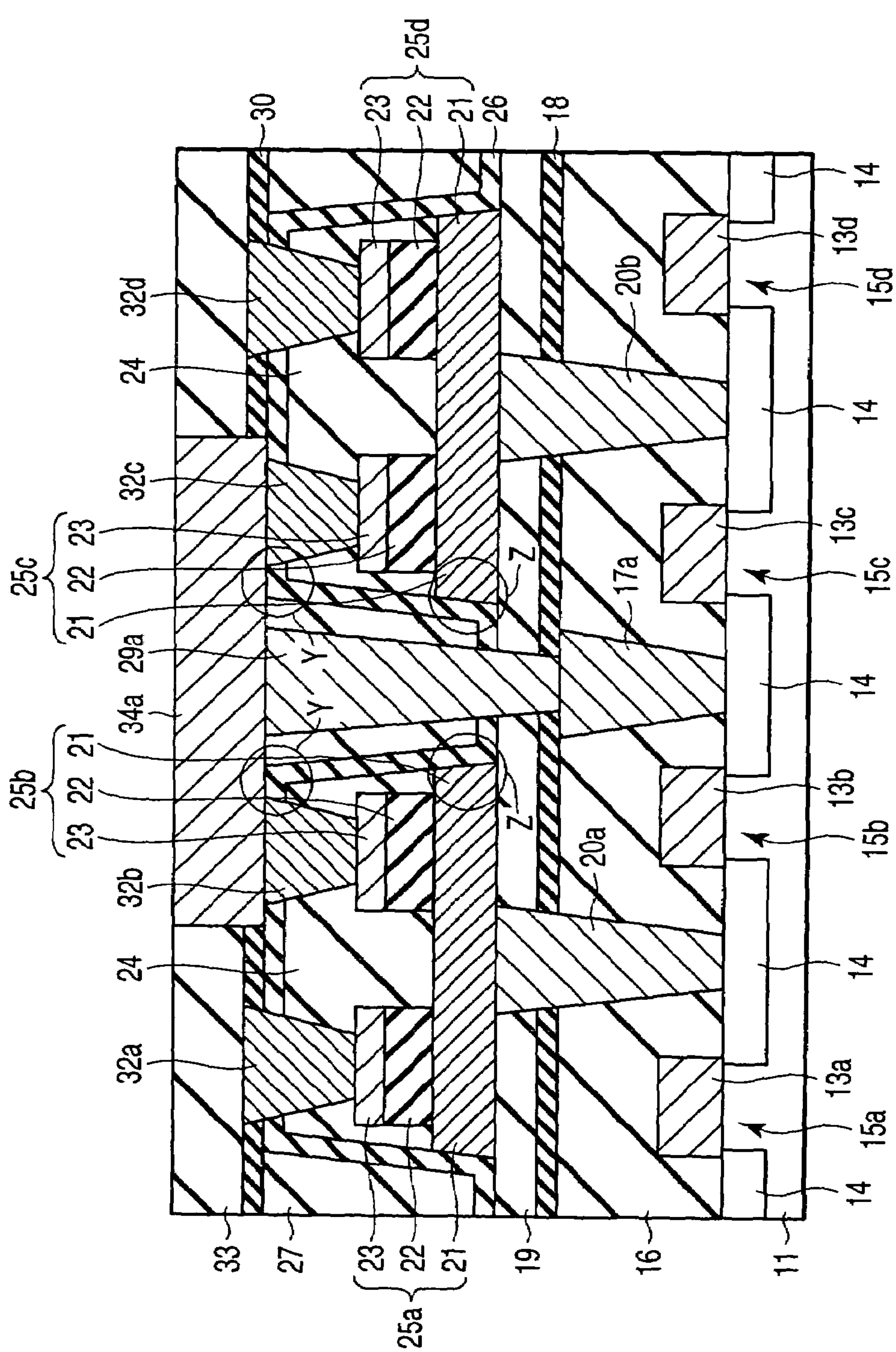
FIG. 32 is a sectional view of the ferro-electric memory device taken along a line XXXII—XXXII in FIG. 31.

FIGS. 31 and 32 show a ferro-electric memory device according to the fourth embodiment of the present invention. The structure of the ferro-electric memory device according to the fourth embodiment will be described below. A structure different from the first embodiment will mainly be described.

As shown in FIGS. 31 and 32, the fourth embodiment has a COP structure. More specifically, the fourth embodiment has the following structure. A contact 20*a* is formed on a source/drain diffusion layer 14 between transistors 15*a* and 15*b*. The contact 20*a* is directly connected to a lower electrode 21 of ferro-electric capacitors 25*a* and 25*b*. Similarly, a contact 20*b* is formed on the source/drain diffusion layer 14 between transistors 15*c* and 15*d*. The contact 20*b* is directly connected to the lower electrode 21 of ferro-electric capacitors 25*c* and 25*d*.

In the structure according to the fourth embodiment, an insulating oxygen barrier film 18, insulating hydrogen and oxygen barrier film 26, and insulating oxygen barrier film 30 are formed as films that prevent diffusion of oxygen. In addition, the conductive lower electrodes 21 made of a material having an oxygen diffusion preventing effect are formed.

The oxygen barrier film 18 is formed on a contact 17*a* and an interlayer dielectric film 16. The hydrogen and oxygen barrier film 26 is formed on the upper and side surfaces of an interlayer dielectric film 24, the side surfaces of the lower electrodes 21, and the upper surface of an interlayer dielectric film 19. The oxygen barrier film 30 is formed on the hydrogen and oxygen barrier film 26 and an interlayer dielectric film 27. The lower electrodes 21 are formed on the contacts 20*a* and 20*b*. The edge portions of each lower electrode 21 project from ferro-electric films 22 and upper electrodes 23.

As described above, the oxygen barrier film 18 is formed on the contact 17*a*. The oxygen barrier film 30 is formed on a contact 29*a*. The lower electrodes 21 having the oxygen diffusion preventing effect are formed on the contacts 20*a* and 20*b*. The hydrogen and oxygen barrier film 26 is formed between the capacitor 25*b* and the contact 29*a* and between the capacitor 25*c* and the contact 29*a*. The hydrogen and oxygen barrier film 26 comes into contact with the edge portions of the lower electrodes 21 at portions Z, contacts 32*b* and 32*c* and an interconnection 34*a* at portions Y, and the oxygen barrier film 30 on the interlayer dielectric film 24.

FIGS. 33 to 47 are sectional views showing steps in manufacturing the ferro-electric memory device according to the fourth embodiment of the present invention. A method of manufacturing the ferro-electric memory device according to the fourth embodiment will be described below. In this example, a capacitor circuit portion in which ferro-electric capacitors are present and a peripheral circuit portion which controls the capacitor circuit portion are simultaneously formed. The transistors 15*a* and 15*d* shown in FIGS. 31 and 32 are not illustrated in the capacitor circuit portion.

Figure 33:
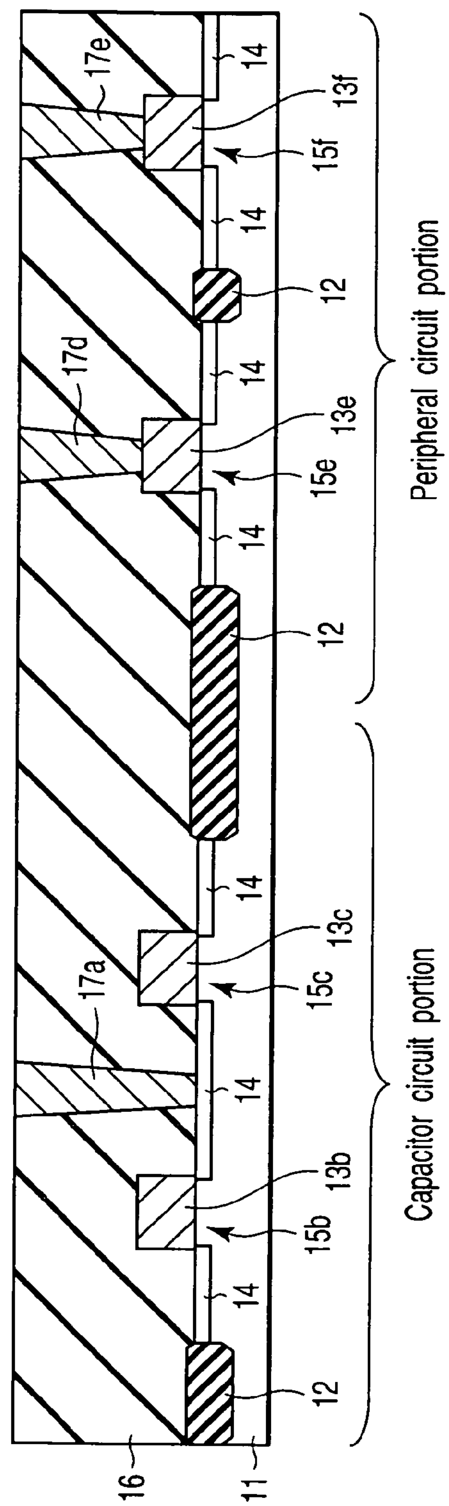

First, as shown in FIG. 33, an STI region 12 for element isolation is formed in a silicon substrate 11. After that, the transistors 15*b* and 15*c* in the capacitor circuit portion and transistors 15*e* and 15*f* in the peripheral circuit portion are formed. The interlayer dielectric film 16 is deposited on the silicon substrate 11 and transistors 15*b*, 15*c*, 15*e*, and 15*f*. The upper surface of the interlayer dielectric film 16 is planarized by, e.g., CMP. Examples of the material of the interlayer dielectric film 16 are BPSG and P-TEOS. The contact 17*a* connected to the source/drain diffusion layer 14 and contacts 17*d* and 17*e* connected to gate electrodes 13*e* and 13*f* are formed in the interlayer dielectric film 16. For example, W or doped polysilicon is used as the material of the contacts 17*a*, 17*d*, and 17*e*.

Figure 34:
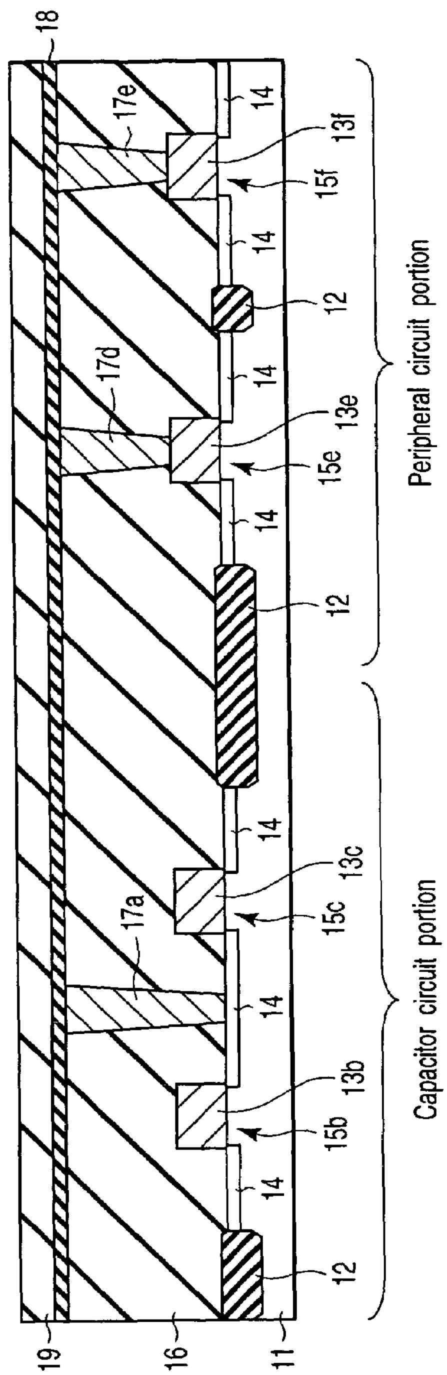

As shown in FIG. 34, the insulating oxygen barrier film 18 is formed on the contacts 17*a*, 17*d*, and 17*e* and interlayer dielectric film 16. The interlayer dielectric film 19 is deposited on the oxygen barrier film 18. For example, $Al_2O_3$, SiN, SiON, PZT, or $TiO_2$ is used as the material of the insulating oxygen barrier film 18. For example, BPSG or P-TEOS is used as the material of the interlayer dielectric film 19.

Figure 35:
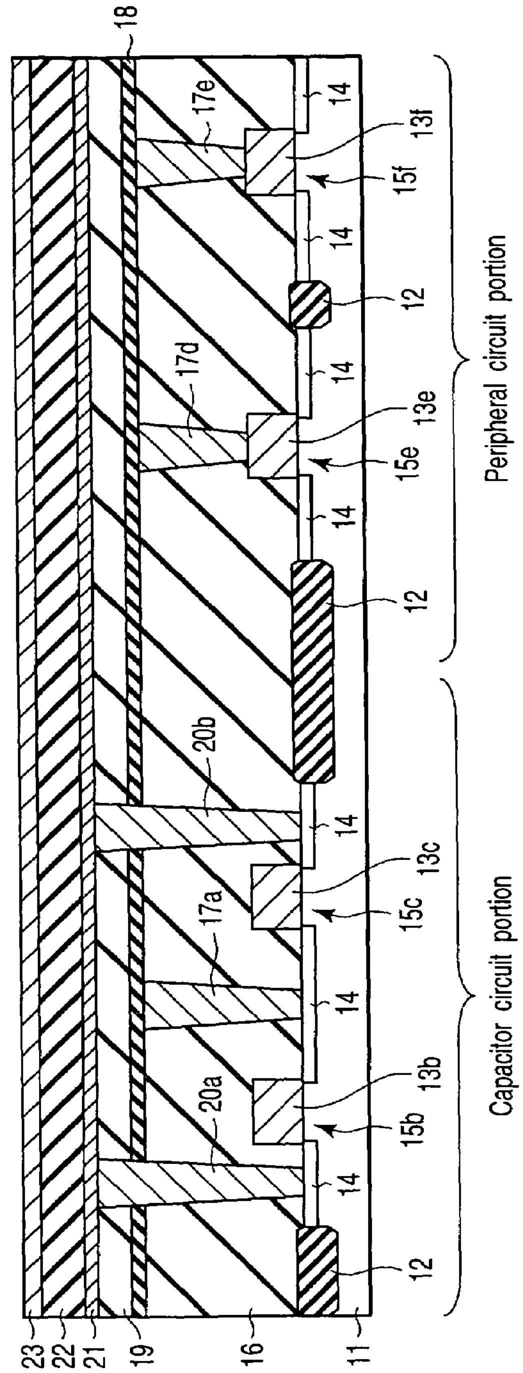

As shown in FIG. 35, the contacts 20*a* and 20*b* connected to the source/drain diffusion layers 14 of the transistors 15*b* and 15*c* are formed. The lower electrode 21, ferro-electric film 22, and upper electrode 23 are sequentially deposited on the contacts 20*a* and 20*b* and the interlayer dielectric film 19. The lower electrode 21 is made of a conductive material (a material containing, e.g., Ir, $IrO_2$, Ru, $RuO_2$, or Pt) having an oxygen diffusion preventing effect. Examples of the material of the ferro-electric film 22 are PZT and SBT. Examples of the material of the upper electrode 23 are Pt, Ir, $IrO_2$, SRO, Ru, and $RuO_2$.

Figure 36:
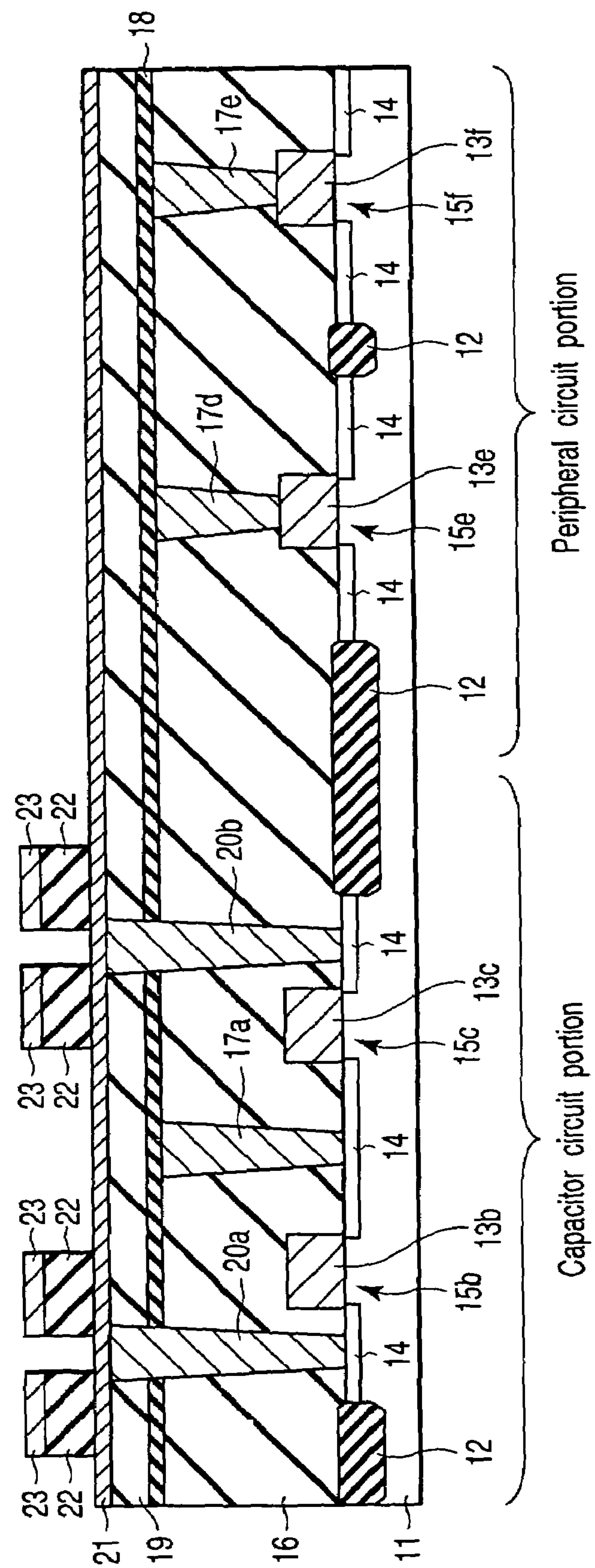

As shown in FIG. 36, a mask (not shown) is formed on the upper electrode 23 and patterned. Then, the upper electrode 23 and ferro-electric film 22 are patterned by using the patterned mask.

Figure 37:
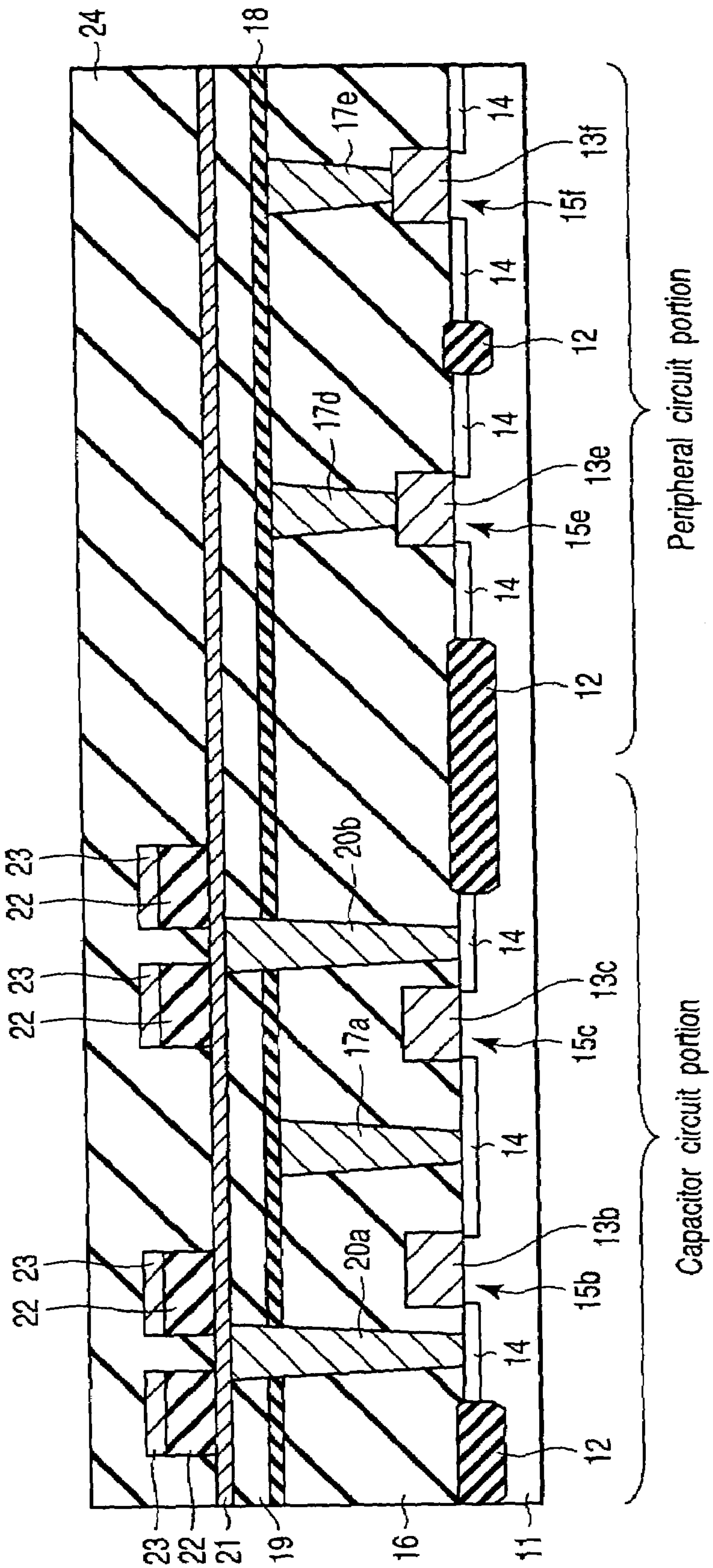

As shown in FIG. 37, the interlayer dielectric film 24 is formed on the upper electrodes 23 and lower electrode 21. For example, BPSG or P-TEOS is used as the material of the interlayer dielectric film 24.

Figure 38:
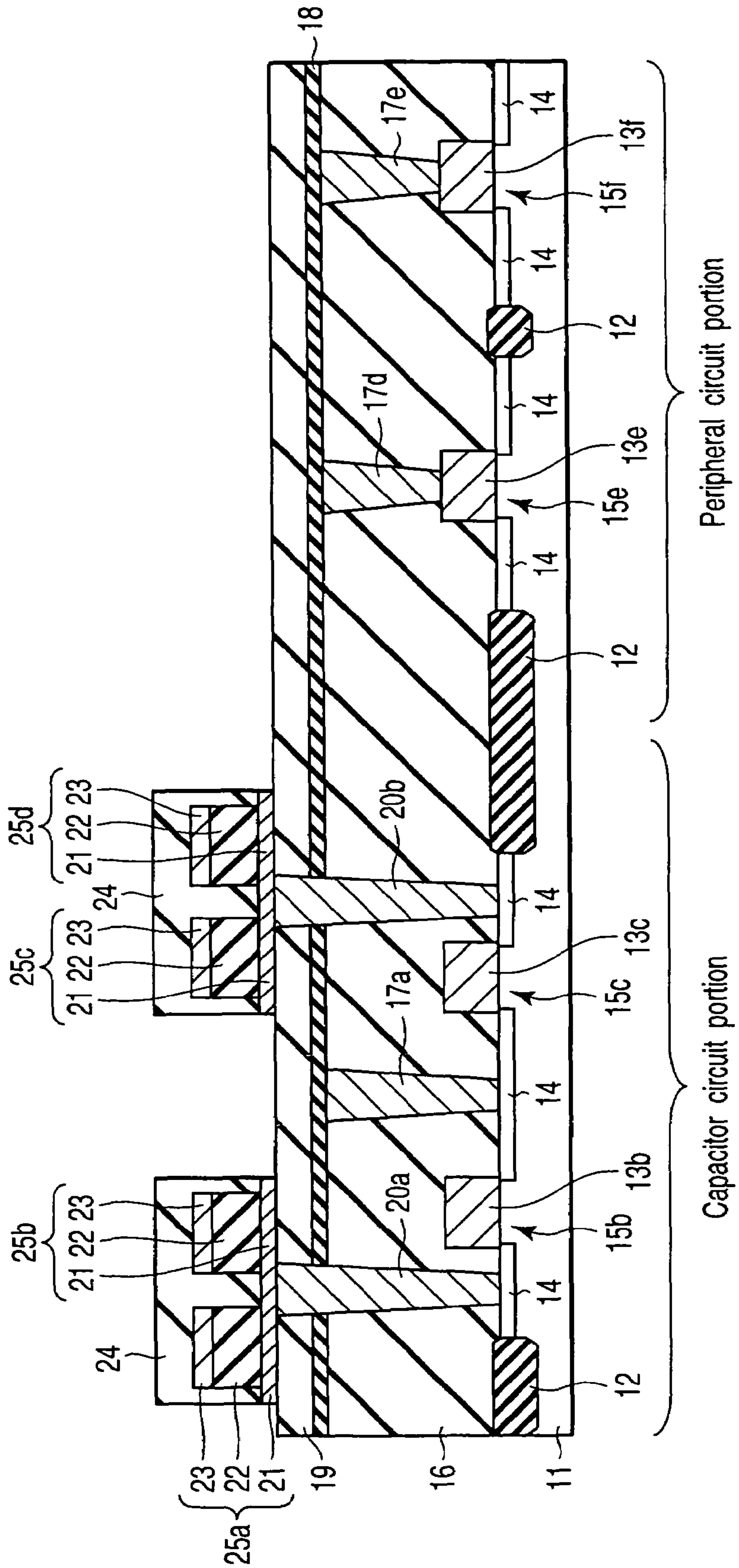

As shown in FIG. 38, a mask (not shown) is formed on the interlayer dielectric film 24 and patterned. Then, the interlayer dielectric film 24 is patterned by using the patterned mask. In addition, the lower electrode 21 is processed by using the patterned interlayer dielectric film 24 as a mask. With this process, the ferro-electric capacitors 25*a*, 25*b*, 25*c*, and 25*d* are formed.

Figure 39:
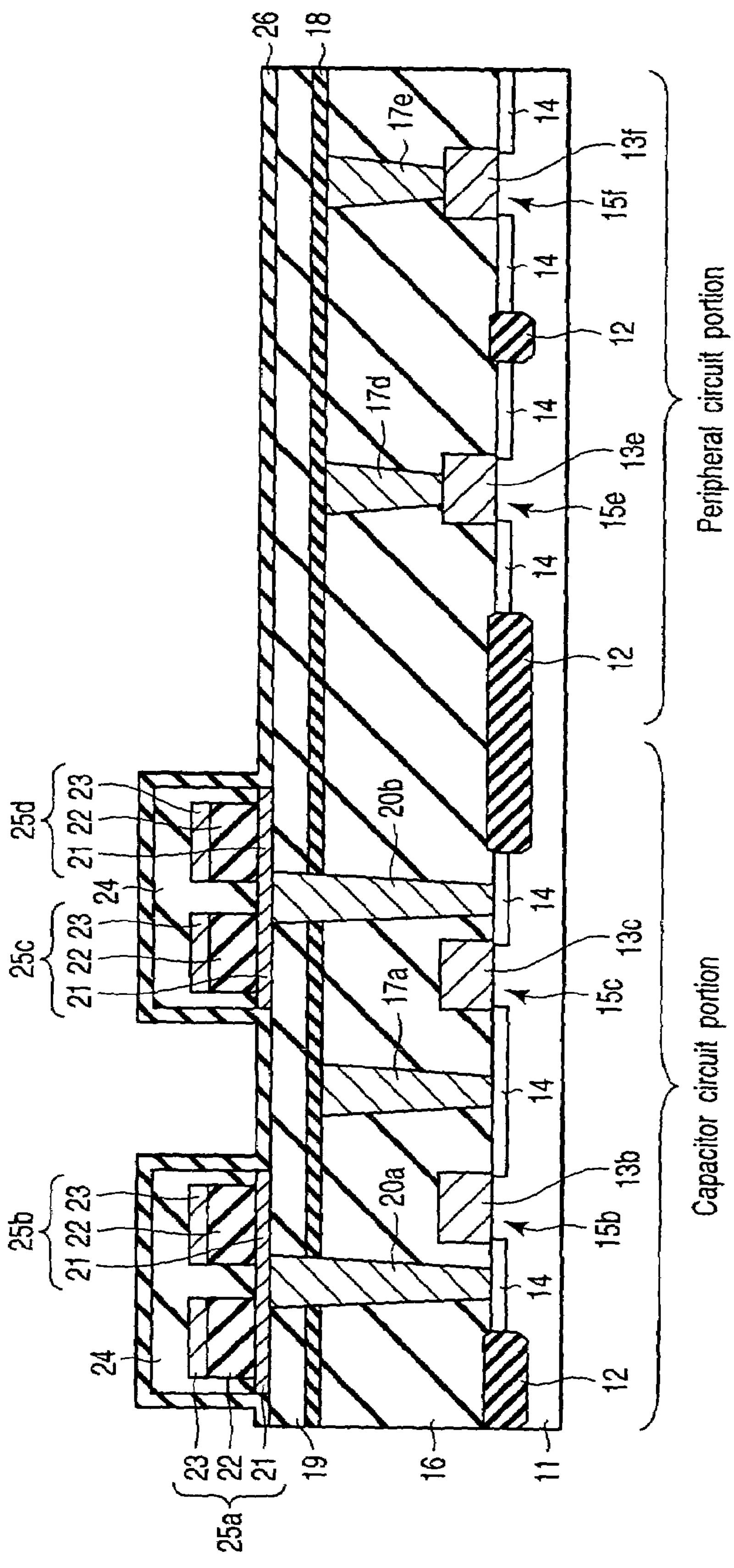

As shown in FIG. 39, the hydrogen and oxygen barrier film 26 is formed on the upper and side surfaces of the interlayer dielectric films 24, the side surfaces of the lower electrodes 21, and the upper surface of the interlayer dielectric film 19 by sputtering or CVD. Accordingly, the ferro-electric capacitors 25a, 25b, 25c, and 25d are covered with the hydrogen and oxygen barrier film 26. Examples of the material of the hydrogen and oxygen barrier film 26 are $Al_2O_3$, SiN, SiON, $TiO_2$, and PZT.

As shown in FIG. 40, the interlayer dielectric film 27 is deposited on the hydrogen and oxygen barrier film 26. The upper surface of the interlayer dielectric film 27 is planarized until the hydrogen and oxygen barrier film 26 is exposed. Examples of the material of the interlayer dielectric film 27 are P-TEOS, $O_3$-TEOS, SOG, $Al_2O_3$, SiN, and SiON.

Figure 41:
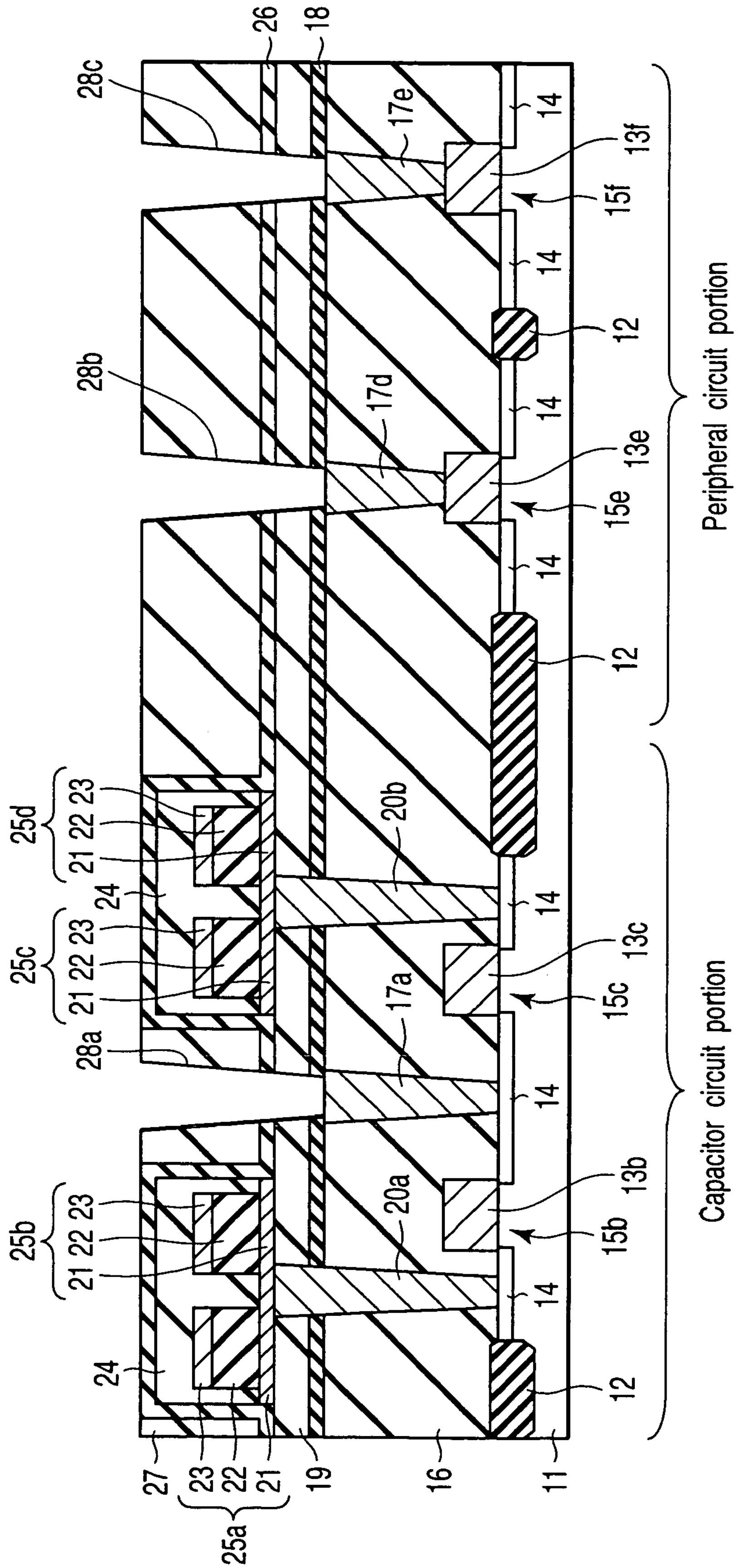

As shown in FIG. 41, contact holes 28a, 28b, and 28c extending through the interlayer dielectric films 19 and 27, hydrogen and oxygen barrier film 26, and oxygen barrier film 18 are formed.

Figure 42:
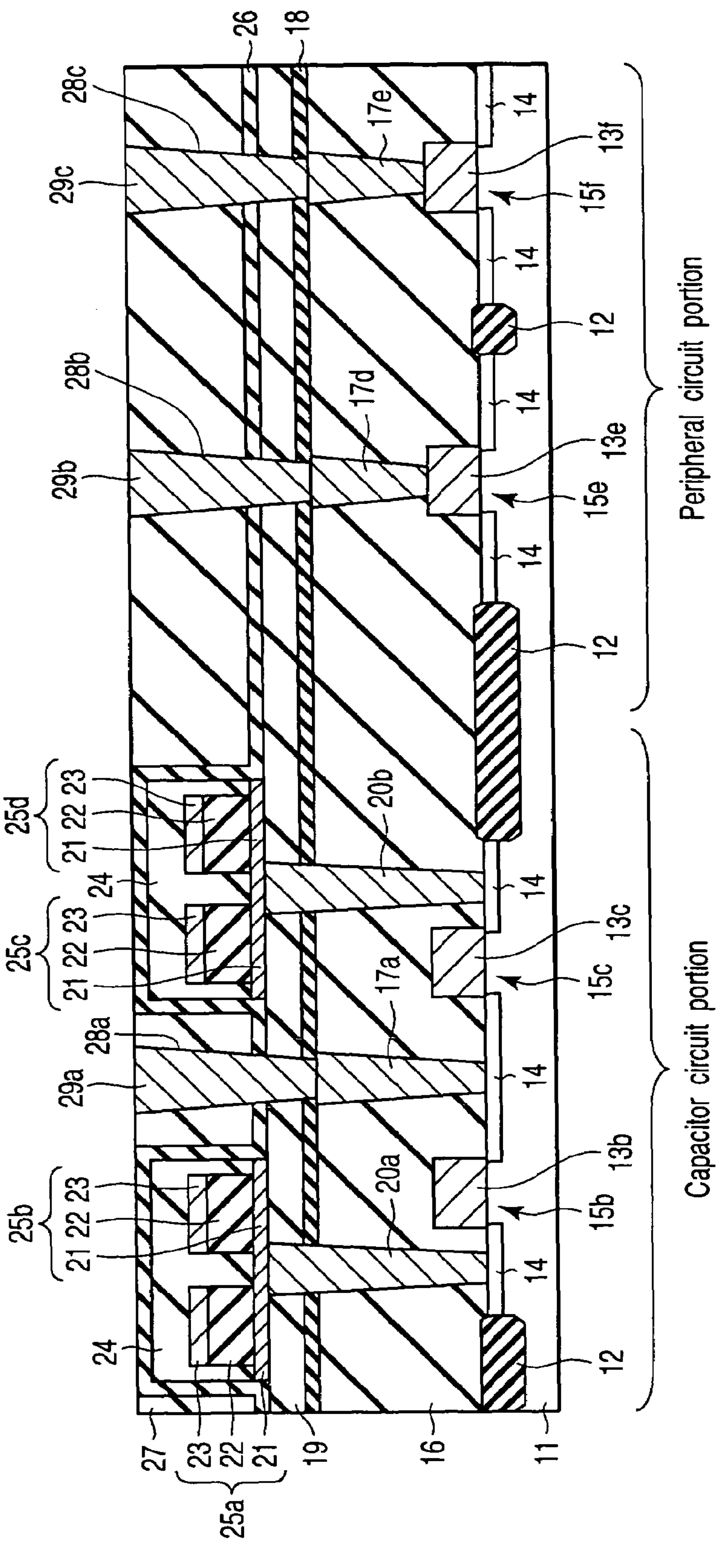

As shown in FIG. 42, the contact holes 28a, 28b, and 28c are filled with a metal material containing, e.g., Ti, TiN, or W. The upper surface of the metal material is planarized. With this process, the contacts 29a, 29b, and 29c connected to the contacts 17a, 17d, and 17e are formed. To fill the contact holes 28a, 28b, and 28c having a high aspect ratio, they are filled with the metal material of the contacts 29a, 29b, and 29c by using plasma CVD.

Figure 43:
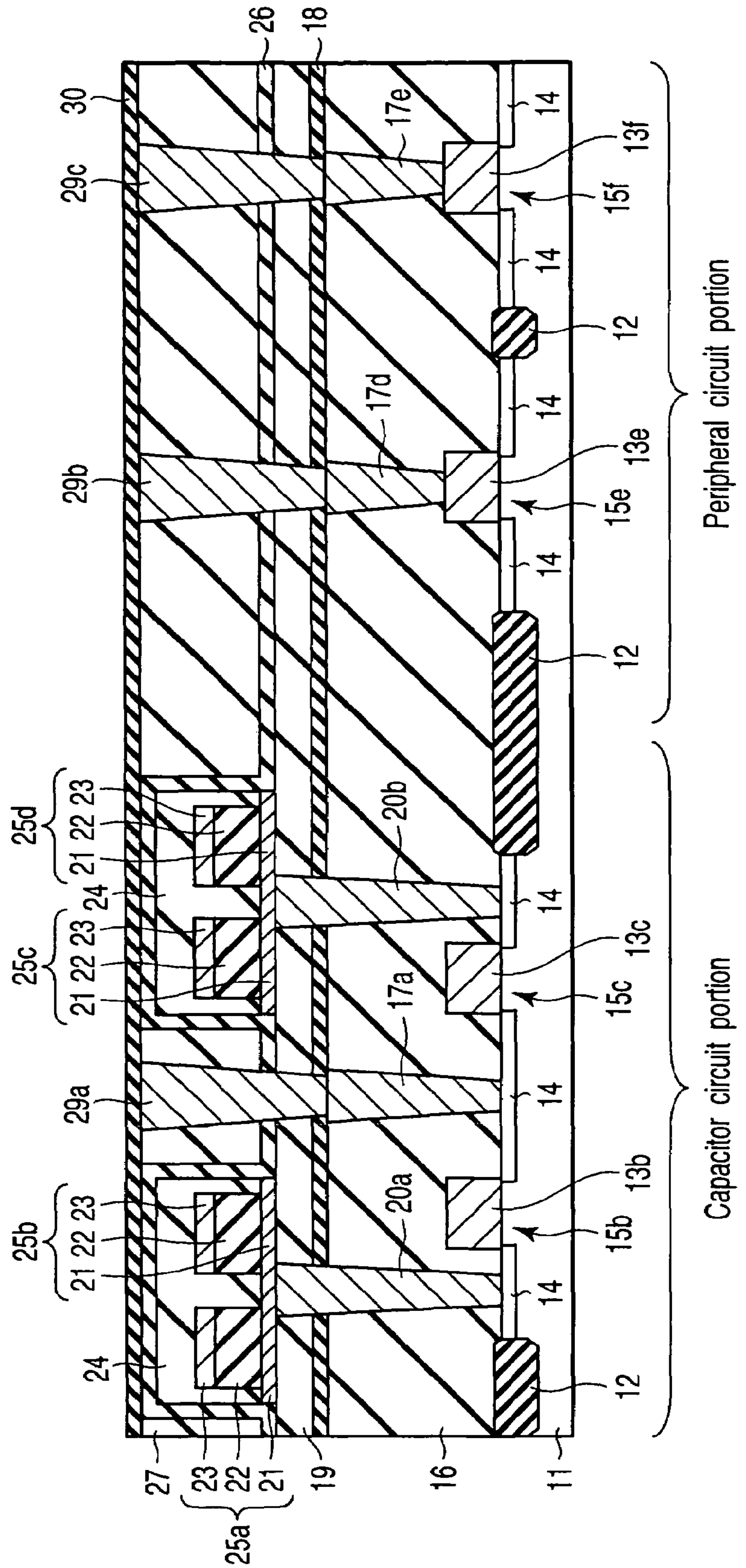

As shown in FIG. 43, the insulating oxygen barrier film 30 is formed on the contacts 29a, 29b, and 29c, hydrogen and oxygen barrier film 26, and interlayer dielectric film 27. For example, $Al_2O_3$, SiN, SiON, PZT, or $TiO_2$ is used as the material of the insulating oxygen barrier film 30.

Figure 44:
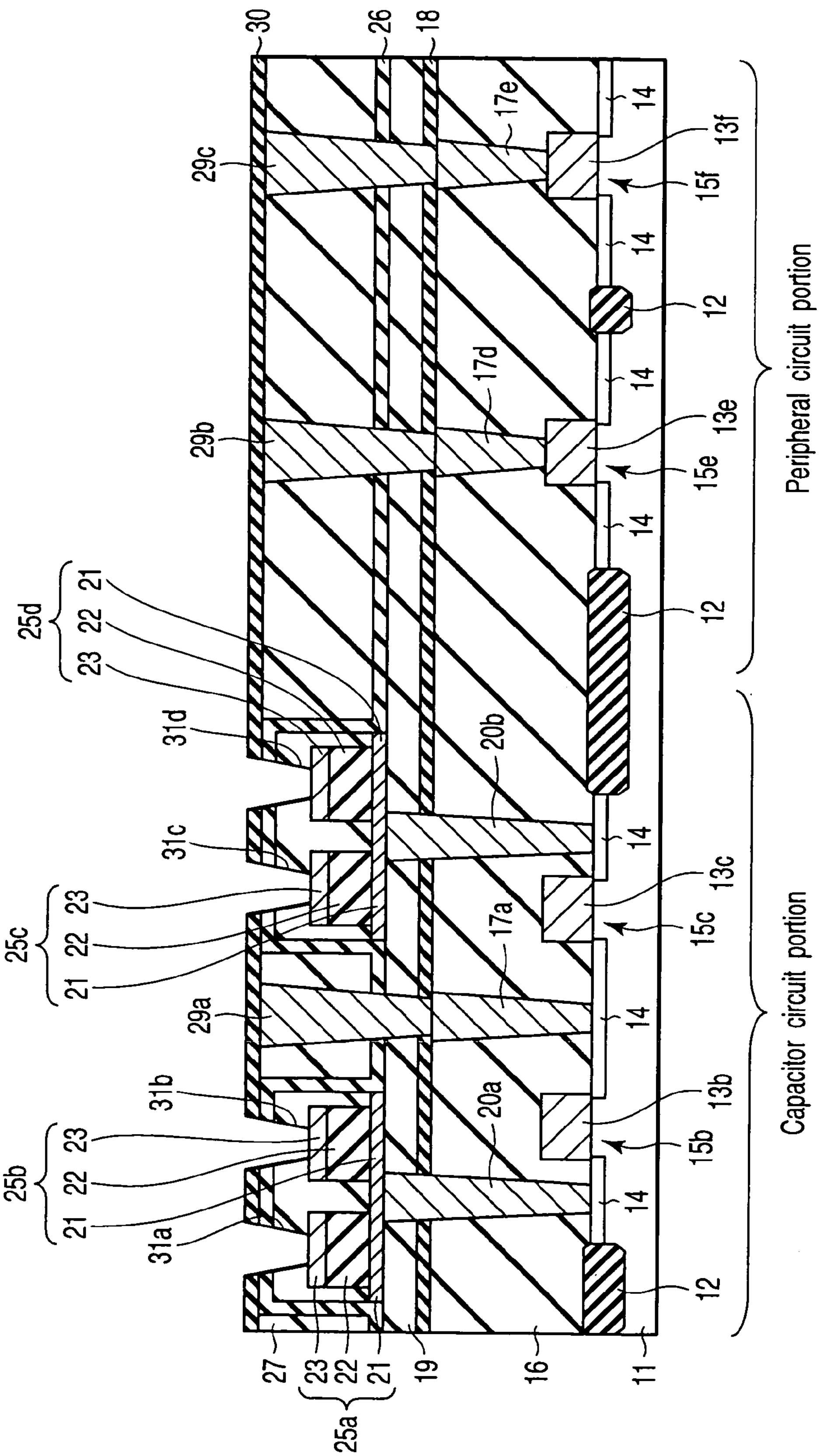

As shown in FIG. 44, contact holes 31a, 31b, 31c, and 31d extending through the oxygen barrier film 30, hydrogen and oxygen barrier film 26, and interlayer dielectric film 24 are formed. Next, high-temperature recovery annealing is executed, e.g., at 650° C. in an oxygen atmosphere for 1 hr.

Figure 45:
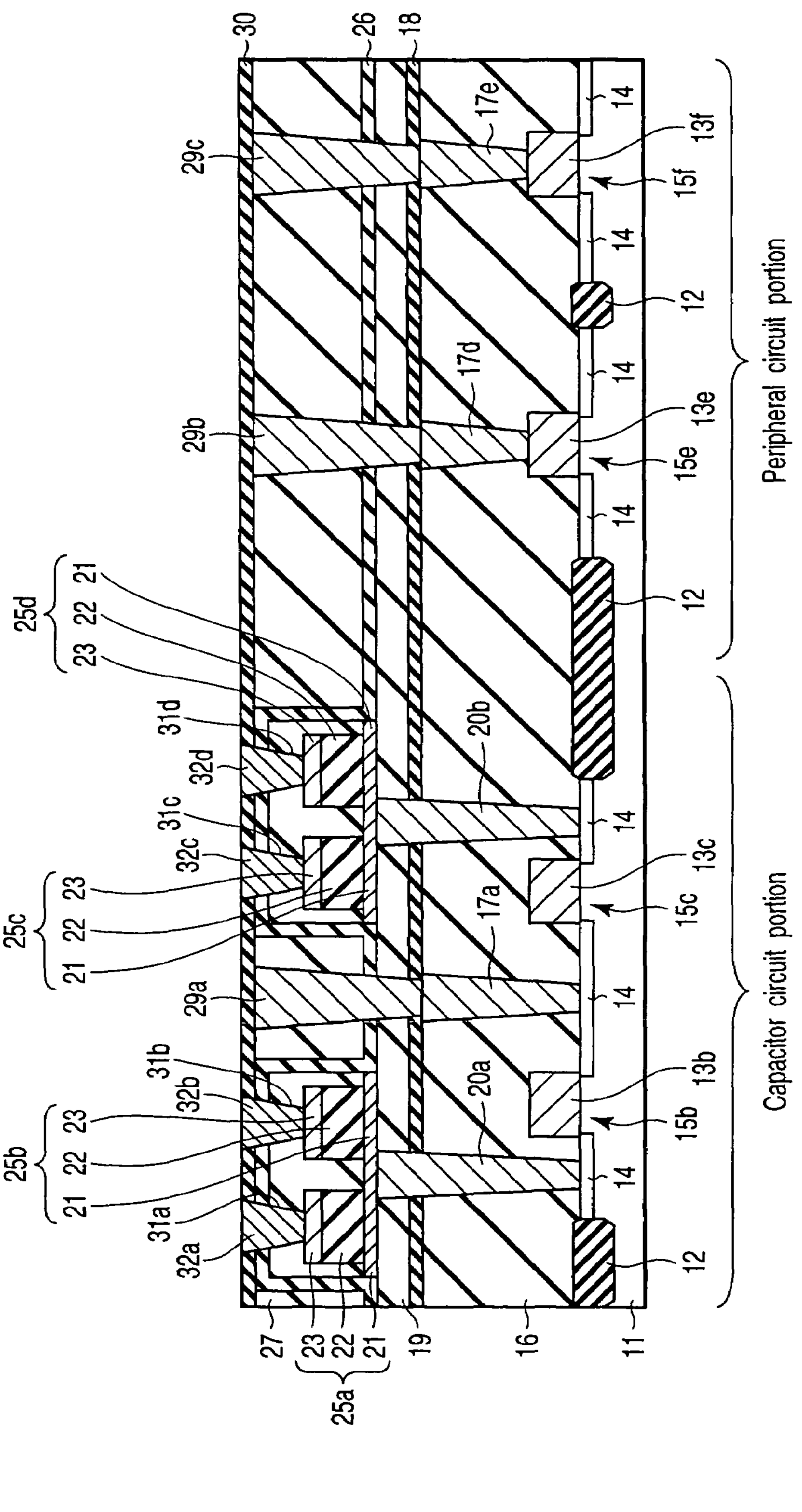

As shown in FIG. 45, the contact holes 31a, 31b, 31c, and 31d are filled with a metal material such as W, Cu, Al, or TiN. The upper surface of the metal material is planarized. Accordingly, the contacts 32a, 32b, 32c, and 32d connected to the upper electrodes 23 are formed.

Figure 46:
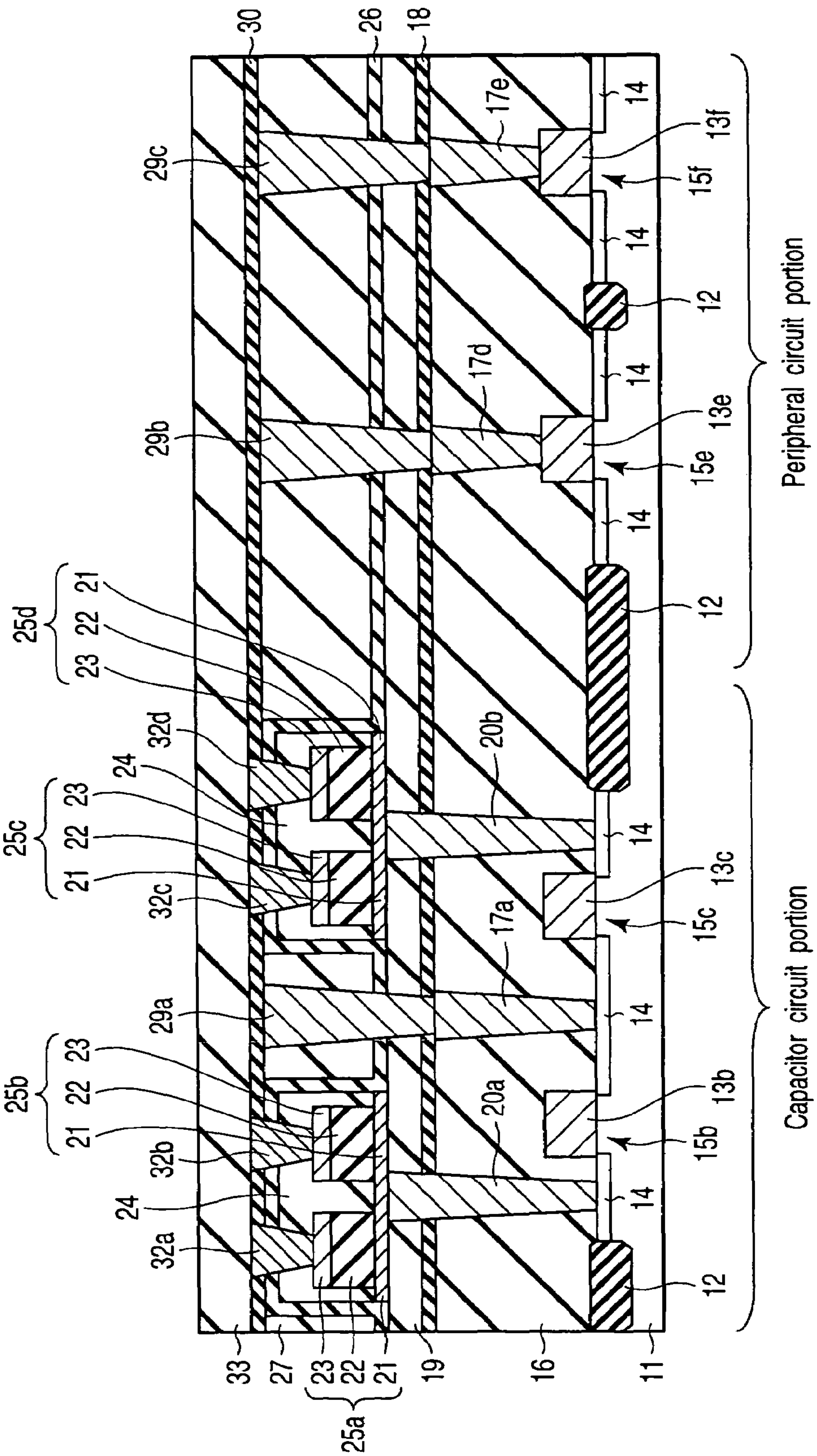

As shown in FIG. 46, an interlayer dielectric film 33 is formed on the contacts 32a, 32b, 32c, and 32d and oxygen barrier film 30.

As shown in FIG. 47, the interconnections 34a and 34d made of, e.g., W, Cu, Al, or TiN are formed. As a result, the upper electrodes 23 of the capacitors 25b and 25c and the source/drain diffusion layer 14 of the transistors 15b and 15c are electrically connected by using the interconnection 34a.

Figure 48:
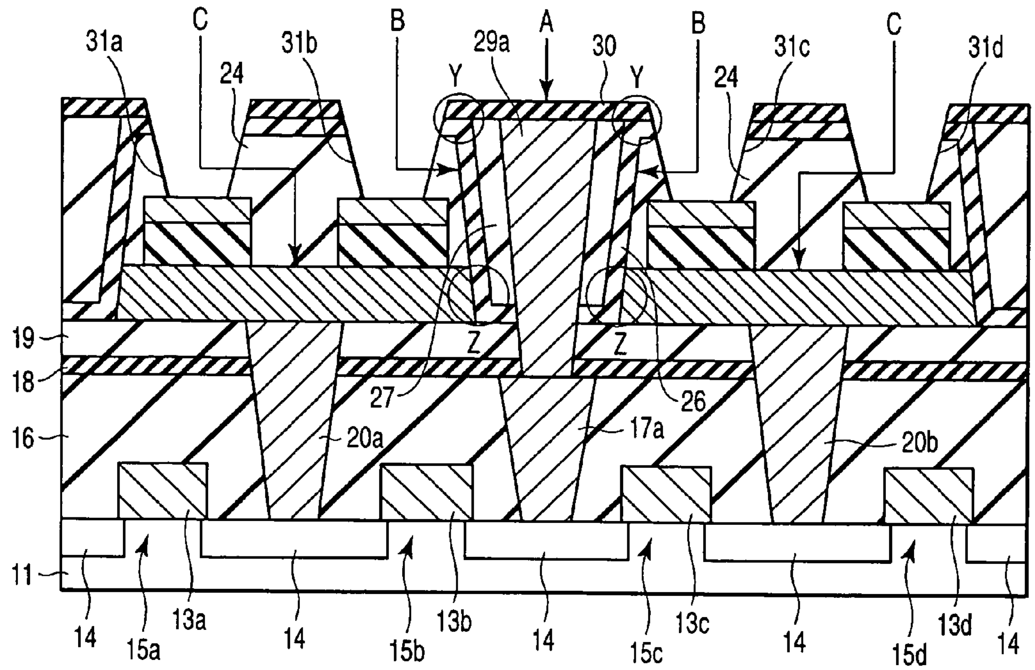
FIG. 48 is a sectional view showing the oxygen annealing step for the ferro-electric memory device according to the fourth embodiment of the present invention.

In the manufacturing method according to the fourth embodiment, after the contact holes 31a, 31b, 31c, and 31d are formed in the step shown in FIG. 44, high-temperature oxygen annealing is executed to recover the damage of the capacitors 25a, 25b, 25c, and 25d. At this time, as shown in FIG. 48, oxygen by annealing diffuses near the contact 29a through routes A, B, and C.

In the fourth embodiment, oxygen diffusion through the route A is prevented by the oxygen barrier film 30. Oxygen diffusion through the routes B is prevented by the hydrogen and oxygen barrier film 26. Oxygen diffusion through the routes C is prevented by the lower electrodes 21 having the oxygen diffusion preventing effect.

If a gap is present, at the portion Z, between the hydrogen and oxygen barrier film 26 and the oxygen lower electrode 21, oxygen diffuses from the gap to the contact 29a and oxidizes it. In addition, if a gap is present, at the portion Y, between the hydrogen and oxygen barrier film 26 and the oxygen barrier film 30, oxygen diffuses from the gap to the contact 29a and oxidizes it. To prevent the contact 29a from being oxidized by oxygen annealing, it is important that, in oxygen annealing, (a) the hydrogen and oxygen barrier film 26 is in contact with the lower electrode 21 at the portion Z, and (b) the hydrogen and oxygen barrier film 26 is in contact with the oxygen barrier film 30 at the portion Y.

Figure 49:
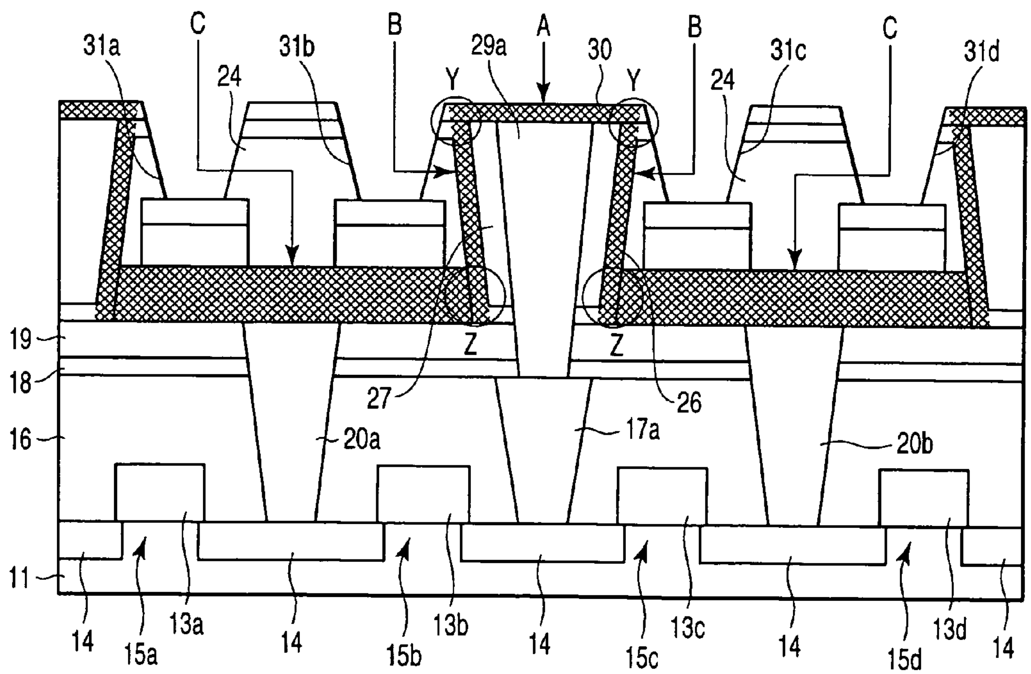
FIG. 49 is a sectional view showing preventing contacts from being oxidized in the oxygen annealing step for the ferro-electric memory device according to the fourth embodiment of the present invention.

According to the fourth embodiment, when high-temperature oxygen annealing is to be executed, the contact 29a made of, e.g., W can be prevented from being oxidized by high-temperature oxygen annealing because the contact 29a is surrounded by the lower electrodes 21 having the oxygen diffusion preventing effect, the oxygen barrier film 30, and the hydrogen and oxygen barrier film 26 (crosshatched portion in FIG. 49).

In addition, since the COP structure is formed, the lower electrodes 21 can easily be connected to the source/drain diffusion layers 14 by only the contacts 20a and 20b. Furthermore, the cell area can be reduced.

Fifth Embodiment

The fifth embodiment is a modification to the fourth embodiment. The oxygen barrier film under the ferro-electric capacitors is omitted.

FIG. 50 shows a ferro-electric memory device according to the fifth embodiment of the present invention. As shown in FIG. 50, the fifth embodiment is different from the fourth embodiment in that the oxygen barrier film 18 and interlayer dielectric film 19 under the ferro-electric capacitors 25a, 25b, 25c, and 25d are omitted. For this reason, a lower electrode 21 is in direct contact with an interlayer dielectric film 16. A hydrogen and oxygen barrier film 26 is in direct contact with a contact 17a and the interlayer dielectric film 16. The contact 17a connected to a contact 29a and contacts 17b and 17c connected to the lower electrodes 21 are simultaneously formed by the same material and have the same depth.

In the fifth embodiment, an oxygen barrier film 30 is formed on the contact 29a. The lower electrodes 21 having an oxygen diffusion preventing effect are formed on the contacts 17b and 17c. The hydrogen and oxygen barrier film 26 is formed between a capacitor 25b and the contact 29a and between a capacitor 25c and the contact 29a. The hydrogen and oxygen barrier film 26 comes into contact with the edge portions of the lower electrodes 21 at portions Z, contacts 32b and 32c and an interconnection 34a at portions Y, and the oxygen barrier film 30 on an interlayer dielectric film 24.

Figure 51:
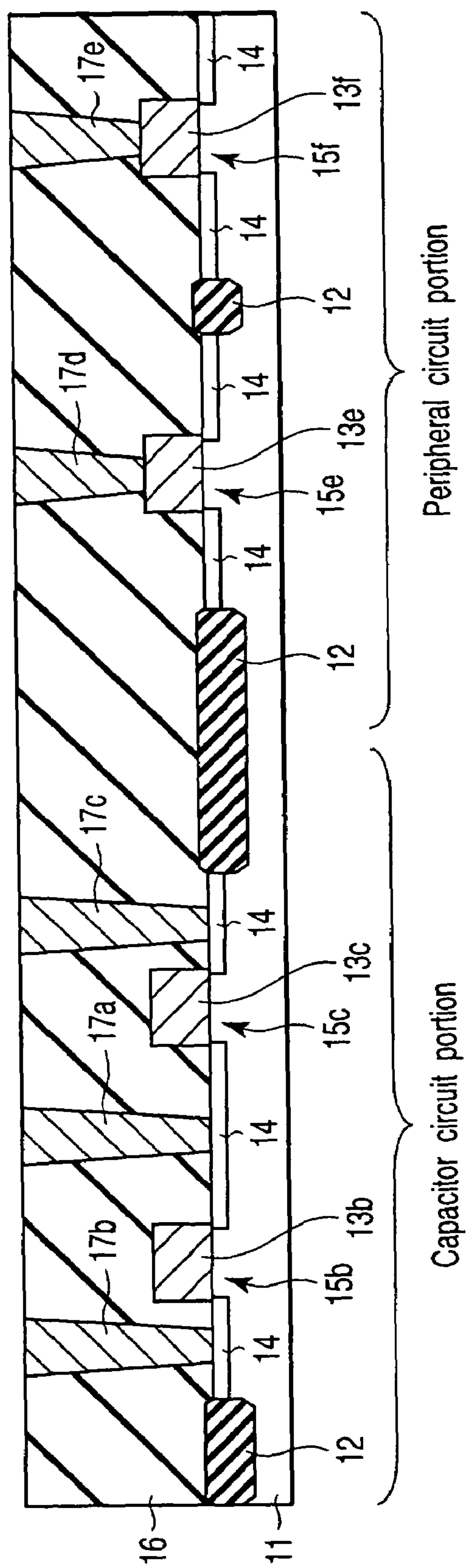
FIGS. 51 and 52 are sectional views showing steps in manufacturing the ferro-electric memory device according to the fifth embodiment of the present invention.
Figure 52:
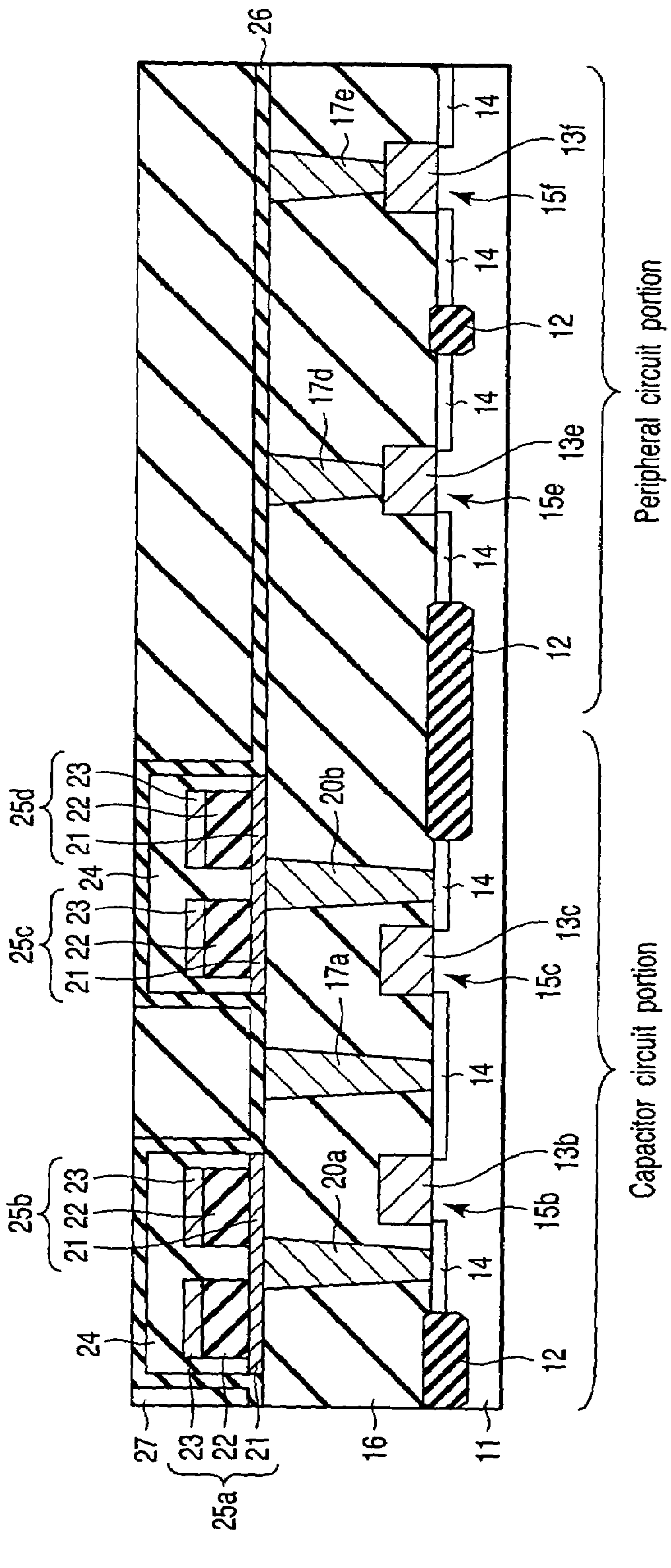

FIGS. 51 and 52 are sectional views showing steps in manufacturing the ferro-electric memory device according to the fifth embodiment of the present invention. A method of manufacturing the ferro-electric memory device according to the fifth embodiment will be described below.

First, as shown in FIG. 51, an STI region 12 for element isolation is formed in a silicon substrate 11. After that, transistors 15b and 15c in the capacitor circuit portion and transistors 15e and 15f in the peripheral circuit portion are formed. The interlayer dielectric film 16 is deposited on the silicon substrate 11 and transistors 15b, 15c, 15e, and 15f. The upper surface of the interlayer dielectric film 16 is planarized by, e.g., CMP. Examples of the material of the interlayer dielectric film 16 are BPSG and P-TEOS. The contacts 17a, 17b, and 17c connected to source/drain diffusion layers 14 and contacts 17d and 17e connected to gate electrodes 13e and 13f are formed in the interlayer dielectric film 16. For example, W or doped polysilicon is used as the material of the contacts 17a, 17b, 17c, 17d, and 17e.

The lower electrode 21, ferro-electric film 22, and upper electrode 23 are sequentially deposited on the contacts 17*a*, 17*b*, 17*c*, 17*d*, and 17*e* and the interlayer dielectric film 16. After that, the steps shown in FIGS. 36 to 40 in the fourth embodiment are executed. As a result, as shown in FIG. 52, the hydrogen and oxygen barrier film 26 comes into direct contact with the contact 17*a*.

After that, the steps shown in FIGS. 41 to 47 in the fourth embodiment are executed to form a ferro-electric memory device.

Figure 53:
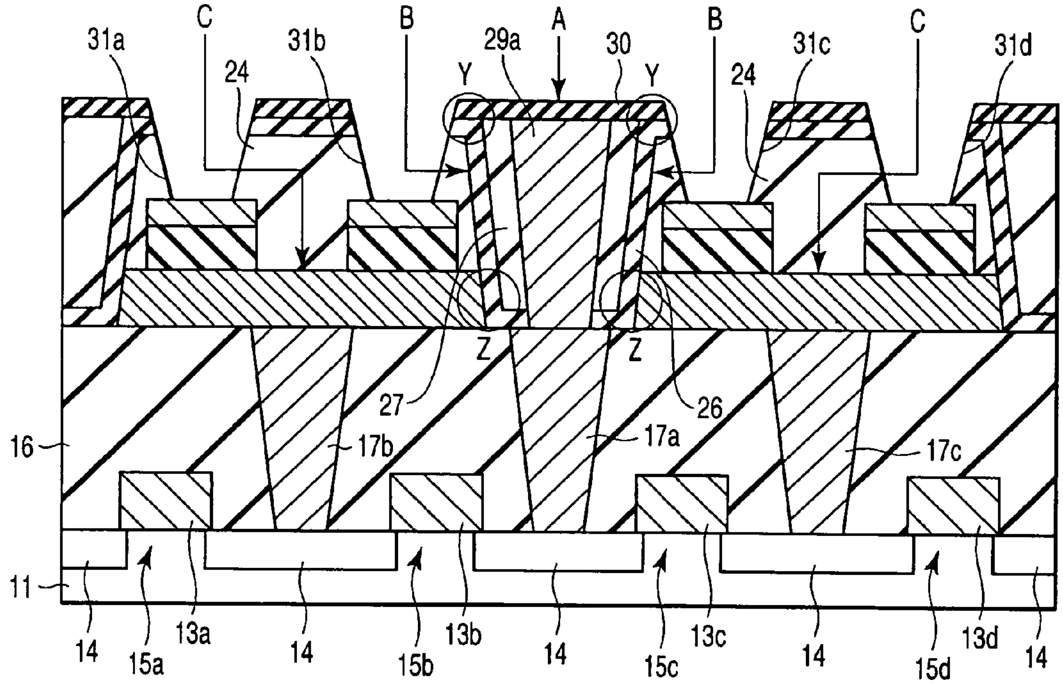
FIG. 53 is a sectional view showing the oxygen annealing step for the ferro-electric memory device according to the fifth embodiment of the present invention.

In the fifth embodiment, to prevent oxygen from diffusing through routes A, B, and C to oxidize the contact 29*a*, as shown in FIG. 53, it is important that, in oxygen annealing, (a) the hydrogen and oxygen barrier film 26 is in contact with the lower electrode 21 at the portion Z, and (b) the hydrogen and oxygen barrier film 26 is in contact with the oxygen barrier film 30 at the portion Y, as in the fourth embodiment.

Figure 54:
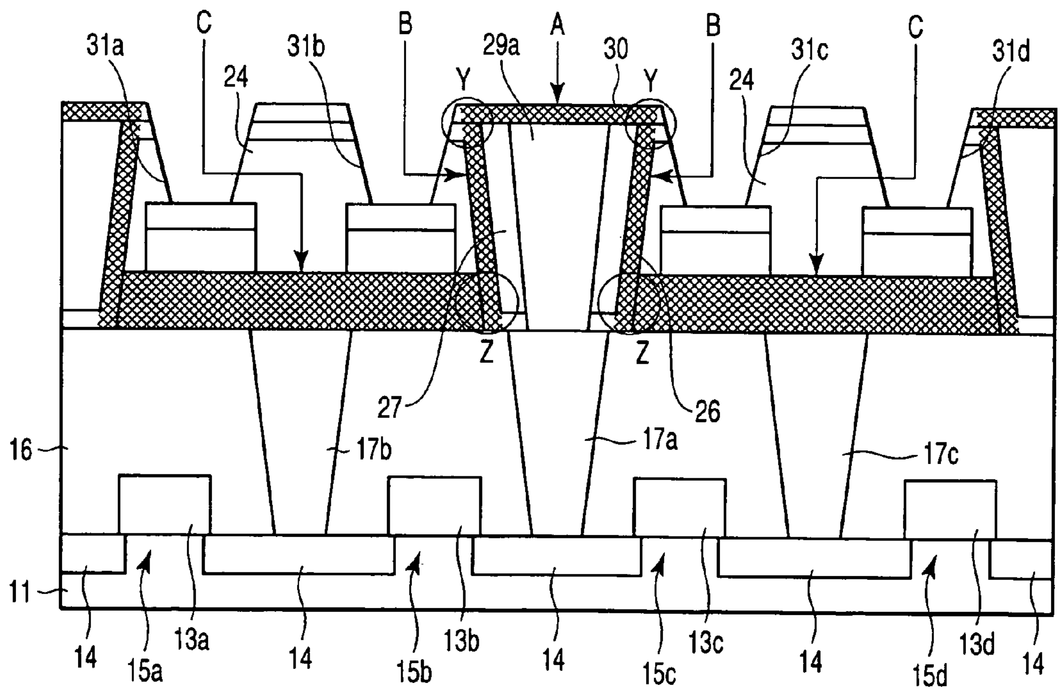
FIG. 54 is a sectional view showing preventing contacts from being oxidized in the oxygen annealing step for the ferro-electric memory device according to the fifth embodiment of the present invention.

According to the fifth embodiment, as in the fourth embodiment, when high-temperature oxygen annealing is to be executed, the contact 29*a* made of, e.g., W can be prevented from being oxidized by high-temperature oxygen annealing because the contact 29*a* is surrounded by the lower electrodes 21 having the oxygen diffusion preventing effect, the oxygen barrier film 30, and the hydrogen and oxygen barrier film 26 (crosshatched portion in FIG. 54).

In addition, since the COP structure is formed, the cell area can be reduced, as in the fourth embodiment.

Furthermore, in the fifth embodiment, the oxygen barrier film 18 and interlayer dielectric film 19 in the fourth embodiment are omitted. For this reason, the aspect ratio of the contact 29*a* can be decreased by an amount corresponding to the thickness of the oxygen barrier film 18 and interlayer dielectric film 19. In addition, since the contacts 17*a*, 17*b*, and 17*c* can simultaneously be formed at once, the cost can be reduced.

Sixth Embodiment

The sixth embodiment is a modification to the fifth embodiment. Contacts that connect the upper electrodes of capacitors to the sources/drains of transistors are formed at once.

Figure 55:
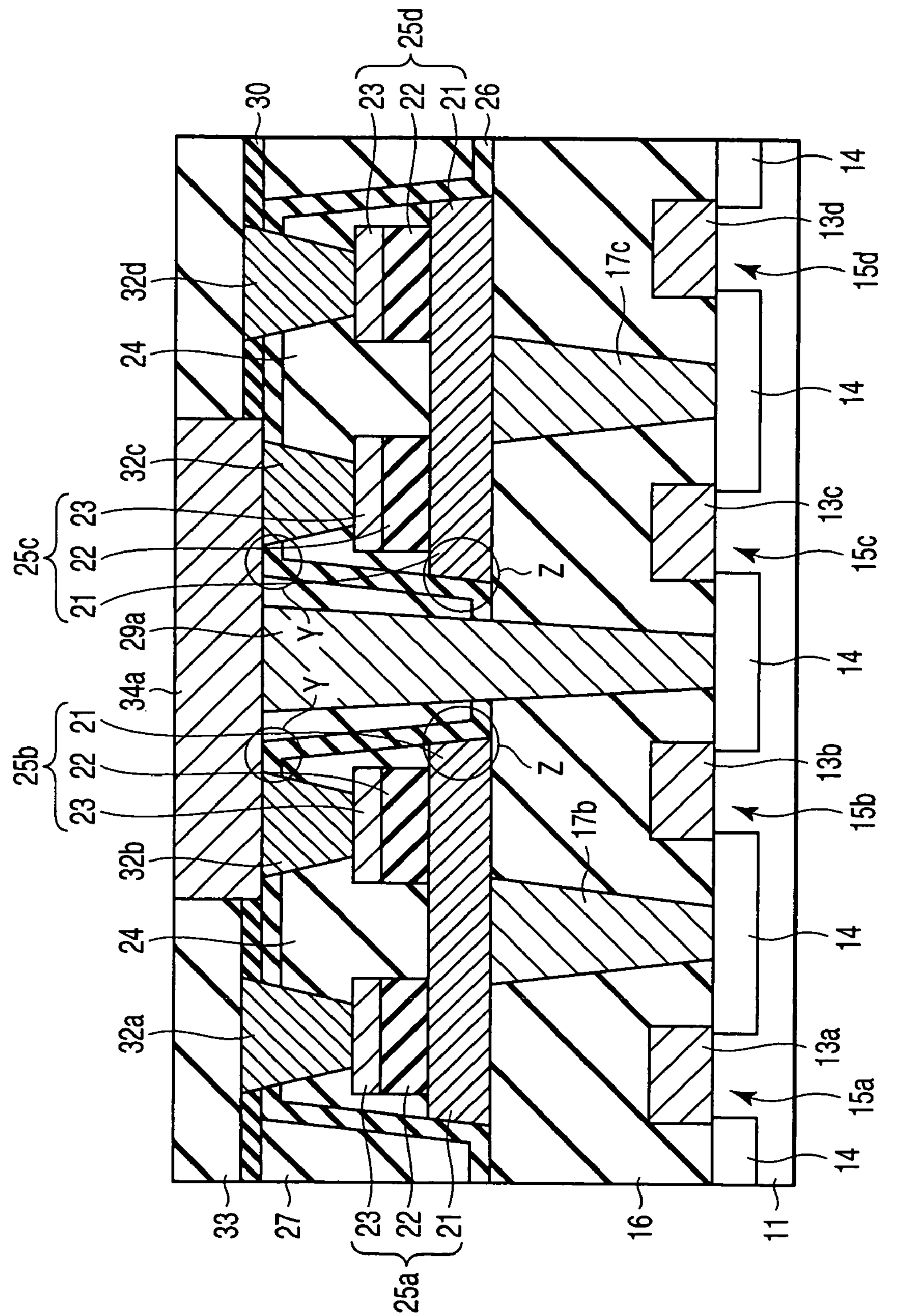
FIG. 55 is a sectional view showing a ferro-electric memory device according to the sixth embodiment of the present invention.

FIG. 55 shows a ferro-electric memory device according to the sixth embodiment of the present invention. As shown in FIG. 55, in the sixth embodiment, the contacts 29*a* and 17*a* of the fifth embodiment are formed at once as one contact 29*a*. The contact 29*a* is directly connected to a source/drain diffusion layer 14.

In the sixth embodiment, an oxygen barrier film 30 is formed on the contact 29*a*. Lower electrodes 21 having an oxygen diffusion preventing effect are formed on contacts 17*b* and 17*c*. A hydrogen and oxygen barrier film 26 is formed between a capacitor 25*b* and the contact 29*a* and between a capacitor 25*c* and the contact 29*a*. The hydrogen and oxygen barrier film 26 comes into contact with the edge portions of the lower electrodes 21 at portions Z, contacts 32*b* and 32*c* and an interconnection 34*a* at portions Y, and the oxygen barrier film 30 on an interlayer dielectric film 24.

Figure 56:
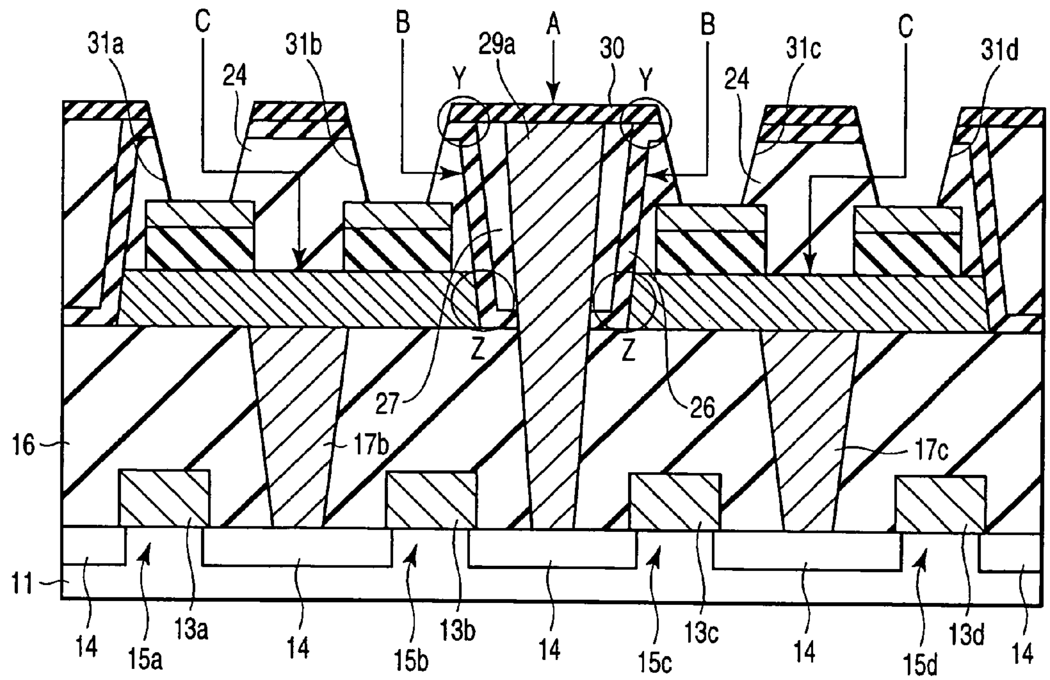
FIG. 56 is a sectional view showing the oxygen annealing step for the ferro-electric memory device according to the sixth embodiment of the present invention.

In the sixth embodiment, to prevent oxygen from diffusing through routes A, B, and C to oxidize the contact 29*a*, as shown in FIG. 56, it is important that, in oxygen annealing, (a) the hydrogen and oxygen barrier film 26 is in contact with the lower electrode 21 at the portion Z, and (b) the hydrogen and oxygen barrier film 26 is in contact with the oxygen barrier film 30 at the portion Y, as in the fourth embodiment.

Figure 57:
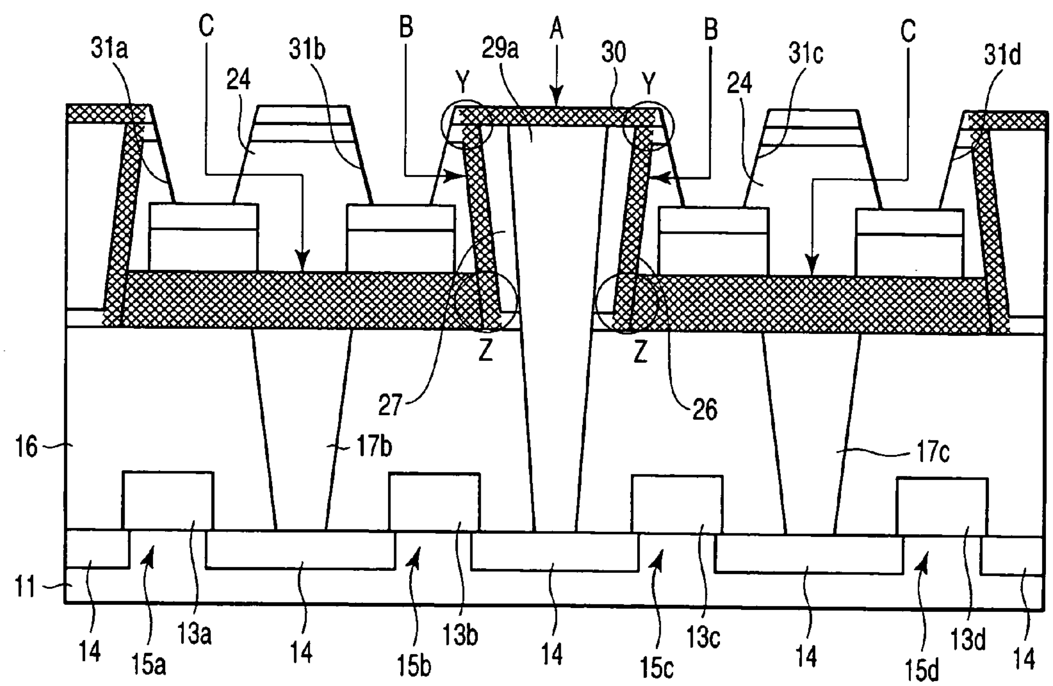
FIG. 57 is a sectional view showing preventing contacts from being oxidized in the oxygen annealing step for the ferro-electric memory device according to the sixth embodiment of the present invention.

According to the sixth embodiment, as in the fourth embodiment, when high-temperature oxygen annealing is to be executed, the contact 29*a* made of, e.g., W can be prevented from being oxidized by high-temperature oxygen annealing because the contact 29*a* is surrounded by the lower electrodes 21 having the oxygen diffusion preventing effect, the oxygen barrier film 30, and the hydrogen and oxygen barrier film 26 (crosshatched portion in FIG. 57).

In addition, since the COP structure is formed, the cell area can be reduced, as in the fourth embodiment.

Furthermore, as in the fifth embodiment, the oxygen barrier film 18 and interlayer dielectric film 19 in the fourth embodiment are omitted. For this reason, the aspect ratio of the contact 29*a* can be decreased by an amount corresponding to the thickness of the oxygen barrier film 18 and interlayer dielectric film 19.

The contact 29*a* which connects the interconnection 34*a* to the source/drain diffusion layer 14 is formed at once as one structure. As compared to the case wherein the contact at this portion is not formed at once as one structure, any decrease in yield due to misalignment can be suppressed. Hence, the cost can be reduced.

In the sixth embodiment, the structure of the fourth embodiment may be deformed such that the contacts that connect the upper electrodes of capacitors to the sources/drains of transistors are formed at once.

Seventh Embodiment

The seventh embodiment is a modification to the fourth embodiment. A stopper film is formed on the upper electrode of a capacitor.

Figure 58:
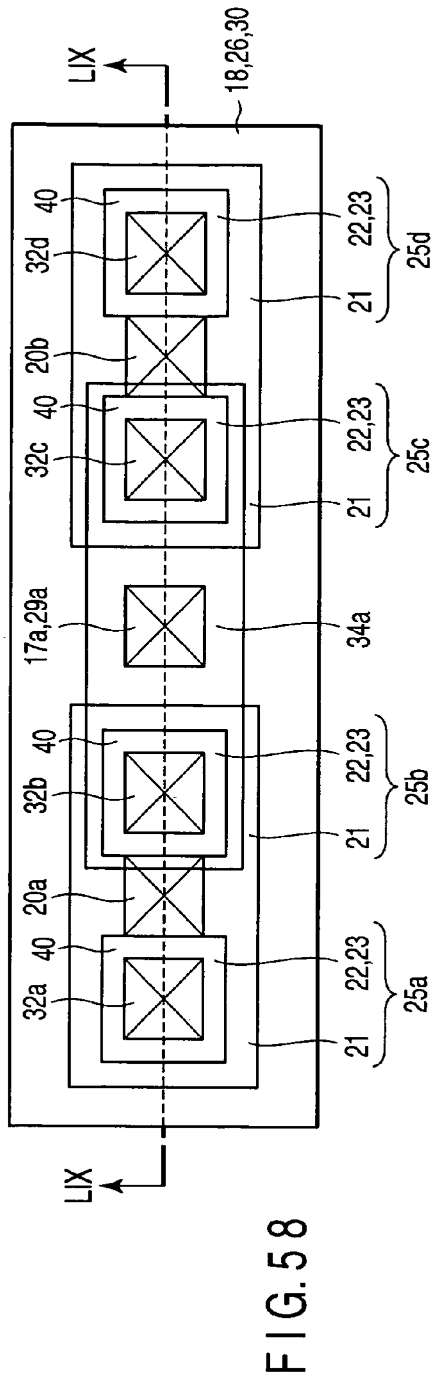
FIG. 58 is a plan view showing a ferro-electric memory device according to the seventh embodiment of the present invention.
Figure 59:
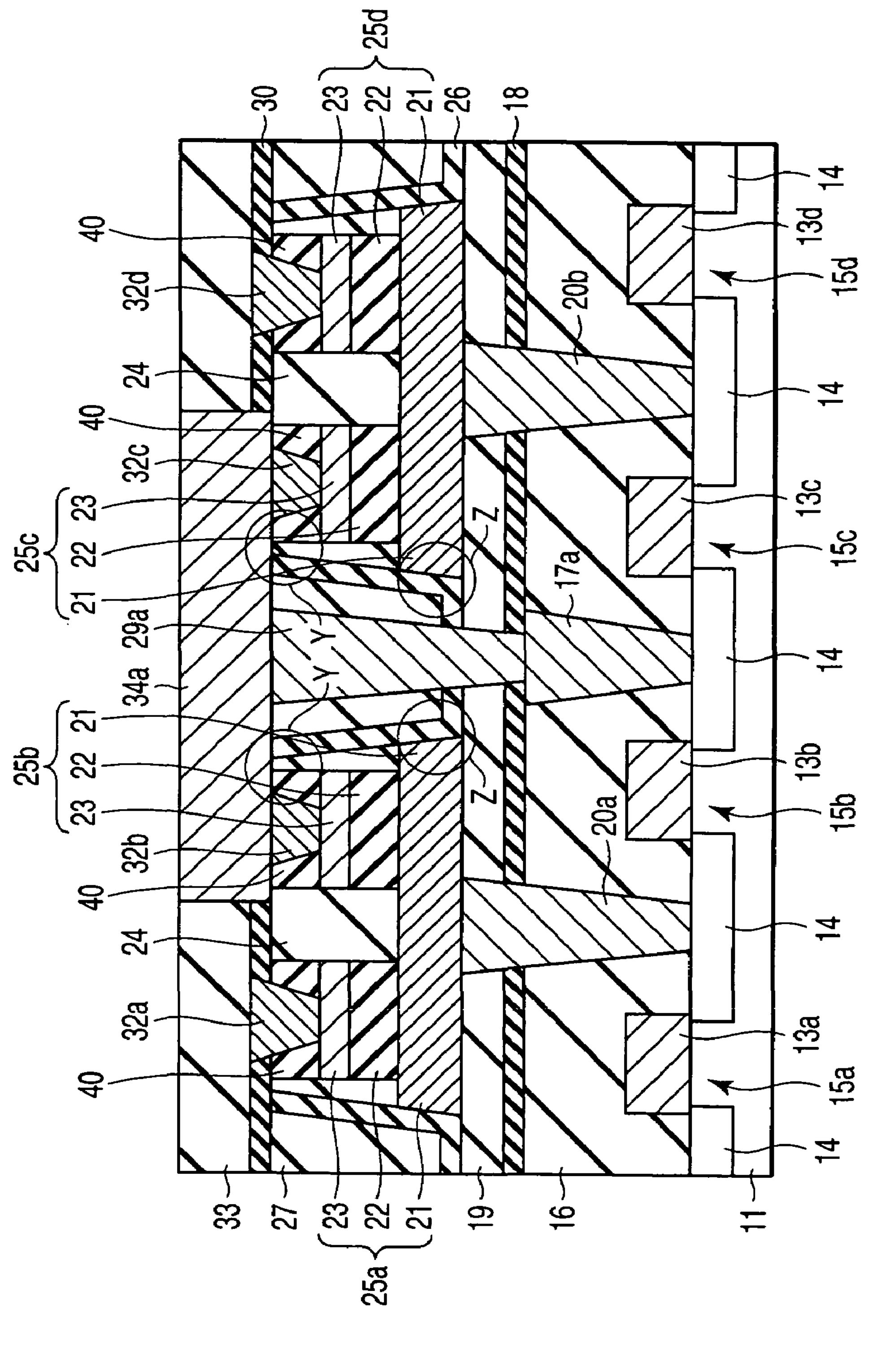
FIG. 59 is a sectional view of the ferro-electric memory device taken along a line LIX—LIX in FIG. 58.

FIGS. 58 and 59 show a ferro-electric memory device according to the seventh embodiment of the present invention. As shown in FIGS. 58 and 59, the seventh embodiment is different from the fourth embodiment in that stopper films 40 are formed around contacts 32*a*, 32*b*, 32*c*, and 32*d* on upper electrodes 23. The stopper films 40 function as a stopper in planarizing an interlayer dielectric film 27.

In the structure according to the seventh embodiment, an insulating oxygen barrier film 18, insulating hydrogen and oxygen barrier film 26, insulating oxygen barrier film 30, and conductive lower electrodes 21 made of a material having an oxygen diffusion preventing effect are formed as films that prevent diffusion of oxygen.

The oxygen barrier film 18 is formed on a contact 17*a* and an interlayer dielectric film 16. The hydrogen and oxygen barrier film 26 is formed on the upper and side surfaces of an interlayer dielectric film 24, the side surfaces of the lower electrodes 21, and the upper surface of an interlayer dielectric film 19. The oxygen barrier film 30 is formed on the hydrogen and oxygen barrier film 26, an interlayer dielectric film 27, and the stopper film 40. The lower electrodes 21 are formed on contacts 20*a* and 20*b*. The edge portions of each lower electrode 21 project from ferro-electric films 22 and upper electrodes 23.

As described above, the oxygen barrier film 18 is formed on the contact 17*a*. The oxygen barrier film 30 is formed on a contact 29*a*. The lower electrodes 21 having the oxygen diffusion preventing effect are formed on the contacts 20*a* and 20*b*. The hydrogen and oxygen barrier film 26 is formed between a capacitor 25*b* and the contact 29*a* and between a capacitor 25*c* and the contact 29*a*. The hydrogen and oxygen barrier film 26 comes into contact with the edge portions of the lower electrodes 21 at portions Z and an interconnection 34*a* at portions Y.

The stopper films 40 may be films having an oxygen diffusion preventing effect. In this case, the stopper films 40 at the capacitors 25*b* and 25*c* are brought into contact with the upper electrodes 23 and interconnection 34*a*. The stopper films 40 at the capacitors 25*a* and 25*d* are brought into contact with the upper electrodes 23 and oxygen barrier film 30.

FIGS. 60 to 71 are sectional views showing steps in manufacturing the ferro-electric memory device according to the seventh embodiment of the present invention. A method of manufacturing the ferro-electric memory device according to the seventh embodiment will be described below.

First, the steps shown in FIGS. 33 to 35 in the fourth embodiment are executed to sequentially deposit the lower electrode 21, ferro-electric film 22, and upper electrode 23.

Figure 60:
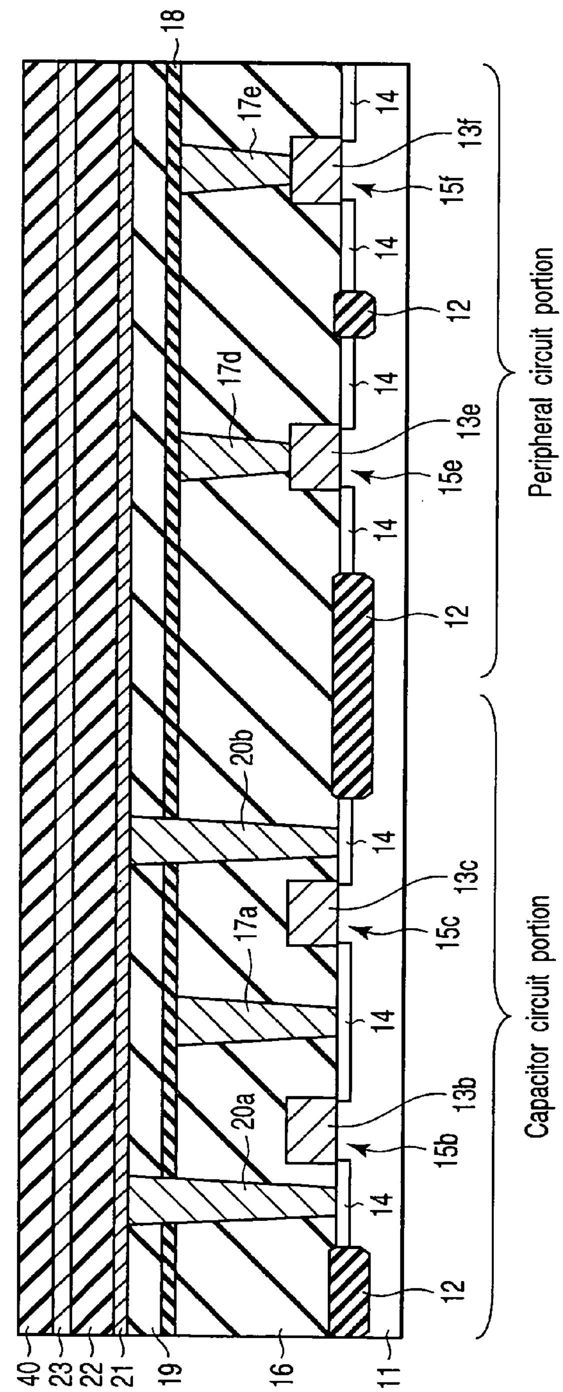

As shown in FIG. 60, the stopper film 40 is deposited on the upper electrode 23. Examples of the material of the stopper film 40 are $Al_2O_3$, SiN, SiON, $TiO_2$, TiN, and PZT.

Figure 61:
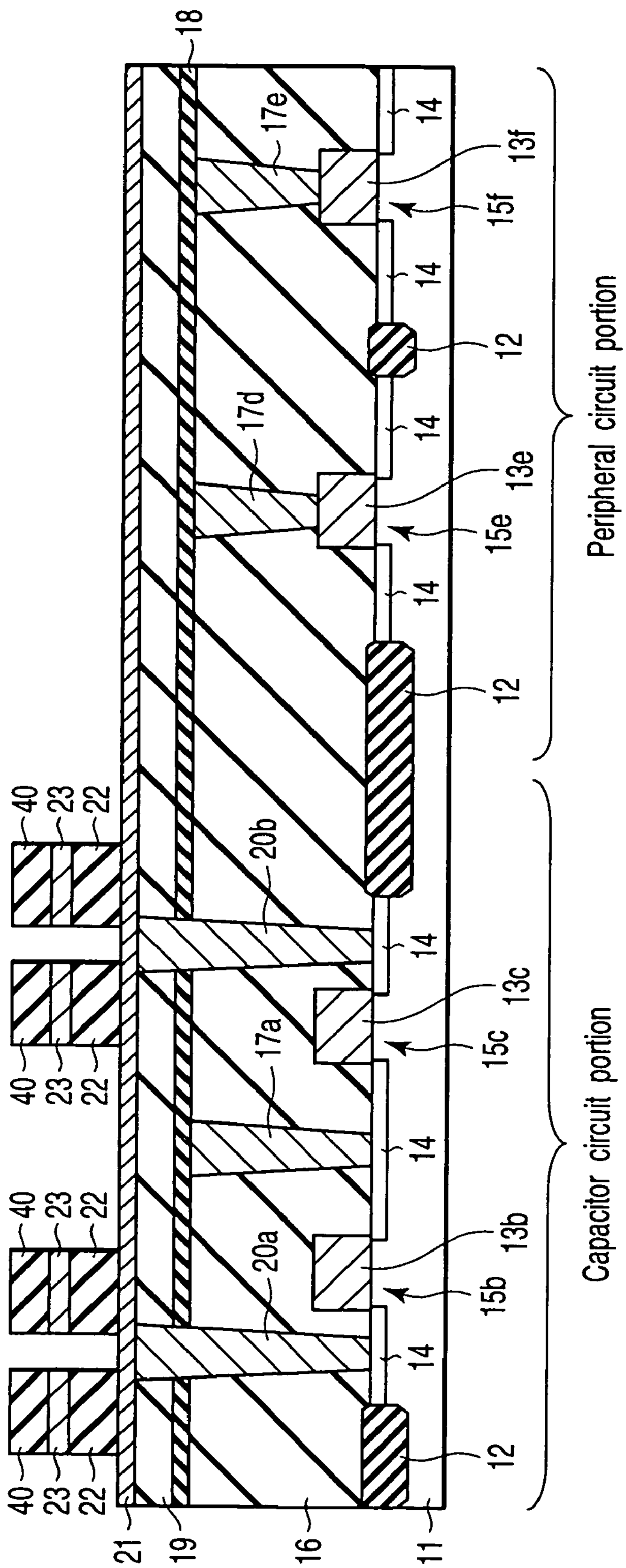

As shown in FIG. 61, a mask (not shown) is formed on the stopper film 40 and patterned. Then, the stopper film 40, upper electrode 23, and ferro-electric film 22 are patterned by using the patterned mask.

As shown in FIG. 62, the interlayer dielectric film 24 is formed on the stopper films 40 and lower electrode 21. For example, BPSG or P-TEOS is used as the material of the interlayer dielectric film 24.

Figure 63:
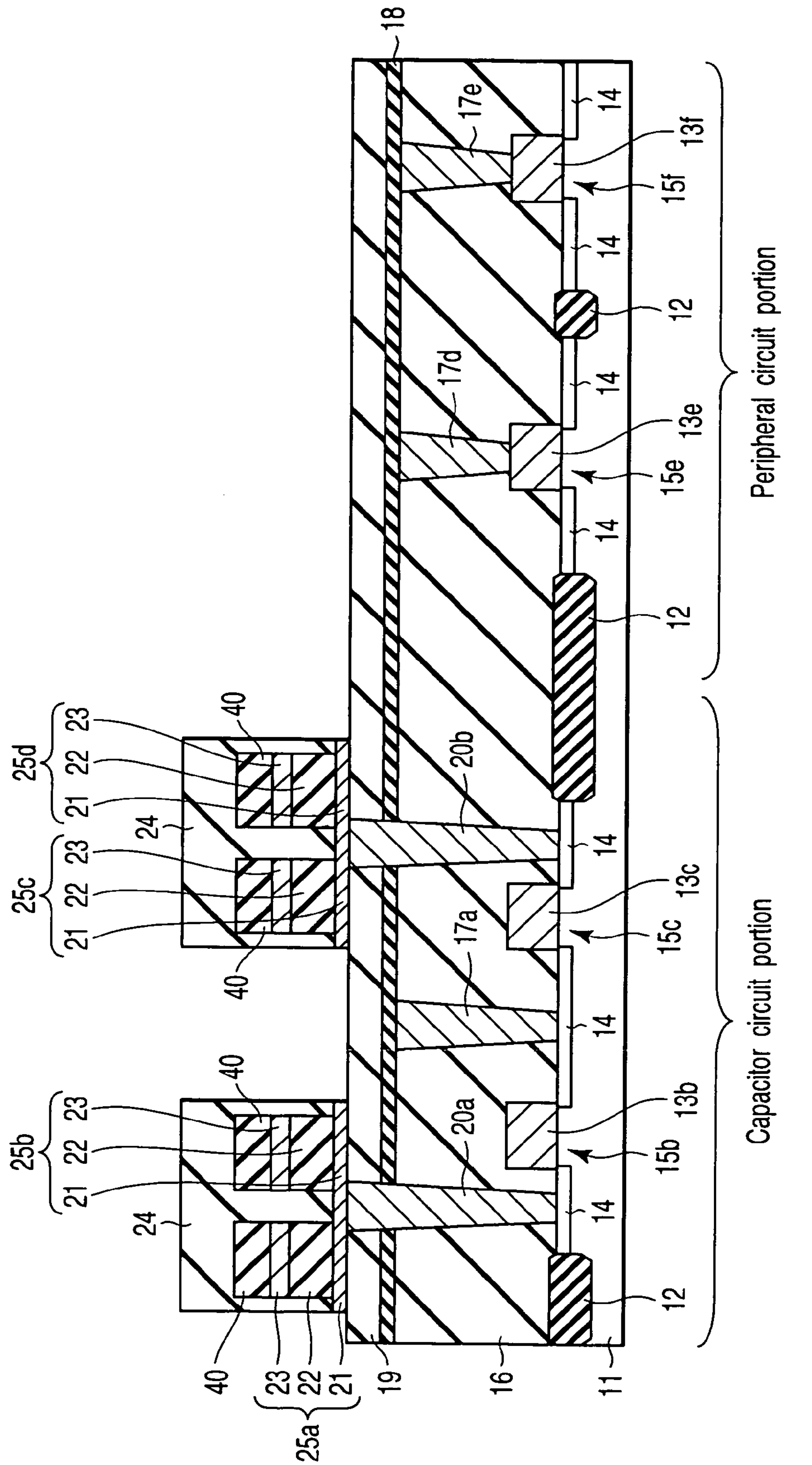

As shown in FIG. 63, a mask (not shown) is formed on the interlayer dielectric film 24 and patterned. Then, the interlayer dielectric film 24 is patterned by using the patterned mask. In addition, the lower electrode 21 is processed by using the patterned interlayer dielectric film 24 as a mask. With this process, the ferro-electric capacitors 25*a*, 25*b*, 25*c*, and 25*d* are formed.

Figure 64:
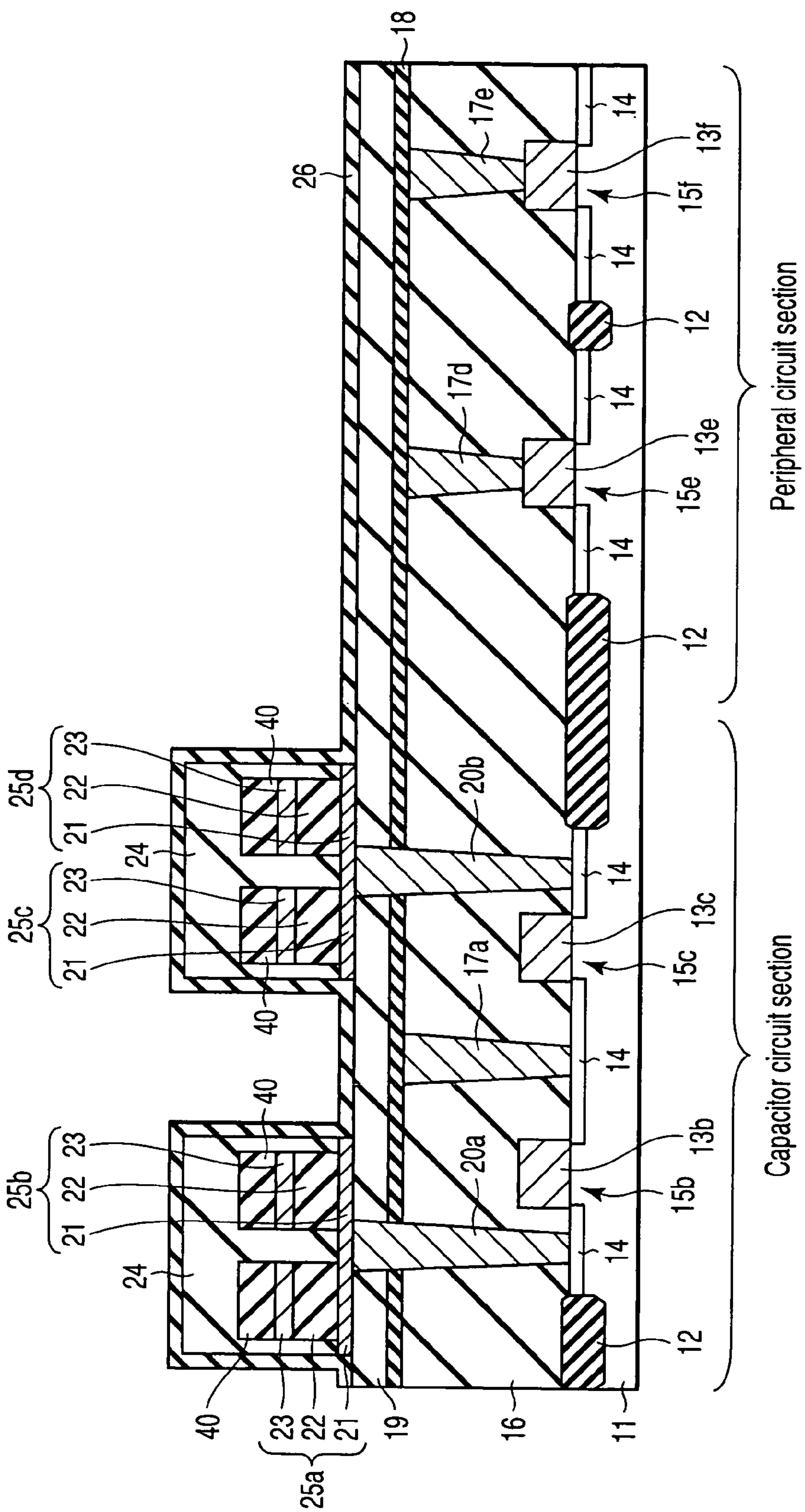

As shown in FIG. 64, the hydrogen and oxygen barrier film 26 is formed on the upper and side surfaces of the interlayer dielectric films 24, the side surfaces of the lower electrodes 21, and the upper surface of the interlayer dielectric film 19 by sputtering or CVD. Accordingly, the ferro-electric capacitors 25*a*, 25*b*, 25*c*, and 25*d* are covered with the hydrogen and oxygen barrier film 26. Examples of the material of the hydrogen and oxygen barrier film 26 are $Al_2O_3$, SiN, SiON, $TiO_2$, and PZT.

Figure 65:
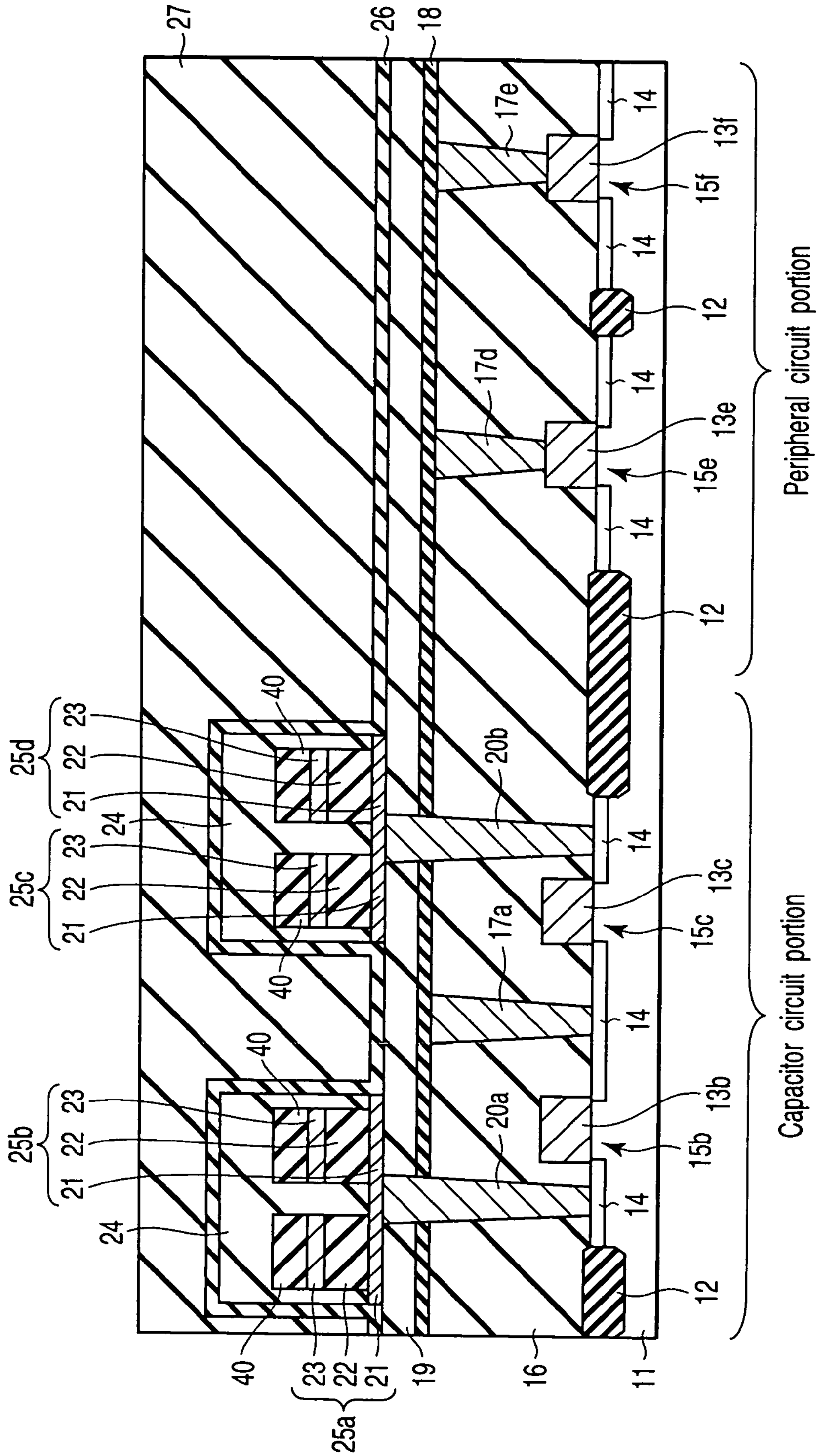

As shown in FIG. 65, the interlayer dielectric film 27 is deposited on the hydrogen and oxygen barrier film 26. Examples of the material of the interlayer dielectric film 27 are P-TEOS, $O_3$-TEOS, SOG, $Al_2O_3$, SiN, and SiON.

Figure 66:
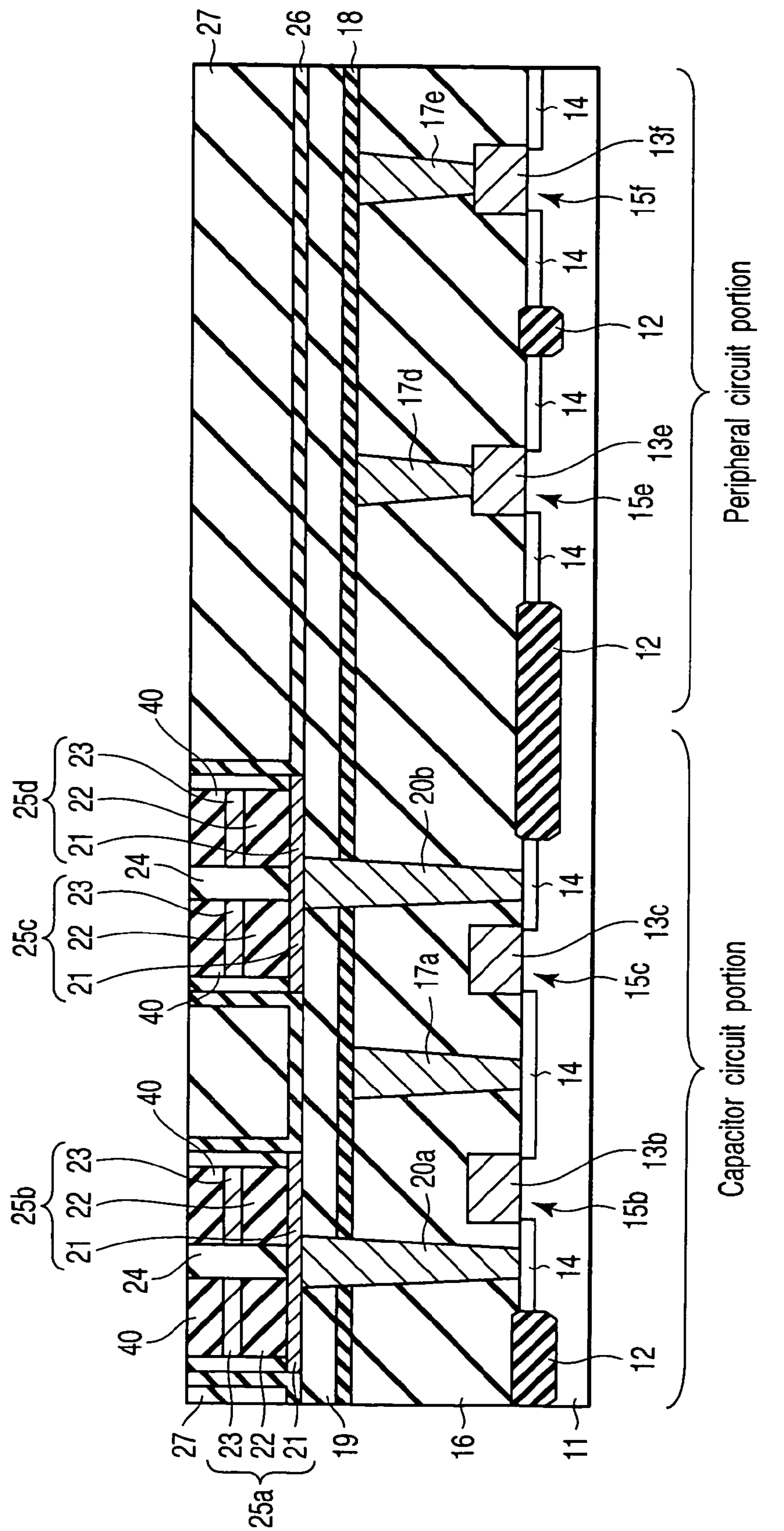

As shown in FIG. 66, the interlayer dielectric film 27 and hydrogen and oxygen barrier film 26 are planarized by CMP until the stopper films 40 are exposed.

Figure 67:
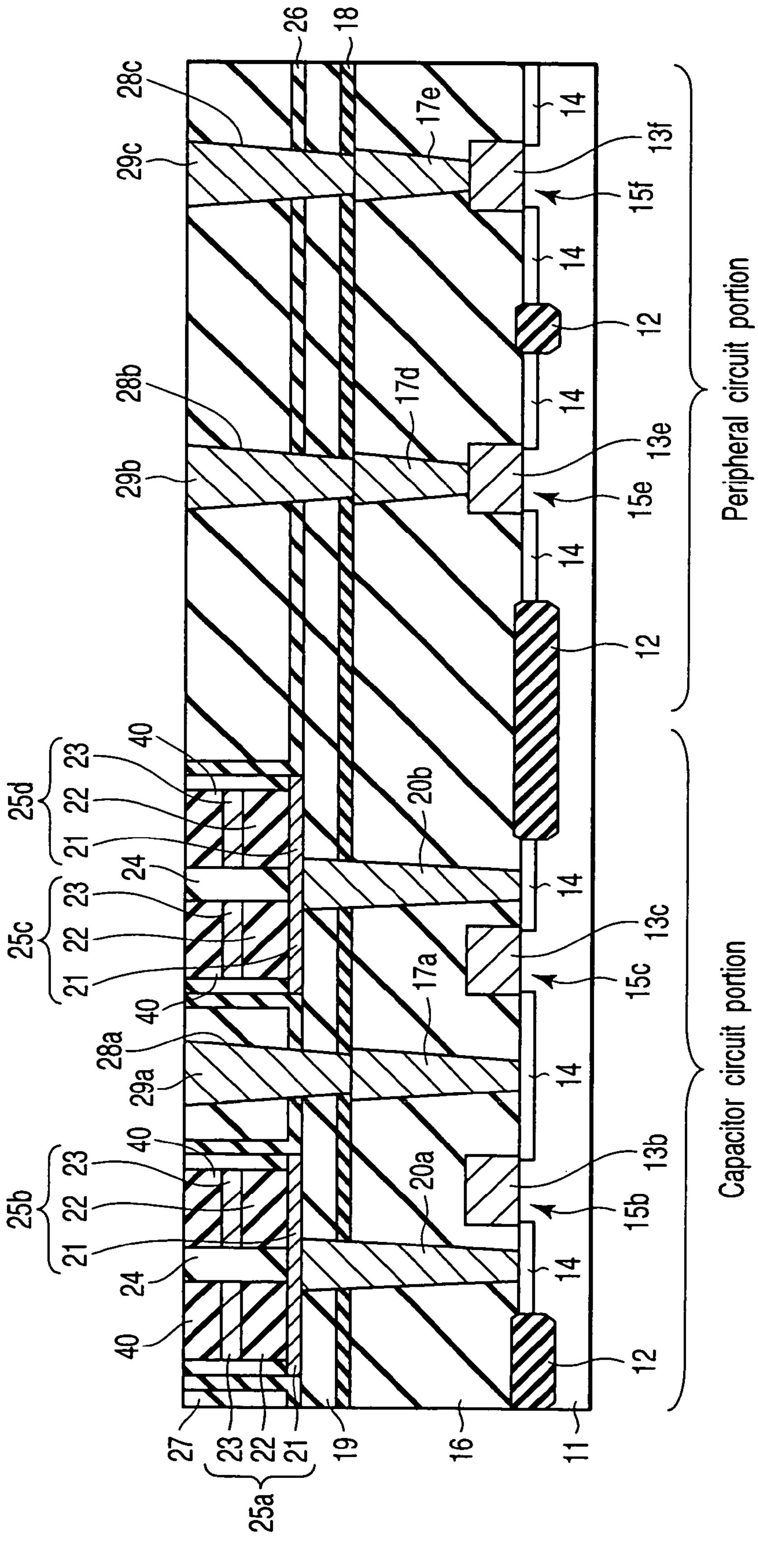

As shown in FIG. 67, contact holes 28*a*, 28*b*, and 28*c* extending through the interlayer dielectric films 19 and 27, hydrogen and oxygen barrier film 26, and oxygen barrier film 18 are formed. The contact holes 28*a*, 28*b*, and 28*c* are filled with a metal material containing, e.g., Ti, TiN, or W. The upper surface of the metal material is planarized. With this process, the contacts 29*a*, 29*b*, and 29*c* connected to the contacts 17*a*, 17*d*, and 17*e* are formed. To fill the contact holes 28*a*, 28*b*, and 28*c* having a high aspect ratio, they are filled with the metal material of the contacts 29*a*, 29*b*, and 29*c* by using plasma CVD.

Figure 68:
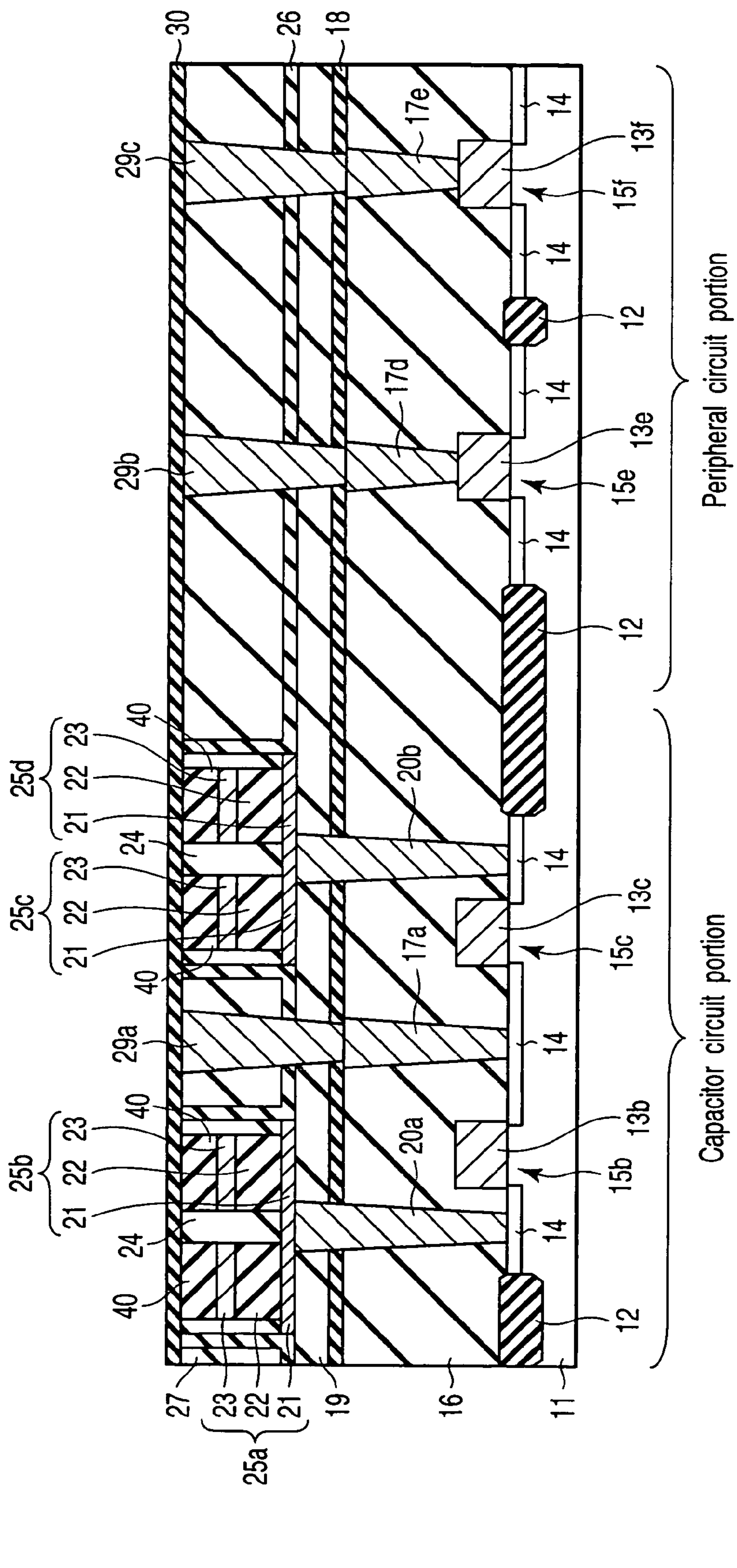

As shown in FIG. 68, the insulating oxygen barrier film 30 is formed on the contacts 29*a*, 29*b*, and 29*c*, hydrogen and oxygen barrier film 26, stopper films 40, and interlayer dielectric film 27. For example, $Al_2O_3$, SiN, SiON, PZT, or $TiO_2$ is used as the material of the insulating oxygen barrier film 30.

Figure 69:
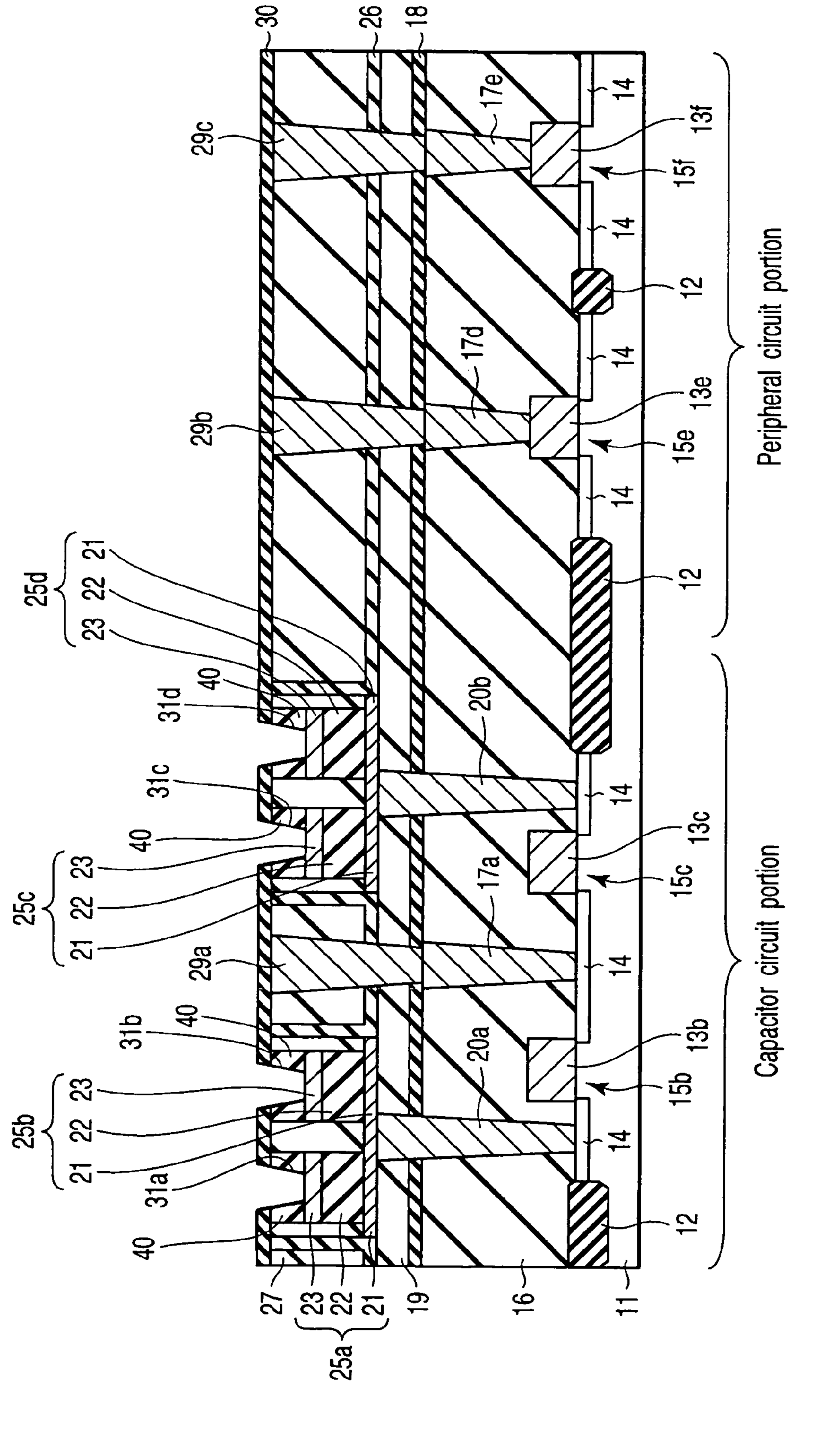

As shown in FIG. 69, contact holes 31*a*, 31*b*, 31*c*, and 31*d* extending through the oxygen barrier film 30 and stopper films 40 are formed. Next, high-temperature recovery annealing is executed, e.g., at 650° C. in an oxygen atmosphere for 1 hr.

As shown in FIG. 70, the contact holes 31*a*, 31*b*, 31*c*, and 31*d* are filled with a metal material such as W, Cu, Al, or TiN. The upper surface of the metal material is planarized. Accordingly, the contacts 32*a*, 32*b*, 32*c*, and 32*d* connected to the upper electrodes 23 are formed.

Figure 71:
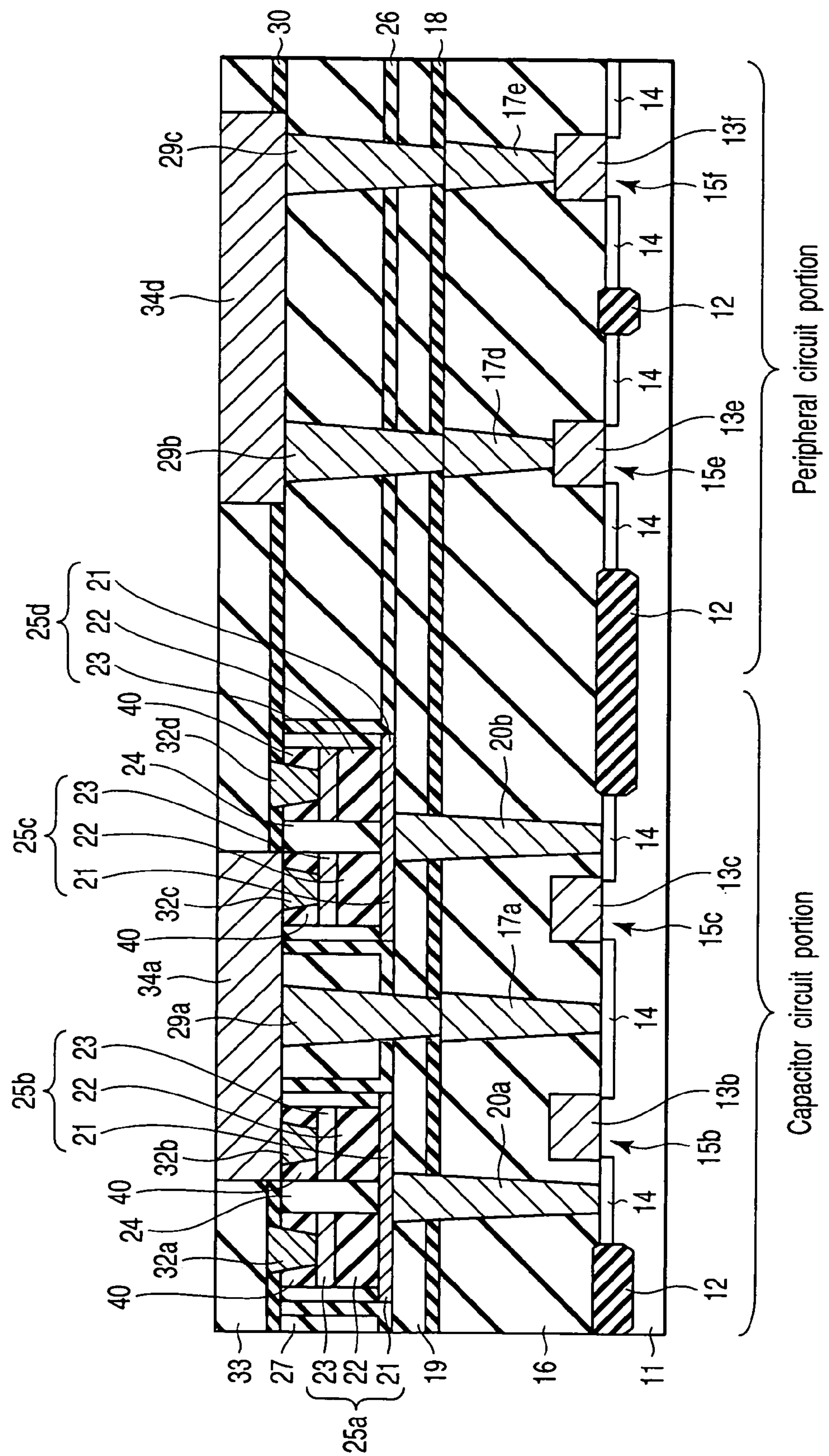

As shown in FIG. 71, an interlayer dielectric film 33 is formed on the contacts 32*a*, 32*b*, 32*c*, and 32*d* and oxygen barrier film 30. The interconnections 34*a* and 34*d* made of, e.g., W, Cu, Al, or TiN are formed. As a result, the upper electrodes 23 of the capacitors 25*b* and 25*c* and the source/drain diffusion layer 14 of transistors 15*b* and 15*c* are electrically connected by using the interconnection 34*a*.

Figure 72:
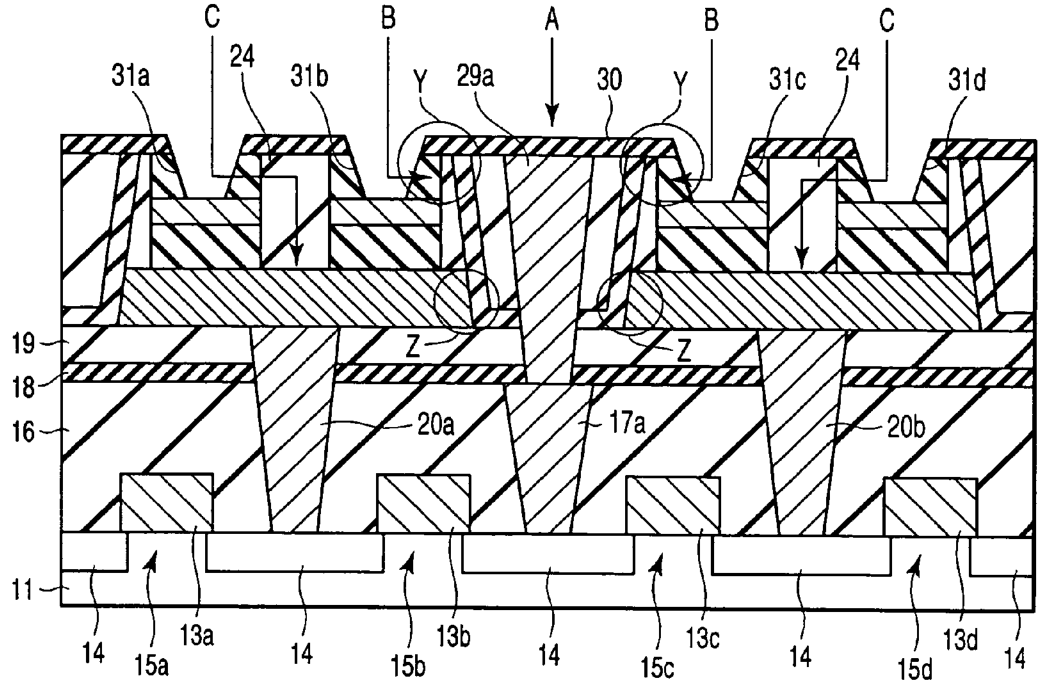
FIG. 72 is a sectional view showing the oxygen annealing step for the ferro-electric memory device according to the seventh embodiment of the present invention.

In the seventh embodiment, to prevent oxygen from diffusing through routes A, B, and C to oxidize the contact 29*a*, as shown in FIG. 72, it is important that, in oxygen annealing, (a) the hydrogen and oxygen barrier film 26 is in contact with the lower electrode 21 at the portion Z, and (b) the hydrogen and oxygen barrier film 26 is in contact with the oxygen barrier film 30 at the portion Y, as in the fourth embodiment.

When the stopper films 40 have the oxygen diffusion preventing effect, they can prevent oxygen from diffusing through the routes B, and C. To obtain this effect, it is important that, in oxygen annealing, (c) the stopper films 40 are in contact with the oxygen barrier film 30, and (d) the stopper films 40 are in contact with the upper electrodes 23.

Figure 73:
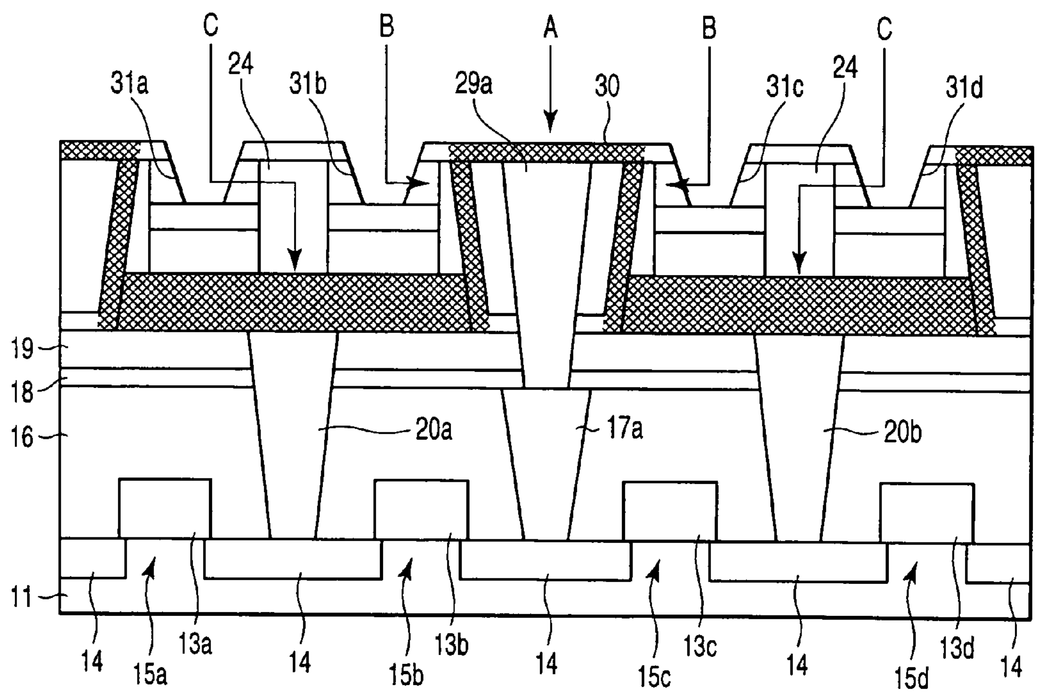
FIG. 73 is a sectional view showing preventing contacts from being oxidized in the oxygen annealing step for the ferro-electric memory device according to the seventh embodiment of the present invention.

According to the seventh embodiment, as in the fourth embodiment, when high-temperature oxygen annealing is to be executed, the contact 29*a* made of, e.g., W can be prevented from being oxidized by high-temperature oxygen annealing because the contact 29*a* is surrounded by the lower electrodes 21 having the oxygen diffusion preventing effect, the oxygen barrier film 30, and the hydrogen and oxygen barrier film 26 (crosshatched portion in FIG. 73).

In addition, since the COP structure is formed, the cell area can be reduced, as in the fourth embodiment.

When the stopper films 40 are formed from oxygen barrier films, they can form barriers against even oxygen which invades from the contact holes 31*a*, 31*b*, 31*c*, and 31*d*. For this reason, the oxidation preventing effect for the contact 29*a* can further be increased.

Since the hydrogen and oxygen barrier film 26 above the capacitors 25*a*, 25*b*, 25*c*, and 25*d* is omitted, the interlayer dielectric film 24 can be made thinner than in the fourth embodiment. For this reason, the aspect ratio of the contact 29*a* can be reduced.

Eighth Embodiment

The eighth embodiment is a modification to the seventh embodiment. The oxygen barrier film under the ferro-electric capacitors is omitted.

Figure 74:
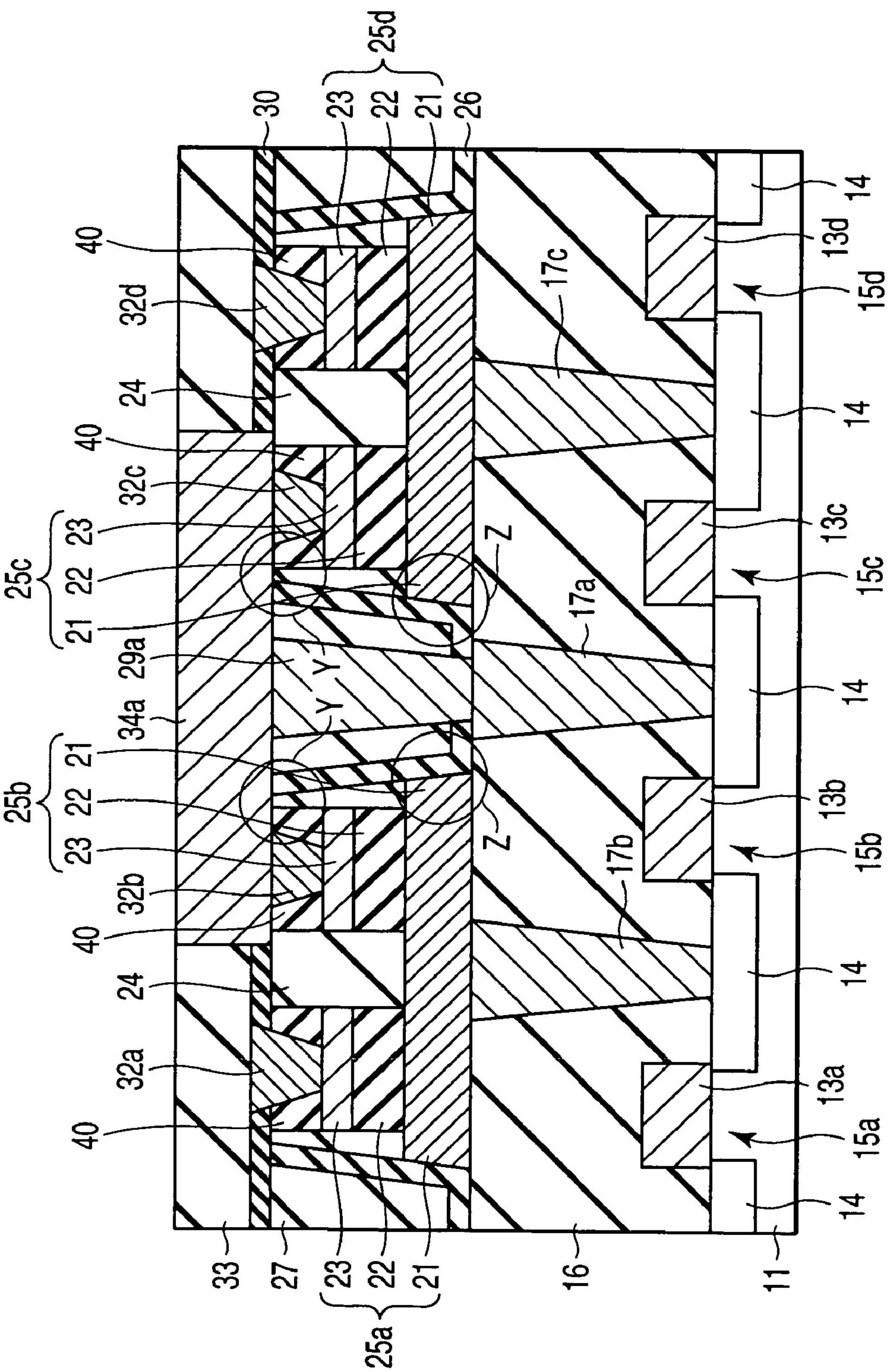
FIG. 74 is a sectional view showing a ferro-electric memory device according to the eighth embodiment of the present invention.

FIG. 74 shows a ferro-electric memory device according to the eighth embodiment of the present invention. As shown in FIG. 74, the eighth embodiment is different from the seventh embodiment in that the oxygen barrier film 18 and interlayer dielectric film 19 under the ferro-electric capacitors 25*a*, 25*b*, 25*c*, and 25*d* are omitted. For this reason, a lower electrode 21 is in direct contact with an interlayer dielectric film 16. A hydrogen and oxygen barrier film 26 is in direct contact with a contact 17*a* and the interlayer dielectric film 16. The contact 17*a* connected to a contact 29*a* and contacts 17*b* and 17*c* connected to the lower electrodes 21 are simultaneously formed by the same material and have the same depth.

In the eighth embodiment, an oxygen barrier film 30 is formed on the contact 29*a*. The lower electrodes 21 having an oxygen diffusion preventing effect are formed on the contacts 17*b* and 17*c*. The hydrogen and oxygen barrier film 26 is formed between a capacitor 25*b* and the contact 29*a* and between a capacitor 25*c* and the contact 29*a*. The hydrogen and oxygen barrier film 26 comes into contact with the edge portions of the lower electrodes 21 at portions Z and an interconnection 34*a* at portions Y.

Stopper films 40 may be films having an oxygen diffusion preventing effect. In this case, the stopper films 40 at the capacitors 25*b* and 25*c* are brought into contact with upper electrodes 23 and the interconnection 34*a*. The stopper films 40 at capacitors 25*a* and 25*d* are brought into contact with the upper electrodes 23 and oxygen barrier film 30.

Figure 75:
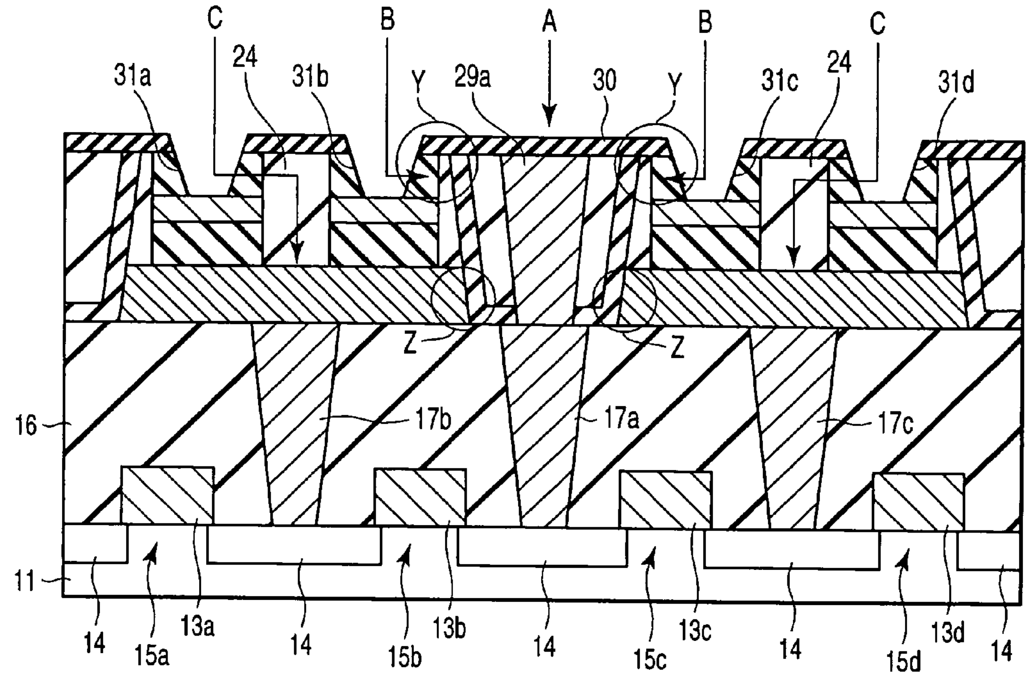
FIG. 75 is a sectional view showing the oxygen annealing step for the ferro-electric memory device according to the eighth embodiment of the present invention.

In the eighth embodiment, to prevent oxygen from diffusing through routes A, B, and C to oxidize the contact 29*a*, as shown in FIG. 75, it is important that, in oxygen annealing, (a) the hydrogen and oxygen barrier film 26 is in contact with the lower electrode 21 at the portion Z, and (b) the hydrogen and oxygen barrier film 26 is in contact with the oxygen barrier film 30 at the portion Y, as in the fourth embodiment.

When the stopper films 40 have the oxygen diffusion preventing effect, they can prevent oxygen from diffusing through the routes B, and C. To obtain this effect, it is important that, in oxygen annealing, (c) the stopper films 40 are in contact with the oxygen barrier film 30, and (d) the stopper films 40 are in contact with the upper electrodes 23.

Figure 76:
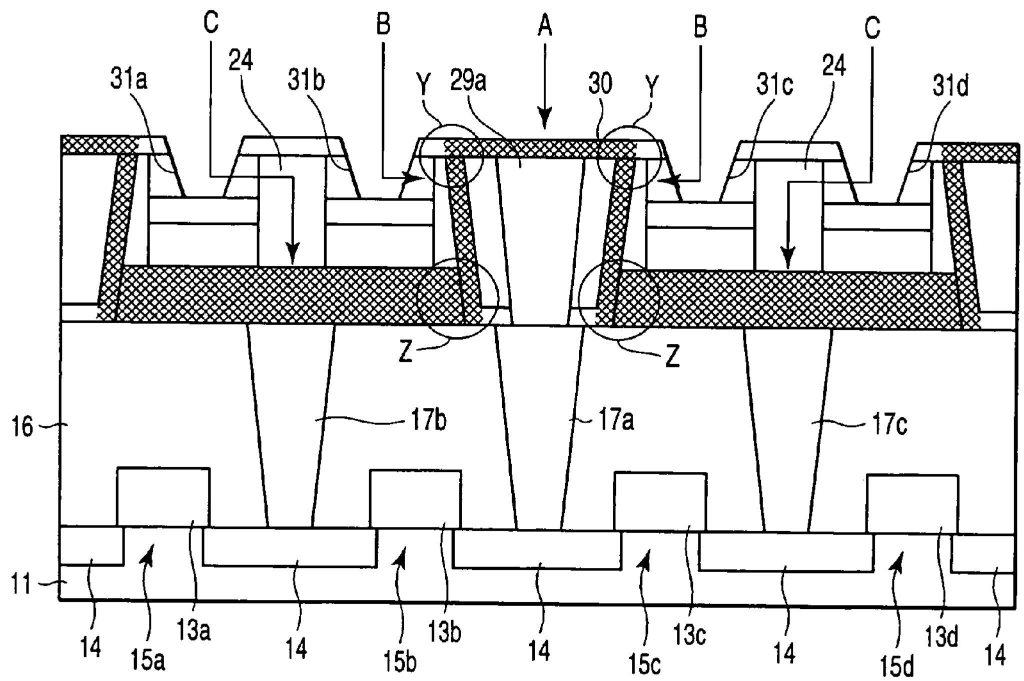
FIG. 76 is a sectional view showing preventing contacts from being oxidized in the oxygen annealing step for the ferro-electric memory device according to the eighth embodiment of the present invention.

According to the eighth embodiment, as in the seventh embodiment, when high-temperature oxygen annealing is to be executed, the contact 29*a* made of, e.g., W can be prevented from being oxidized by high-temperature oxygen annealing because the contact 29*a* is surrounded by the lower electrodes 21 having the oxygen diffusion preventing effect, the oxygen barrier film 30, and the hydrogen and oxygen barrier film 26 (crosshatched portion in FIG. 76). This effect can be increased by imparting the oxygen barrier function to the stopper films 40.

In addition, since the COP structure is formed, the cell area can be reduced, as in the fourth embodiment.

Furthermore, the oxygen barrier film 18 and interlayer dielectric film 19 in the seventh embodiment are omitted. For this reason, the aspect ratio of the contact 29*a* can be decreased by an amount corresponding to the thickness of the oxygen barrier film 18 and interlayer dielectric film 19. In addition, since the contacts 17*a*, 17*b*, and 17*c* can simultaneously be formed at once, the cost can be reduced.

Ninth Embodiment

The ninth embodiment is a modification to the eighth embodiment. Contacts that connect the upper electrodes of capacitors to the sources/drains of transistors are formed at once.

Figure 77:
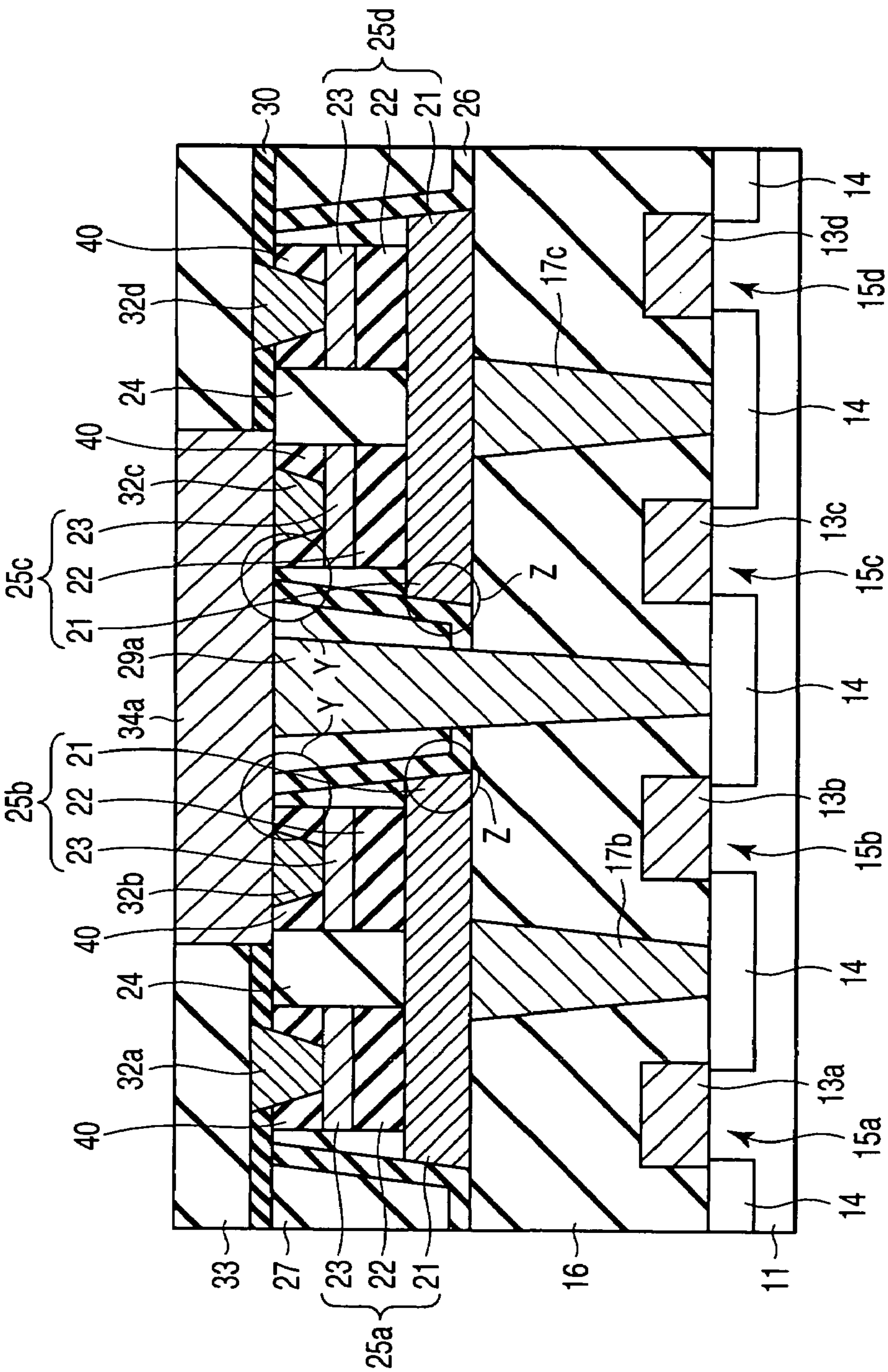
FIG. 77 is a sectional view showing a ferro-electric memory device according to the ninth embodiment of the present invention.

FIG. 77 shows a ferro-electric memory device according to the ninth embodiment of the present invention. As shown in FIG. 77, in the ninth embodiment, the contacts 29*a* and 17*a* of the eighth embodiment are formed at once as one contact 29*a*. The contact 29*a* is directly connected to a source/drain diffusion layer 14.

In the ninth embodiment, an oxygen barrier film 30 is formed on the contact 29*a*. Lower electrodes 21 having an oxygen diffusion preventing effect are formed on contacts 17*b* and 17*c*. A hydrogen and oxygen barrier film 26 is formed between a capacitor 25*b* and the contact 29*a* and between a capacitor 25*c* and the contact 29*a*. The hydrogen and oxygen barrier film 26 comes into contact with the edge portions of the lower electrodes 21 at portions Z and an interconnection 34*a* at portions Y.

Stopper films 40 may be films having an oxygen diffusion preventing effect. In this case, the stopper films 40 at the capacitors 25*b* and 25*c* are brought into contact with upper electrodes 23 and the interconnection 34*a*. The stopper films 40 at capacitors 25*a* and 25*d* are brought into contact with the upper electrodes 23 and oxygen barrier film 30.

In the ninth embodiment, to prevent oxygen from diffusing through routes A, B, and C to oxidize the contact 29*a*, as shown in FIG. 78, it is important that, in oxygen annealing, (a) the hydrogen and oxygen barrier film 26 is in contact with the lower electrode 21 at the portion Z, and (b) the hydrogen and oxygen barrier film 26 is in contact with the oxygen barrier film 30 at the portion Y, as in the fourth embodiment.

When the stopper films 40 have the oxygen diffusion preventing effect, they can prevent oxygen from diffusing through the routes B, and C. To obtain this effect, it is important that, in oxygen annealing, (c) the stopper films 40 are in contact with the oxygen barrier film 30, and (d) the stopper films 40 are in contact with the upper electrodes 23.

According to the ninth embodiment, as in the seventh embodiment, when high-temperature oxygen annealing is to be executed, the contact 29*a* made of, e.g., W can be prevented from being oxidized by high-temperature oxygen annealing because the contact 29*a* is surrounded by the lower electrodes 21 having the oxygen diffusion preventing effect, the oxygen barrier film 30, and the hydrogen and oxygen barrier film 26 (crosshatched portion in FIG. 79). This effect can be increased by imparting the oxygen barrier function to the stopper films 40.

In addition, since the COP structure is formed, the cell area can be reduced, as in the fourth embodiment.

Furthermore, as in the eighth embodiment, the oxygen barrier film 18 and interlayer dielectric film 19 in the seventh embodiment are omitted. For this reason, the aspect ratio of the contact 29*a* can be decreased by an amount corresponding to the thickness of the oxygen barrier film 18 and interlayer dielectric film 19.

The contact 29*a* which connects the interconnection 34*a* to the source/drain diffusion layer 14 is formed at once as one structure. As compared to the case wherein the contact at this portion is not formed at once as one structure, any decrease in yield due to misalignment can be suppressed. Hence, the cost can be reduced.

In the ninth embodiment, the structure of the seventh embodiment may be deformed such that the contacts that connect the upper electrodes of capacitors to the sources/drains of transistors are formed at once.

10th Embodiment

In the views showing the final step in the above embodiments, the contact portions between the hydrogen and oxygen barrier film 26 and the oxygen barrier film 30 at the portions Y are not illustrated because the interconnection 34*a* is formed on the contacts 29*a*, 32*b*, and 32*c*.

In the 10th embodiment, a structure which allows to confirm that a hydrogen and oxygen barrier film 26 and oxygen barrier film 30 are in contact at portions Y is formed.

FIGS. 80 to 88 are sectional views showing steps in manufacturing a ferro-electric memory device according to the 10th embodiment of the present invention. A method of manufacturing the ferro-electric memory device according to the 10th embodiment will be described below.

Figure 80:
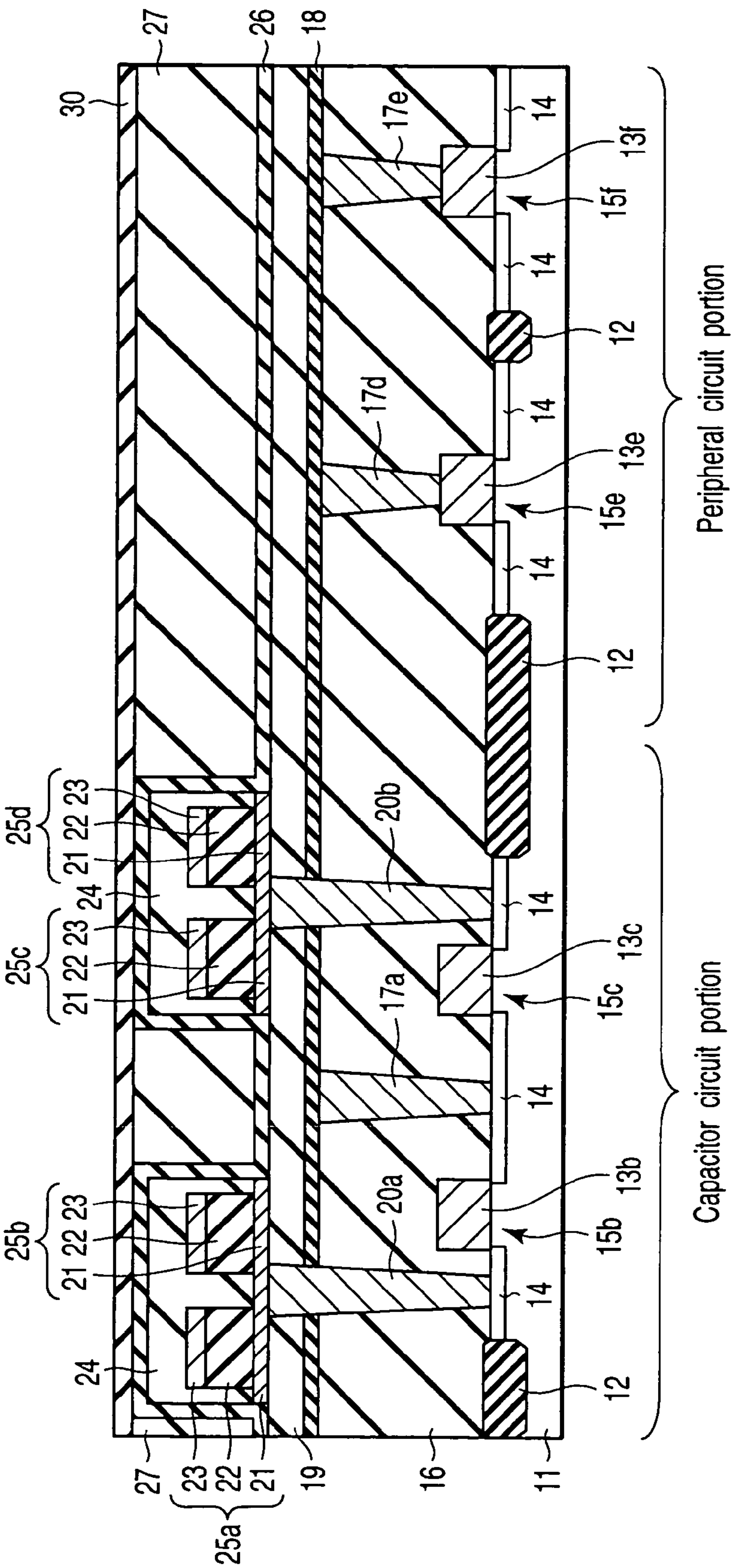

After the step shown in FIG. 40, the insulating oxygen barrier film 30 is formed on the hydrogen and oxygen barrier film 26 and an interlayer dielectric film 27, as shown in FIG. 80.

Figure 81:
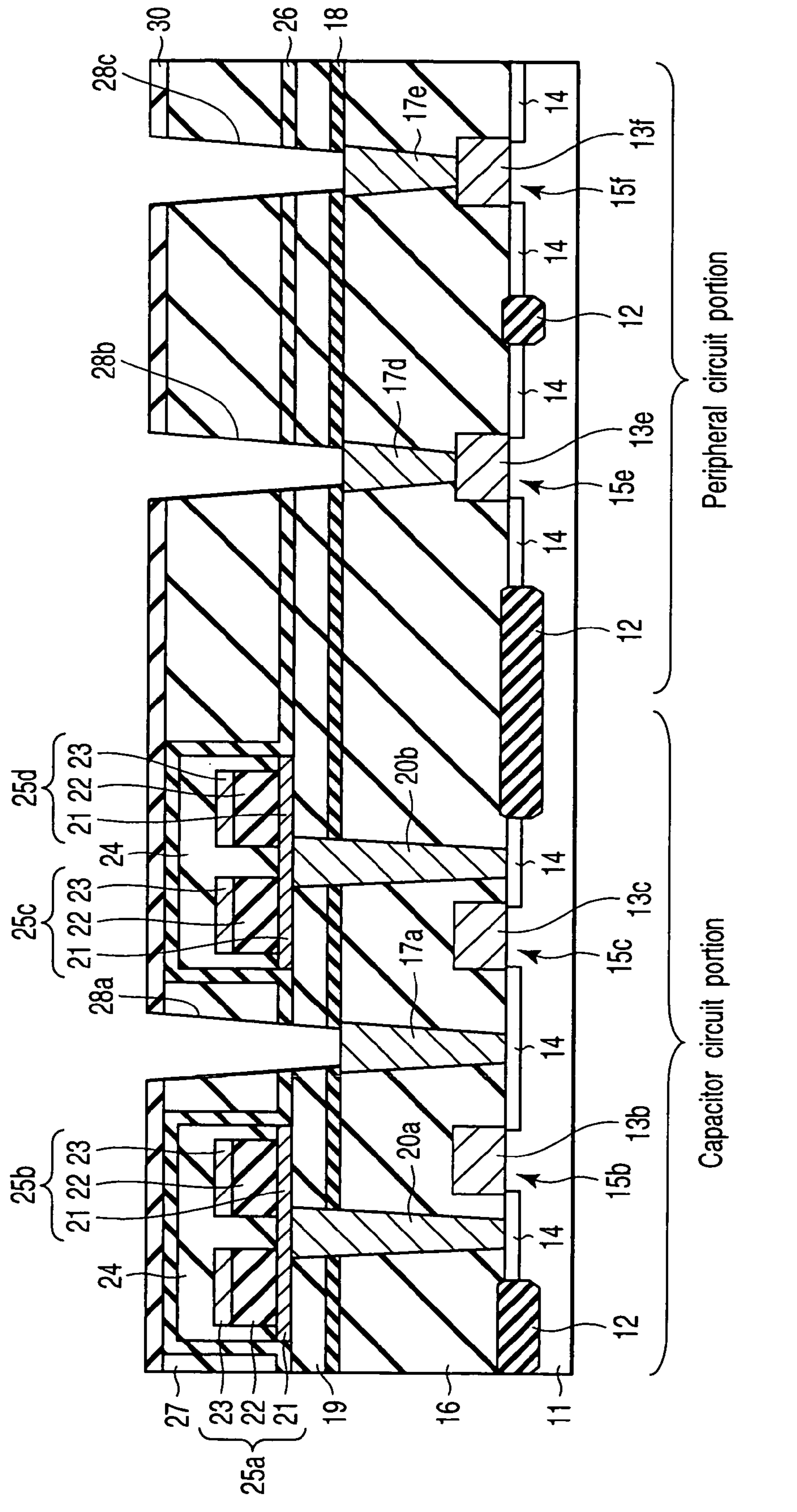

As shown in FIG. 81, contact holes 28*a*, 28*b*, and 28*c* extending through the interlayer dielectric films 19 and 27, hydrogen and oxygen barrier film 26, and oxygen barrier films 18 and 30 are formed.

As shown in FIG. 82, the contact holes 28*a*, 28*b*, and 28*c* are filled with a metal material containing, e.g., Ti, TiN, or W. The upper surface of the metal material is planarized. With this process, contacts 29*a*, 29*b*, and 29*c* connected to contacts 17*a*, 17*d*, and 17*e* are formed.

Figure 83:
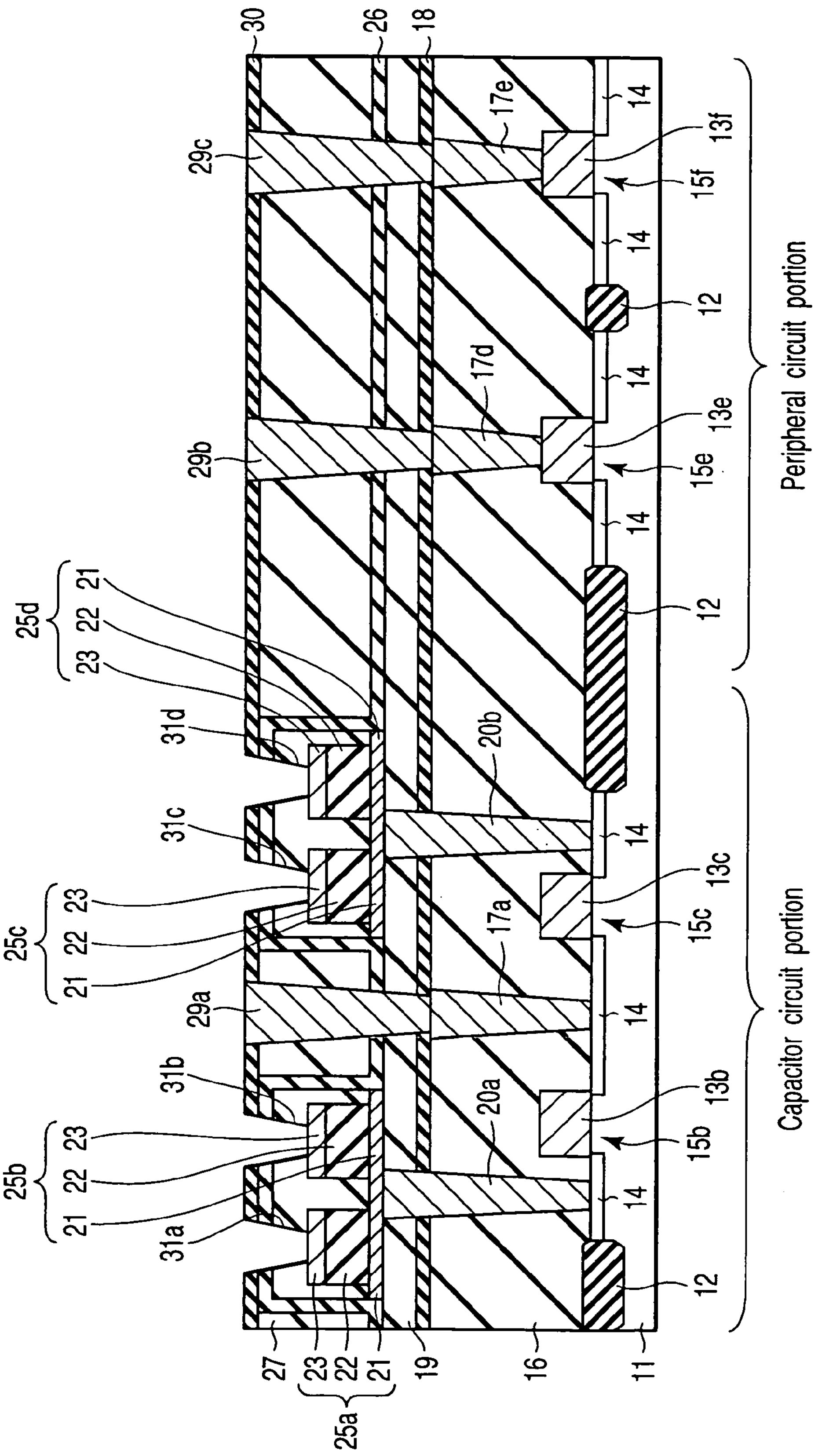

As shown in FIG. 83, contact holes 31*a*, 31*b*, 31*c*, and 31*d* extending through the oxygen barrier film 30, hydrogen and oxygen barrier film 26, and interlayer dielectric film 24 are formed.

Figure 84:
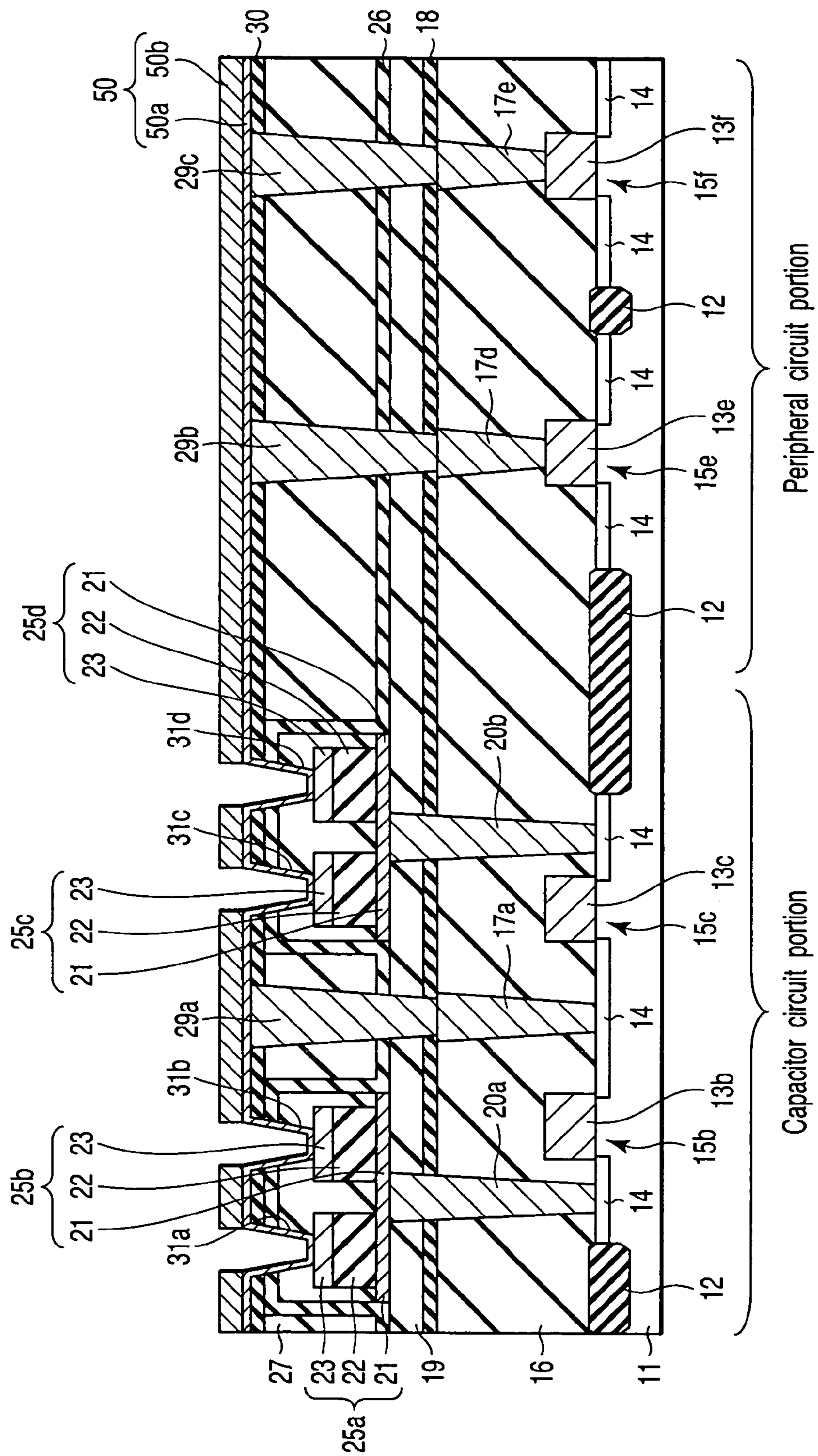

As shown in FIG. 84, an ALD (Atomic Layer Deposition) alumina film 50*a* is formed by ALD. A sputter alumina film 50*b* is formed on the ALD alumina film 50*a* by sputtering. In this way, an oxygen barrier film 50 including the ALD alumina film 50*a* and sputter alumina film 50*b* is formed. The ALD alumina film 50*a* is also formed in the contact holes 31*a*, 31*b*, 31*c* and 31*d*. However, the sputter alumina film 50*b* is rarely formed in the contact holes 31*a*, 31*b*, 31*c* and 31*d*.

Figure 85:
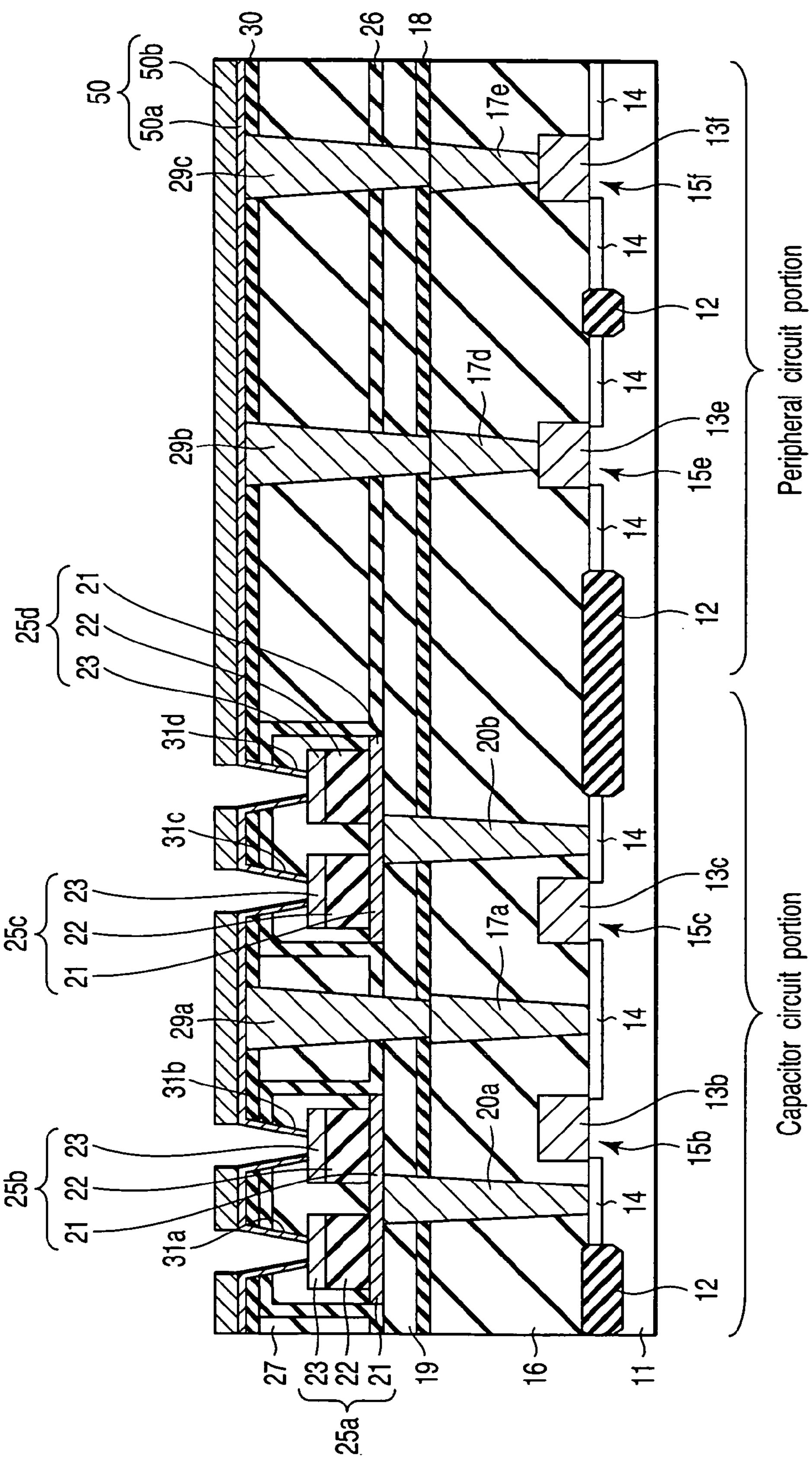

As shown in FIG. 85, the ALD alumina film 50*a* on upper electrodes 23 is removed by RIE. After that, high-temperature recovery annealing is executed, e.g., at 650° C. in an oxygen atmosphere for 1 hr.

As shown in FIG. 86, the contact holes 31*a*, 31*b*, 31*c*, and 31*d* are filled with a metal material 32 such as W, Cu, Al, or TiN. The upper surface of the metal material 32 is planarized until the sputter alumina film 50*b* is exposed.

Figure 87:
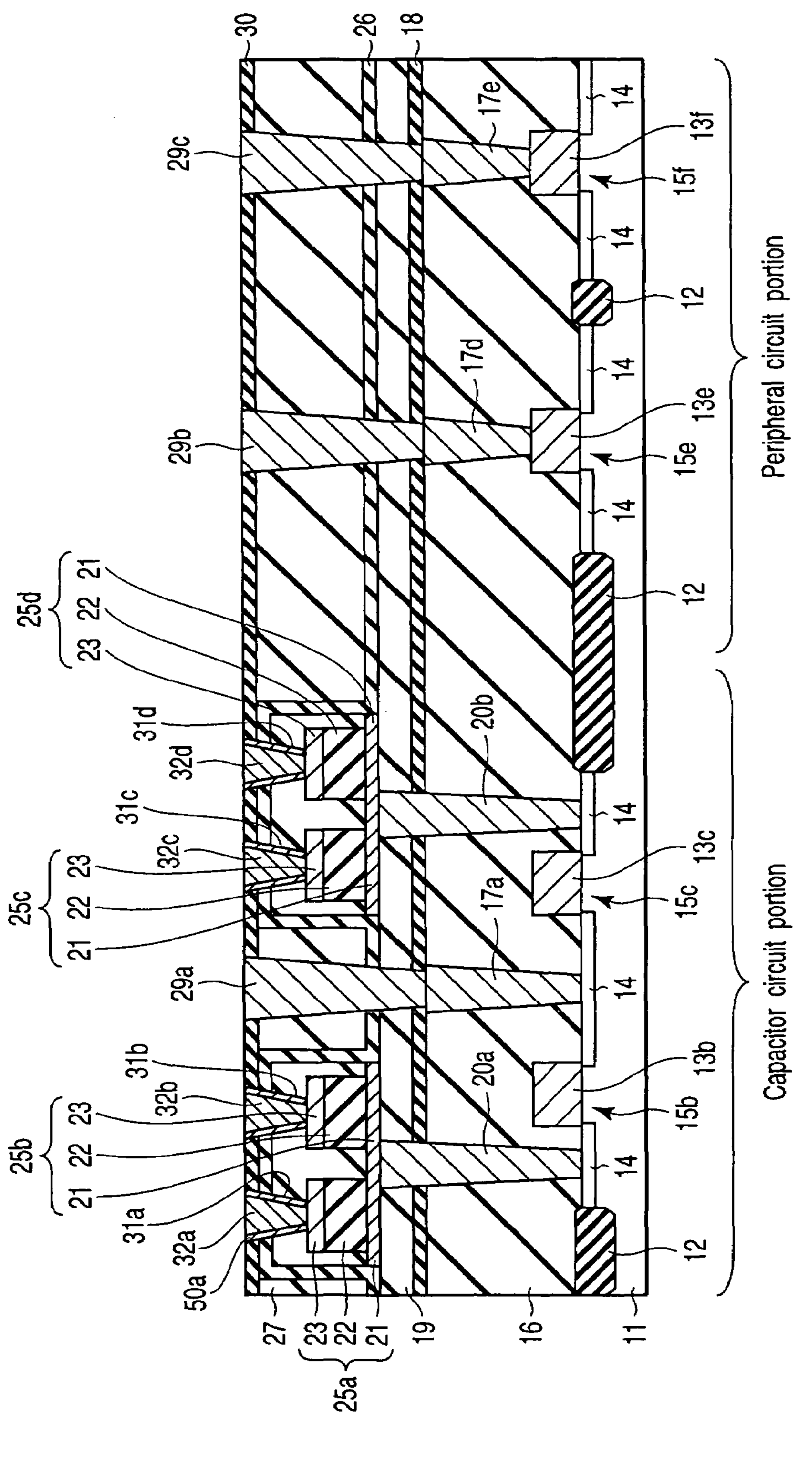

As shown in FIG. 87, planarization is executed until the contacts 29*a*, 29*b*, and 29*c* are exposed. Accordingly, contacts 32*a*, 32*b*, 32*c*, and 32*d* connected to the upper electrodes 23 are formed.

Figure 88:
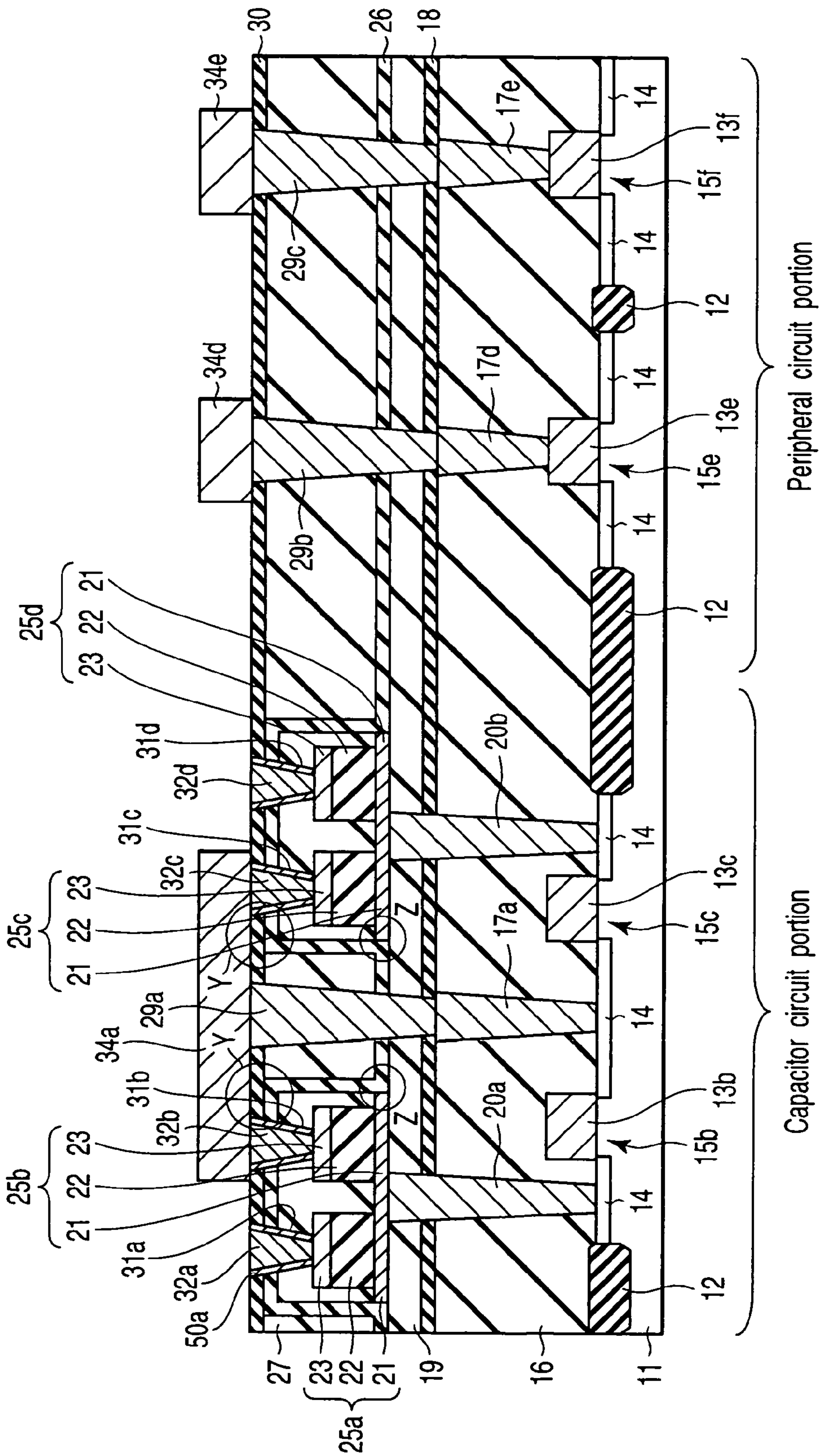

As shown in FIG. 88, a metal material such as W, Cu, Al, or TiN is deposited and patterned by RIE. With this process, interconnections 34*a*, 34*d*, and 34*e* are formed. As a result, the upper electrodes 23 of capacitors 25*b* and 25*c* and a source/drain diffusion layer 14 of transistors 15*b* and 15*c* are electrically connected by using the interconnection 34*a*.

According to the 10th embodiment, it can be confirmed that the hydrogen and oxygen barrier film 26 and oxygen barrier film 30 are in contact at the portions Y.

The present invention is not limited to the above embodiments, and various changes and modifications can be made within the spirit and scope of the present invention in practicing it.

Figure 89:
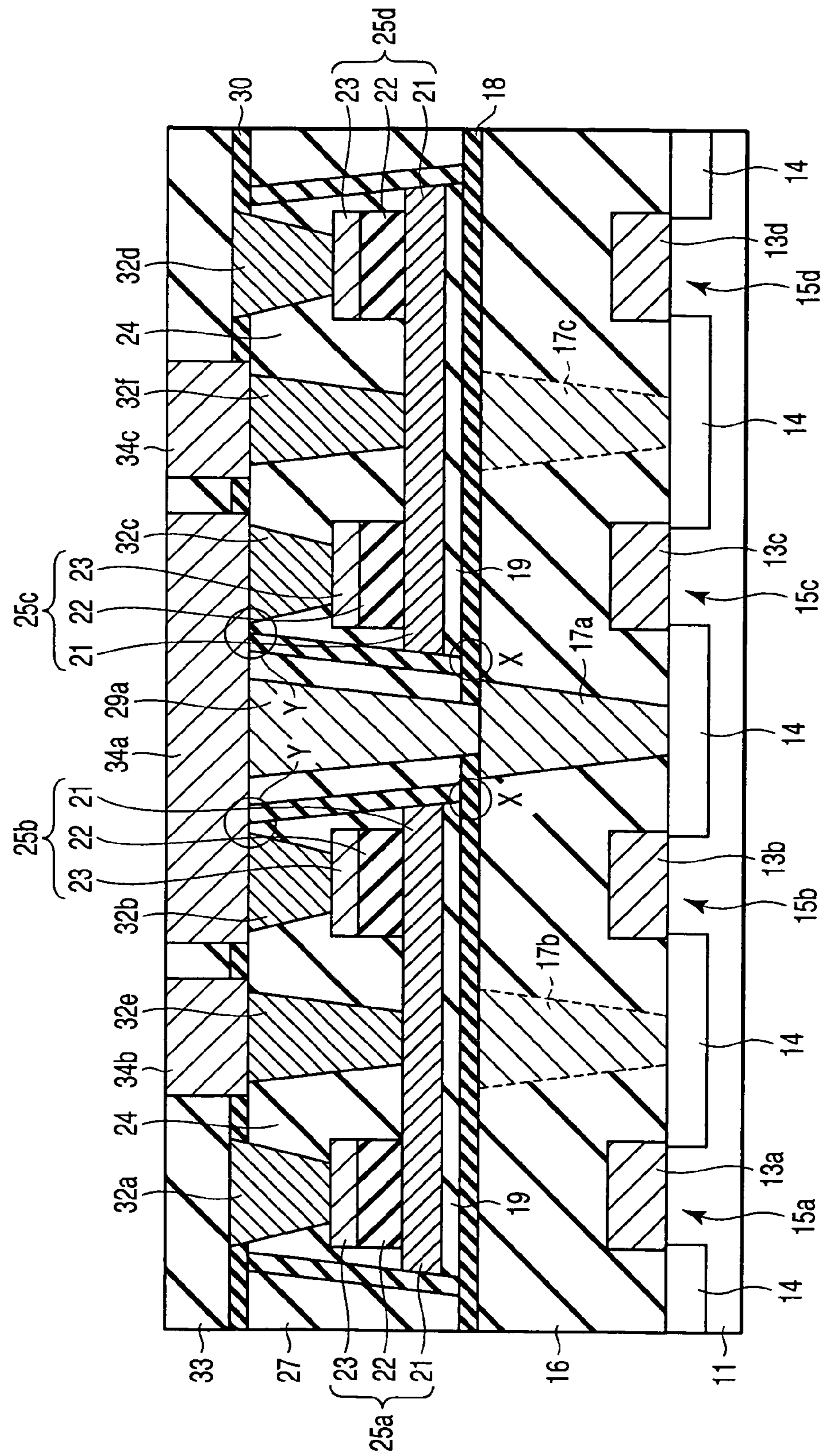
FIGS. 89 to 92 are sectional views showing other ferro-electric memory devices according to the embodiments of the present invention.

For example, the hydrogen and oxygen barrier film 26 may be formed like the sidewall of a gate electrode. For example, in the first embodiment, after the step shown in FIG. 11, the hydrogen and oxygen barrier film 26 on the interlayer dielectric film 24 and oxygen barrier film 18 can be removed. Then, the interlayer dielectric film 27 can be deposited, as in the step shown in FIG. 12. In this step, a structure shown in FIG. 89 is obtained after the final step.

The hydrogen and oxygen barrier film 26 needs to have at least an oxygen barrier effect. It need not always have a hydrogen barrier effect. However, when the hydrogen and oxygen barrier film 26 has a hydrogen barrier effect, damage to the capacitors 25*a*, 25*b*, 25*c*, and 25*d* by hydrogen can be prevented.

Figure 90:
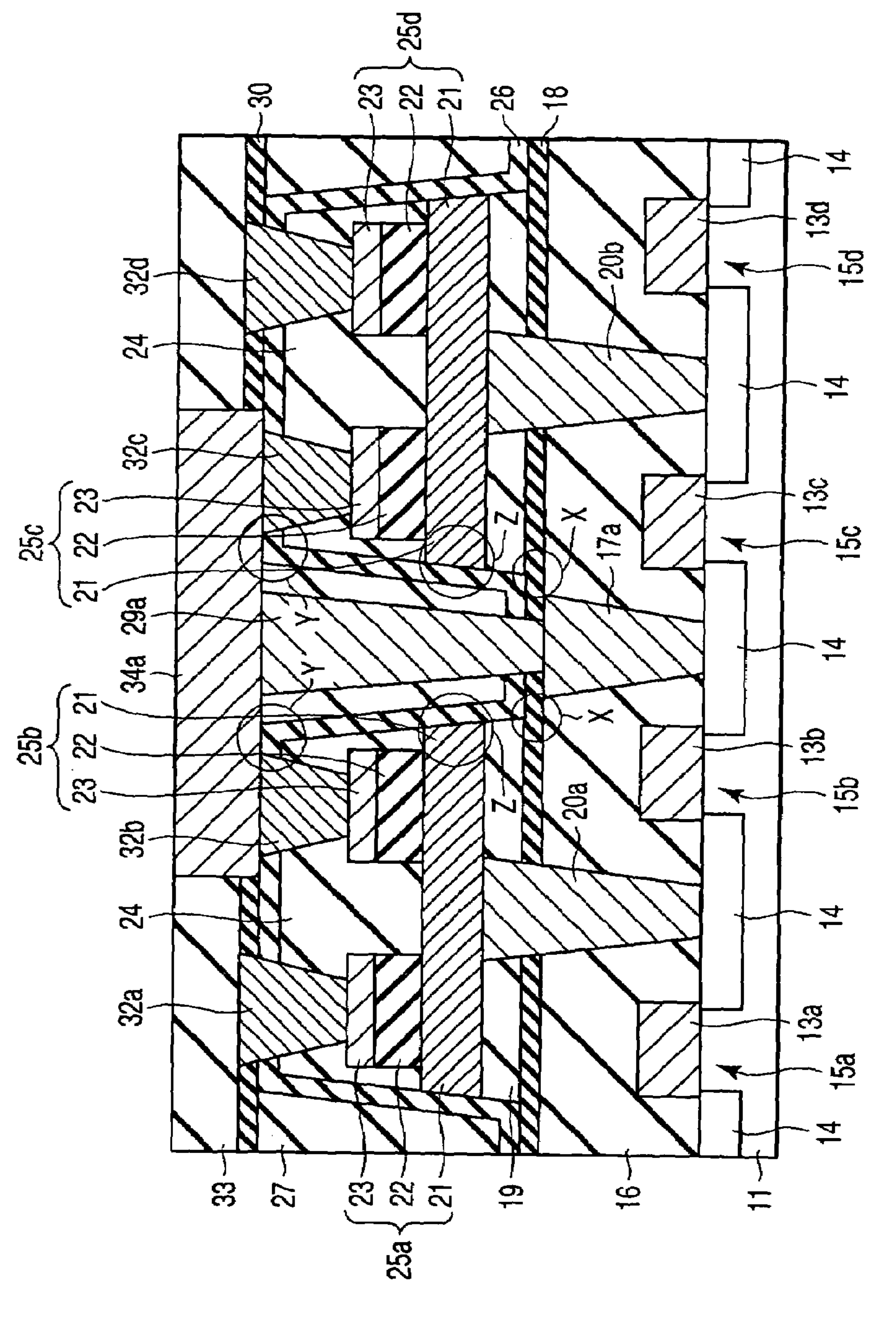
Figure 91:
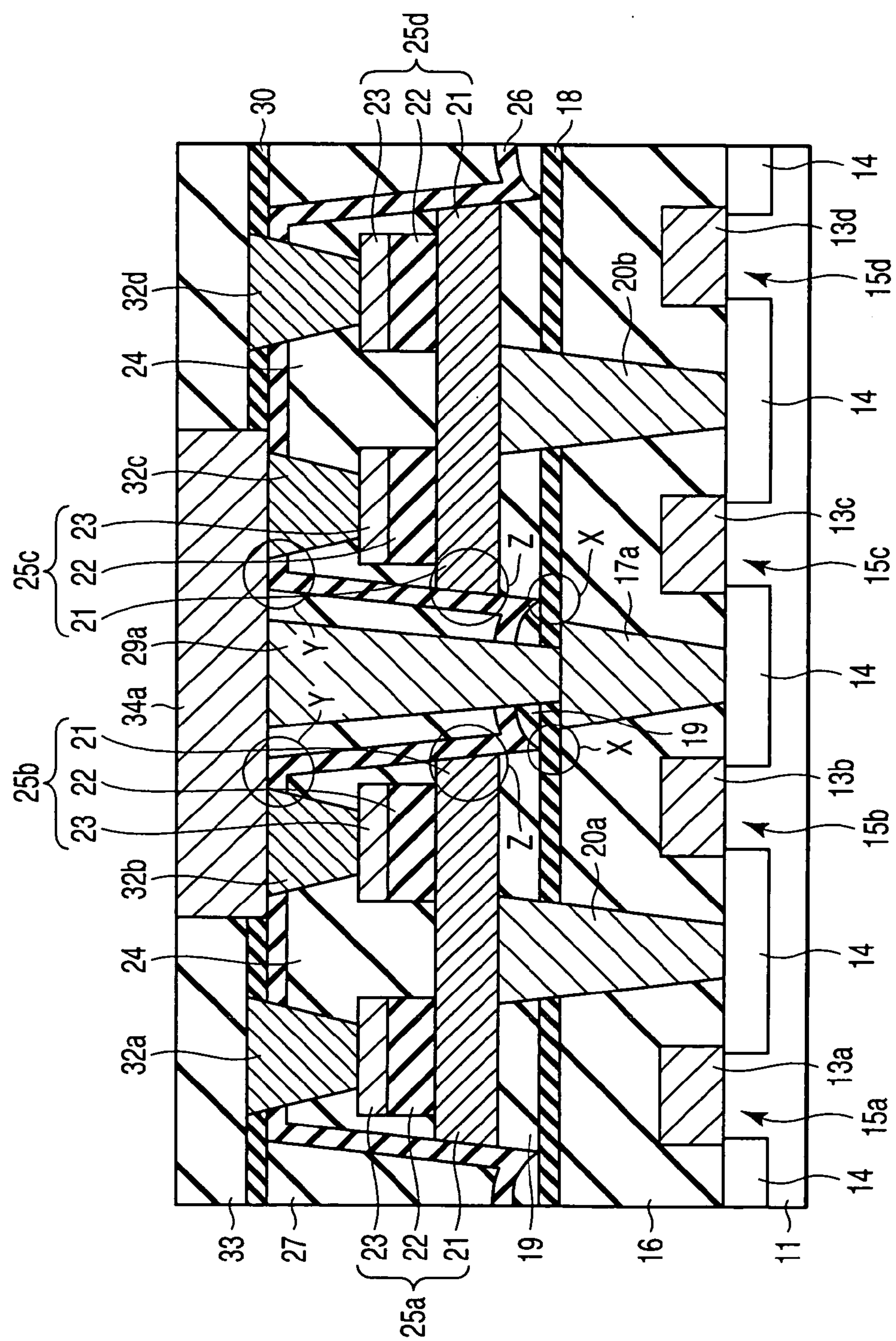
Figure 92:
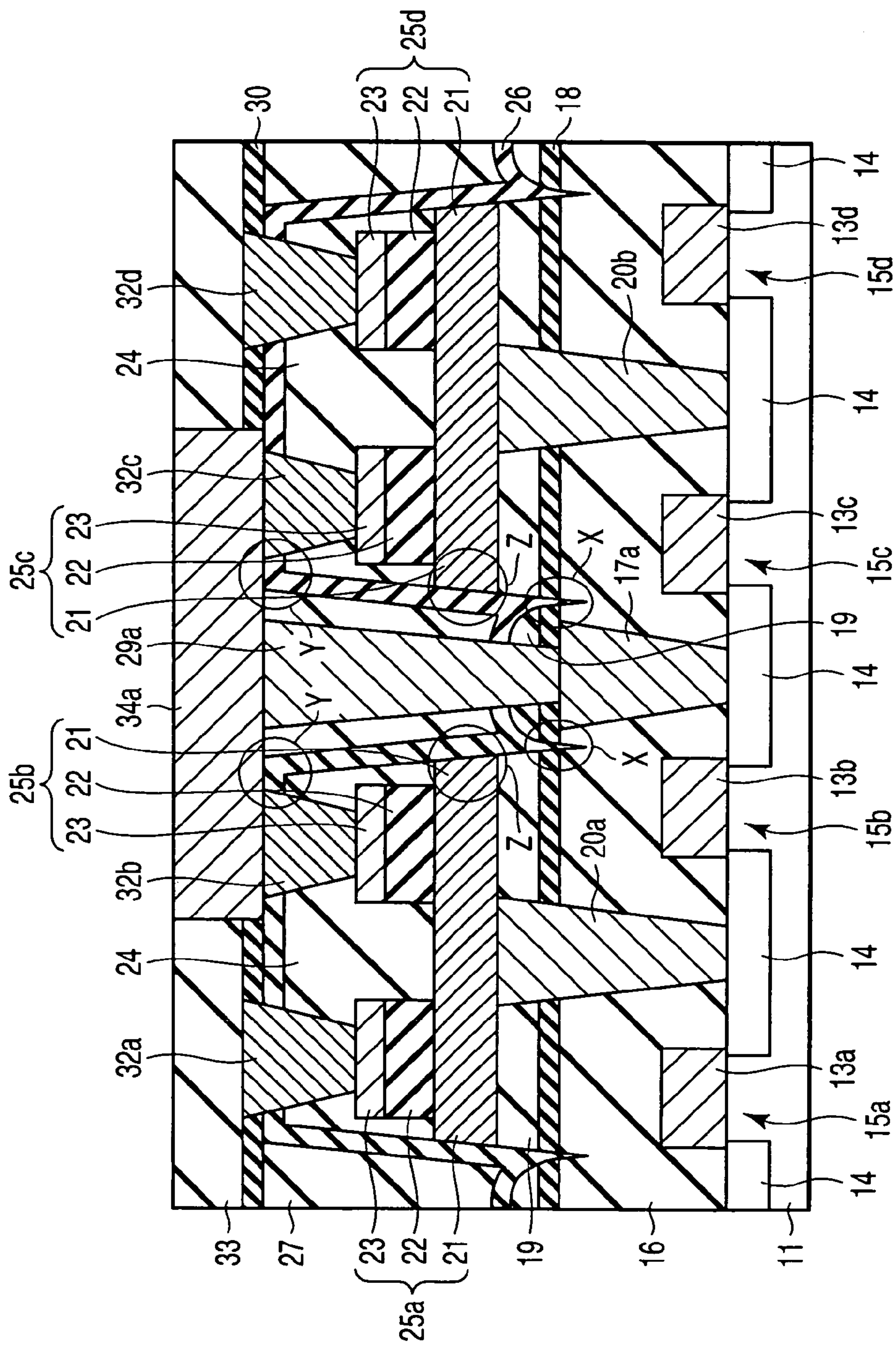

As shown in FIG. 90, even in a COP structure, the hydrogen and oxygen barrier film 26 may be in contact with the oxygen barrier film 18 near the portions X (near the upper surface of the contact 17*a*). As shown in FIG. 91, the hydrogen and oxygen barrier film 26 and oxygen barrier film 18 may be in partial contact at the portions X. As shown in FIG. 92, the hydrogen and oxygen barrier film 26 may penetrate the oxygen barrier film 18 at the portions X. To obtain the structure shown in FIG. 91 or 92, in processing the lower electrodes 21, the etching is stopped when the oxygen barrier film 18 or interlayer dielectric film 16 is exposed at the portions X. Then, the interlayer dielectric film 19 remains between the hydrogen and oxygen barrier film 26 and the oxygen barrier film 18.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferro-electric memory device comprising:

a semiconductor substrate;

a gate electrode which is formed on the semiconductor substrate;

a first diffusion layer and a second diffusion layer, which are formed in the semiconductor substrate on both sides of the gate electrode;

a first insulating film which is formed on the semiconductor substrate and the gate electrode;

a first contact which extends through the first insulating film and is electrically connected to the first diffusion layer;

a first oxygen barrier film having insulating properties, which is formed on the first contact and the first insulating film;

a second insulating film which is formed on the first oxygen barrier film;

a second contact which extends through the second insulating film and the first oxygen barrier film and is electrically connected to the first contact;

a second oxygen barrier film having insulating properties, which is formed on the second contact and the second insulating film;

a ferro-electric capacitor which is formed in the second insulating film and has a lower electrode, a ferro-electric film, and an upper electrode;

a third contact which is electrically connected to the upper electrode;

a first interconnection which is electrically connected to the second contact and the third contact; and a third oxygen barrier film having insulating properties, which is arranged between the ferro-electric capacitor and the second contact and brought into contact with the first oxygen barrier film.

2. The device according to claim 1, wherein the third oxygen barrier film is in direct contact with the first contact.

3. The device according to claim 1, wherein the first contact and the second contact are formed at once as one contact.

4. A ferro-electric memory device comprising:

a semiconductor substrate;

a gate electrode which is formed on the semiconductor substrate;

a first diffusion layer and a second diffusion layer, which are formed in the semiconductor substrate on both sides of the gate electrode;

a first insulating film which is formed on the semiconductor substrate and the gate electrode;

a first contact which extends through the first insulating film and is electrically connected to the first diffusion layer;

a second contact which extends through the first insulating film and is electrically connected to the second diffusion layer;

a second insulating film which is formed on the first insulating film, the first contact, and the second contact;

a third contact which extends through the second insulating film and is electrically connected to the first contact;

a first oxygen barrier film having insulating properties, which is formed on the third contact and the second insulating film;

a ferro-electric capacitor which is formed on the second contact and has a lower electrode containing an oxygen barrier material, a ferro-electric film, and an upper electrode;

a fourth contact which is electrically connected to the upper electrode;

a first interconnection which is electrically connected to the third contact and the fourth contact; and a second oxygen barrier film having insulating properties, which is arranged between the ferro-electric capacitor and the third contact and brought into contact with the lower electrode.

5. The device according to claim 4, further comprising a third oxygen barrier film having insulating properties, which is formed under the ferro-electric capacitor.

6. The device according to claim 4, wherein the first contact and the third contact are formed at once as one contact.

7. The device according to claim 4, further comprising a stopper film which is formed around the fourth contact on the upper electrode.

8. The device according to claim 7, further comprising a third oxygen barrier film having insulating properties, which is formed under the ferro-electric capacitor.

9. The device according to claim 7, wherein the first contact and the third contact are formed at once as one contact.

10. The device according to claim 7, wherein the stopper film is formed of an oxygen barrier material.

* * * * *